US006900596B2

(12) United States Patent
Yang et al.

(10) Patent No.: US 6,900,596 B2
(45) Date of Patent: May 31, 2005

(54) CAPACITIVELY COUPLED PLASMA REACTOR WITH UNIFORM RADIAL DISTRIBUTION OF PLASMA

(75) Inventors: Jang Gyoo Yang, Sunnyvale, CA (US); Daniel J. Hoffman, Saratoga, CA (US); James D. Carducci, Sunnyvale, CA (US); Douglas A. Buchberger, Jr., Livermore, CA (US); Robert B. Hagen, deceased, late of Newark, CA (US); by Melissa Hagen, legal representative, Newark, CA (US); Matthew L. Miller, Newark, CA (US); Kang-Lie Chiang, San Jose, CA (US); Gerardo A. Delgadino, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 227 days.

(21) Appl. No.: 10/235,988

(22) Filed: Sep. 4, 2002

(65) Prior Publication Data

US 2004/0056602 A1 Mar. 25, 2004

Related U.S. Application Data

(63) Continuation-in-part of application No. 10/192,271, filed on Jul. 9, 2002, now Pat. No. 6,853,141.

(51) Int. Cl.⁷ .................................................. H01J 7/24
(52) U.S. Cl. ............................ 315/111.21; 315/111.51; 315/111.41; 315/111.81; 118/723 I
(58) Field of Search ...................... 315/11.21, 111.41, 315/111.51, 111.81; 343/895, 867; 118/723 I, 723 E, 723 R, 723 M; 156/345

(56) References Cited

U.S. PATENT DOCUMENTS 4,464,223 A    8/1984   Gorin .......................... 156/643

(Continued)

FOREIGN PATENT DOCUMENTS

EP        0 343 500 A1    11/1989

(Continued)

OTHER PUBLICATIONS

U.S. Appl. No. 09/527,342, filed Mar. 17, 2000 entitled, "Plasma Reactor with Overhead RF Electrode Tuned to the Plasma," by Daniel Hoffman, et al.

(Continued)

*Primary Examiner*—Don K. Wong
*Assistant Examiner*—Jimmy Vu
(74) *Attorney, Agent, or Firm*—Robert M. Wallace; Joseph Bach

(57) ABSTRACT

A plasma reactor for processing a semiconductor wafer includes a side wall and an overhead ceiling defining a chamber, a workpiece support cathode within the chamber having a working surface facing the ceiling for supporting a semiconductor workpiece, process gas inlets for introducing a process gas into the chamber and an RF bias power generator having a bias power frequency. There is a bias power feed point at the working surface and an RF conductor is connected between the RF bias power generator and the bias power feed point at the working surface. A dielectric sleeve surrounds a portion of the RF conductor, the sleeve having an axial length along the RF conductor, a dielectric constant and an axial location along the RF conductor, the length, dielectric constant and location of the sleeve being such that the sleeve provides a reactance that enhances plasma ion density uniformity over the working surface. In accordance with a further aspect, the reactor can include an annular RF coupling ring having an inner diameter corresponding generally to a periphery of the workpiece, the RF coupling ring extending a sufficient portion of a distance between the working surface and the overhead electrode to enhance plasma ion density near a periphery of the workpiece.

53 Claims, 46 Drawing Sheets

U.S. PATENT DOCUMENTS

| | | | |
|---|---|---|---|
| 4,579,618 A | 4/1986 | Celestino et al. | 156/345 |
| 4,859,908 A | 8/1989 | Yoshida et al. | 315/111.81 |
| 4,973,883 A | 11/1990 | Hirose et al. | 315/111.41 |
| 4,990,229 A | 2/1991 | Campbell et al. | 204/298.06 |
| 5,006,760 A | 4/1991 | Drake, Jr. | 315/111.21 |
| 5,017,835 A | 5/1991 | Oechsner | 315/111.81 |
| 5,032,202 A | 7/1991 | Tsai et al. | 156/345 |
| 5,055,853 A | 10/1991 | Garnier | 343/769 |
| 5,077,499 A | 12/1991 | Oku | 315/111.21 |
| 5,089,083 A | 2/1992 | Kojima et al. | 156/643 |
| 5,107,170 A | 4/1992 | Ishikawa et al. | 313/362.1 |
| 5,115,167 A | 5/1992 | Ootera et al. | 315/111.21 |
| 5,122,251 A | 6/1992 | Campbell et al. | 204/298.06 |
| 5,140,223 A | 8/1992 | Gesche et al. | 315/111.21 |
| 5,195,045 A | 3/1993 | Keane et al. | 364/482 |
| 5,198,725 A | 3/1993 | Chen et al. | 315/111.41 |
| 5,210,466 A | 5/1993 | Collins et al. | 315/111.21 |
| 5,213,658 A | 5/1993 | Ishida | 156/643 |
| 5,223,457 A | 6/1993 | Mintz et al. | 437/225 |
| 5,225,024 A | 7/1993 | Hanley et al. | 156/345 |
| 5,246,532 A | 9/1993 | Ishida | 156/345 |
| 5,272,417 A | 12/1993 | Ohmi | 315/111.21 |
| 5,274,306 A | 12/1993 | Kaufman et al. | 315/111.41 |
| 5,279,669 A | 1/1994 | Lee | 118/723 |
| 5,280,219 A | 1/1994 | Ghanbari | 315/111.41 |
| 5,300,460 A | 4/1994 | Collins et al. | 437/225 |
| 5,312,778 A | 5/1994 | Collins et al. | 437/225 |
| 5,401,351 A | 3/1995 | Samukawa | 156/345 |
| 5,453,305 A | 9/1995 | Lee | 427/562 |
| 5,463,525 A | 10/1995 | Barnes et al. | 361/234 |
| 5,512,130 A | 4/1996 | Barna et al. | 156/651.1 |
| 5,534,070 A | 7/1996 | Okamura et al. | 118/723 |
| 5,537,004 A | 7/1996 | Imahashi et al. | 315/111.21 |
| 5,554,223 A | 9/1996 | Imahashi | 118/723 |
| 5,567,268 A | 10/1996 | Kadomura | 156/345 |
| 5,587,038 A | 12/1996 | Cecchi et al. | 156/345 |
| 5,592,055 A | 1/1997 | Capacci et al. | 315/111.21 |
| 5,595,627 A | 1/1997 | Inazawa et al. | 156/643.1 |
| 5,605,637 A | 2/1997 | Shan et al. | 216/71 |
| 5,618,382 A | 4/1997 | Mintz et al. | 216/64 |
| 5,627,435 A | 5/1997 | Jansen et al. | 315/111.21 |
| 5,660,671 A | 8/1997 | Harada et al. | 156/345 |
| 5,662,770 A | 9/1997 | Donohoe | 438/716 |
| 5,674,321 A | 10/1997 | Pu et al. | 118/723 |
| 5,685,914 A | 11/1997 | Hills et al. | 118/723 |
| 5,705,019 A | 1/1998 | Yamada et al. | 156/345 |
| 5,707,486 A | 1/1998 | Collins | 156/643.1 |
| 5,710,486 A | 1/1998 | Ye et al. | 315/111.21 |
| 5,720,826 A | 2/1998 | Hayashi et al. | 136/249 |
| 5,733,511 A | 3/1998 | De Francesco | 422/186.05 |
| 5,792,376 A | 8/1998 | Kanai et al. | 216/71 |
| 5,846,885 A | 12/1998 | Kamata et al. | 438/729 |
| 5,849,136 A | 12/1998 | Mintz et al. | 156/345 |
| 5,849,372 A | 12/1998 | Annaratone et al. | 427/569 |
| 5,855,685 A | 1/1999 | Tobe et al. | 118/723 |
| 5,858,819 A | 1/1999 | Miyasaka | 438/149 |
| 5,863,376 A | 1/1999 | Wicker et al. | 156/345 |
| 5,904,799 A | 5/1999 | Donohoe | 156/345 |
| 5,914,568 A | 6/1999 | Nonaka | 315/111.21 |
| 5,936,481 A | 8/1999 | Fujii | 333/17.3 |
| 5,997,962 A | 12/1999 | Ogasawara et al. | 427/535 |
| 6,016,131 A | 1/2000 | Sato et al. | 343/895 |
| 6,043,608 A | 3/2000 | Samukawa et al. | 315/111.51 |
| 6,089,182 A * | 7/2000 | Hama | 118/723 I |
| 6,093,457 A | 7/2000 | Okumura et al. | 427/569 |
| 6,096,160 A | 8/2000 | Kadomura | 156/345 |
| 6,110,395 A | 8/2000 | Gibson, Jr. | 216/67 |
| 6,113,731 A | 9/2000 | Shan et al. | 156/345 |
| 6,142,096 A | 11/2000 | Sakai et al. | 118/723 |
| 6,152,071 A | 11/2000 | Akiyama et al. | 118/723 |
| 6,155,200 A | 12/2000 | Horiike et al. | 118/723 |
| 6,162,709 A | 12/2000 | Raoux et al. | 438/513 |
| 6,188,564 B1 | 2/2001 | Hao | 361/234 |
| 6,213,050 B1 | 4/2001 | Liu et al. | 118/723 |
| 6,218,312 B1 | 4/2001 | Collins et al. | 438/723 |
| 6,245,190 B1 | 6/2001 | Masuda et al. | 156/345 |
| 6,251,216 B1 | 6/2001 | Okamura et al. | 156/345 |
| 6,262,538 B1 | 7/2001 | Keller | 315/111.21 |
| 6,290,806 B1 | 9/2001 | Donohoe | 156/345 |
| 6,337,292 B1 | 1/2002 | Kim et al. | 438/787 |
| 6,346,915 B1 | 2/2002 | Okumura et al. | 343/701 |
| RE37,580 E | 3/2002 | Barnes et al. | 361/234 |
| 6,451,703 B1 | 9/2002 | Liu et al. | 438/710 |
| 6,462,481 B1 | 10/2002 | Holland et al. | 315/111.21 |
| 6,528,751 B1 | 3/2003 | Hoffman et al. | 219/121.43 |
| 2003/0168427 A1 * | 9/2003 | Flamm et al. | 216/2 |

FOREIGN PATENT DOCUMENTS

| | | |
|---|---|---|
| EP | 0 678 903 A1 | 10/1995 |
| EP | 0 719 447 B1 | 7/1998 |
| WO | WO 01/71765 | 9/2001 |

OTHER PUBLICATIONS

U.S. Appl. No. 10/007,367, filed Oct. 22, 2001 entitled, "Merie Plasma Reactor with Overhead RF Electrode Tuned to the Plasma with Arcing Suppression," by Daniel Hoffman, et al.

U.S. Appl. No. 10/028,922, filed Dec. 19, 2001 entitled, "Plasma Reactor with Overhead RF Electrode Tuned to the Plasma with Arcing Suppression," by Daniel Hoffman, et al.

U.S. Appl. No. 10/694,776, filed Oct. 29, 2003 Hiraoka, et al.

U.S. Appl. No. 10/654,920, filed Sep. 5, 2003, Endo et al.

* cited by examiner

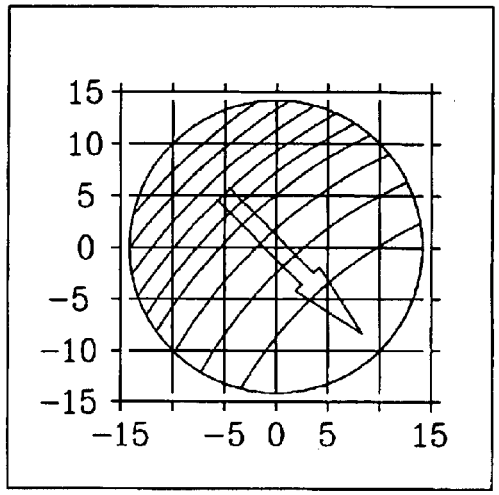 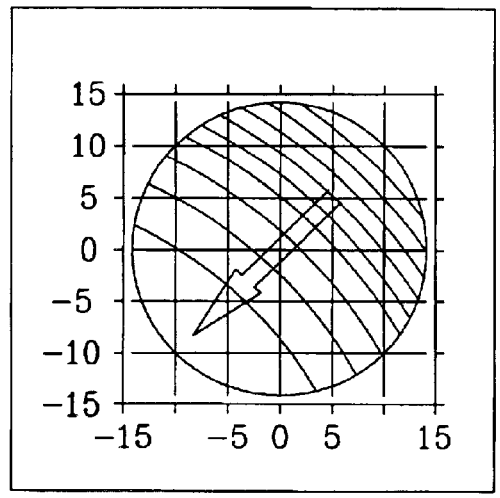
FIG. 47A  FIG. 47B
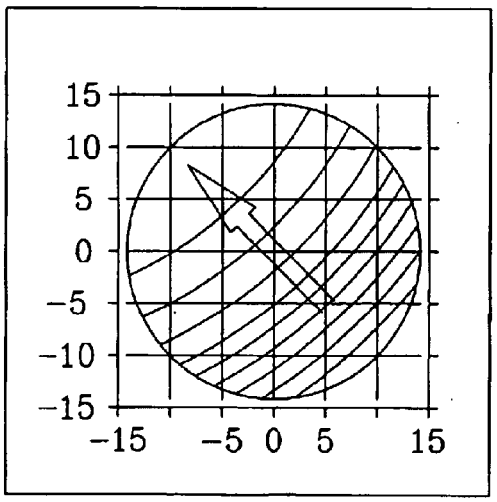 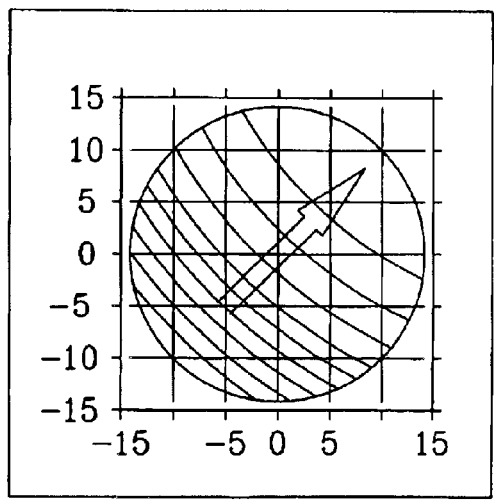
FIG. 47C  FIG. 47D

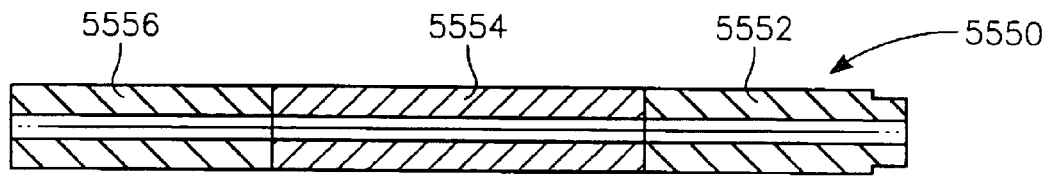
FIG. 56
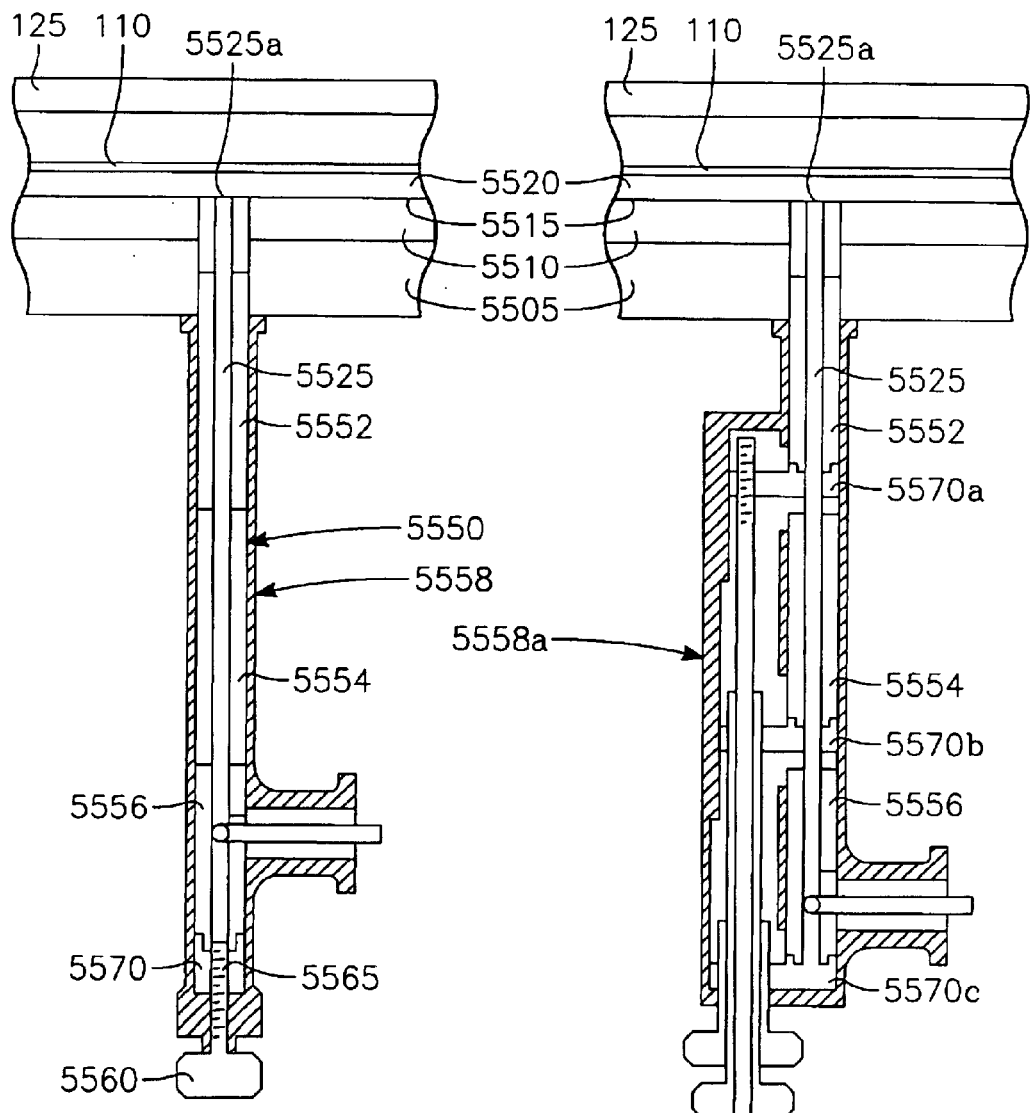
FIG. 57A
FIG. 57B

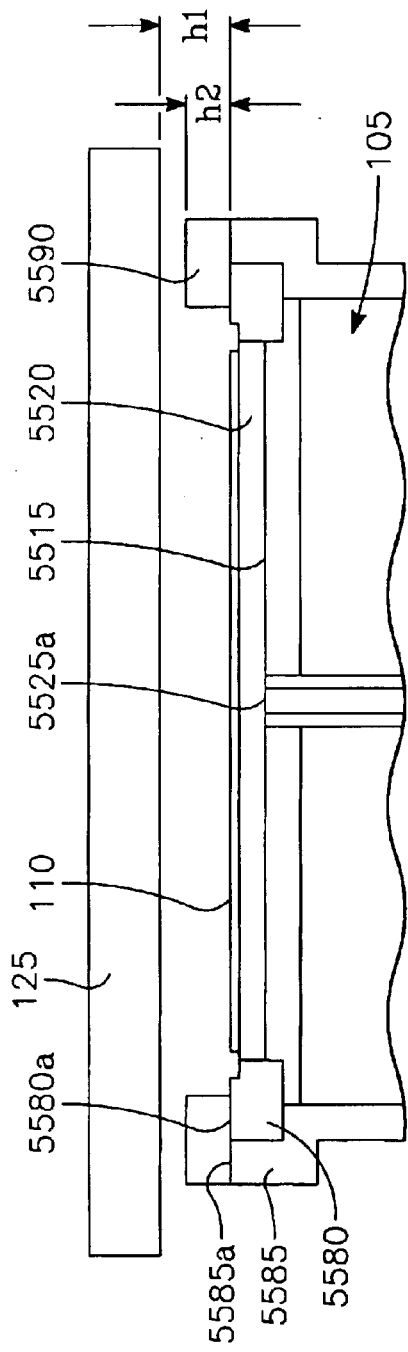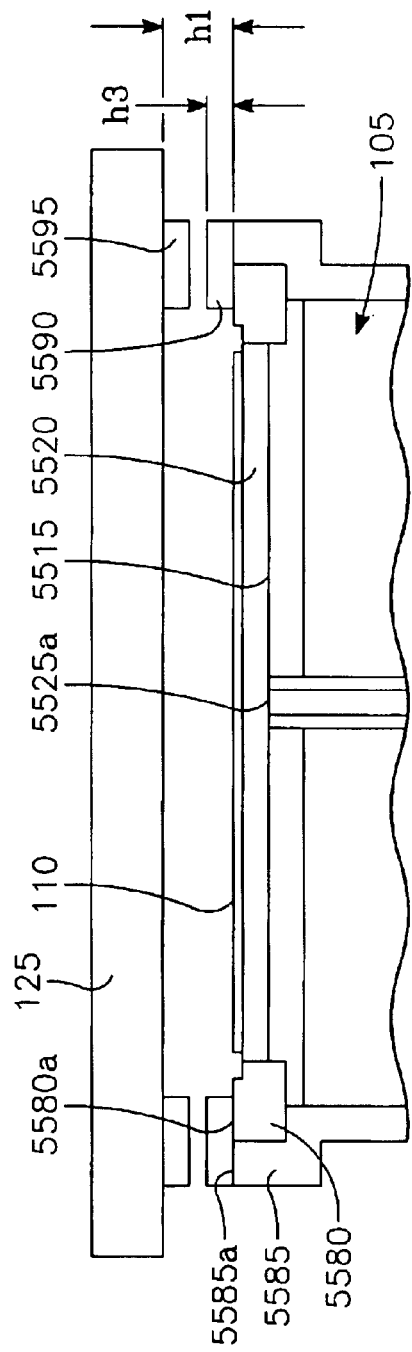

CAPACITIVELY COUPLED PLASMA REACTOR WITH UNIFORM RADIAL DISTRIBUTION OF PLASMA

CROSS-REFERENCE TO RELATED APPLICATIONS

This application is a continuation in part of U.S. patent application Ser. No. 10/192,271 filed Jul. 9, 2002, now U.S. Pat. No. 6,853,141, entitled CAPACITIVELY COUPLED PLASMA REACTOR WITH MAGNETIC CONTROL By Daniel Hoffman et al.

This application also contains subject matter related to the following applications: U.S. patent application Ser. No. 09/527,342 filed Mar. 17, 2000 entitled PLASMA RECTOR WITH OVERHEAD RF ELECTRODE TUNED TO THE PLASMA By Daniel Hoffman et al.; U.S. patent application Ser. No. 10/007,367 filed Oct. 22, 2001 entitled MERIE PLASMA REACTOR WITH OVERHEAD RF ELECTRODE TUNED TO THE PLASMA WITH ARCING SUPPRESSION By Daniel Hoffman et al., which is a continuation-in-part of U.S. patent application Ser. No. 09/527,342 filed Mar. 17, 2000; and U.S. patent application Ser. No. 10/028,922 filed Dec. 19, 2001 entitled PLASMA REACTOR WITH OVERHEAD RF ELECTRODE TUNED TO THE PLASMA WITH ARCING SUPPRESSION By Daniel Hoffman et al., which is a continuation-in-part of U.S. patent application Ser. No. 09/527,342 filed Mar. 17, 2000.

BACKGROUND

The above-cited applications describe a plasma reactor in which VHF plasma source power is applied by an overhead electrode while HF plasma bias power is coupled through a cathode in a pedestal supporting the semiconductor workpiece. The VHF overhead electrode tends to promote a center-high plasma ion density distribution. The electrical field produced by the bias power tends to be nonuniform, which also leads to a non-uniform plasma ion density distribution at the wafer or workpiece surface.

Uniform plasma ion density distribution is highly desirable, because it promotes uniform control of feature size, etch profile and etch rate across the entire workpiece surface, resulting in a wider process window. Therefore, features capable of correcting nonuniform plasma ion density radial distribution would be advantageous. In seeking such features, we have discovered that there are particular causes of non-uniform plasma ion density radial distribution that we propose to address in constructing such features. In particular, one cause arises from the presence of a center conductor extending vertically upward through the workpiece support. This center conductor conducts the HF plasma bias power to the workpiece. First, the center conductor affects the uniformity of power deposition by the overhead VHF electrode: it creates a non-uniform radial distribution of impedance in the ground return path of the VHF power through the wafer support pedestal. Secondly, the center conductor affects the radial distribution of the electrical field produced by the HF plasma bias power applied to the workpiece support. We propose to construct a feature that simultaneously addresses both the VHF ground path non-uniformities and the HF bias electrical field non-uniformities, or, in the absence of VHF source power, addresses the non-uniformities in the HF bias electrical field alone.

SUMMARY OF THE DISCLOSURE

A plasma reactor for processing a semiconductor wafer includes a side wall and an overhead ceiling defining a chamber, a workpiece support cathode within the chamber having a working surface facing the ceiling for supporting a semiconductor workpiece and a conductive mesh beneath the working surface for electrostatically chucking the wafer, process gas inlets for introducing a process gas into the chamber and an RF bias power generator having a bias power frequency. There is a bias power feed point at the conductive mesh and an RF conductor is connected between the RF bias power generator and the bias power feed point at the conductive mesh. A dielectric sleeve surrounds a portion of the RF conductor, the sleeve having an axial length along the RF conductor, a dielectric constant and an axial location along the RF conductor, the length, dielectric constant and location of the sleeve being such that the sleeve provides a reactance that enhances plasma ion density uniformity over the working surface.

In accordance with one aspect, the reactance provided by the dielectric sleeve brings the impedance of the feed point at the bias power frequency to a value closer to an impedance of a portion of the workpiece support pedestal surrounding the RF conductor and sleeve. In accordance with another aspect, the ceiling is an overhead electrode and the reactor further includes a source power generator having a source frequency, an impedance match element connected between the source power generator and the overhead electrode, the feed point having an impedance at the source power frequency, and the reactance of the sleeve reduces this feed point impedance nearly to zero. Both of these aspects may be realized in combination.

In accordance with a further aspect, the reactor can include an annular RF coupling ring having an inner diameter corresponding generally to a periphery of the workpiece, the RF coupling ring extending a sufficient portion of a distance between the working surface and the overhead electrode to enhance plasma ion density near a periphery of the workpiece. The RF coupling ring may be attached to the working surface and have a top surface extending above the working surface by a thickness of the coupling ring. Or, the RF coupling ring may be attached to the ceiling and have a bottom surface extending below the ceiling by a thickness of the coupling ring. Or the ring on the working surface may be combined with the ring on the ceiling. The RF coupling ring (or rings) may be combined with the dielectric sleeve.

BRIEF DESCRIPTION OF THE DRAWINGS

FIGS. 47A–47D illustrate a mode of operation of the CMF coils of FIG. 46 to produce a desired magnetic field configuration.

FIG. 56 is a cut-away side view of the dielectric sleeve.

FIG. 57A is a side view illustrating a version of the dielectric sleeve that is mechanically adjustable.

FIG. 57B is a side view illustrating a version having multiple sleeve sections that are each mechanically adjustable.

FIG. 60 is a side view of a plasma reactor having a bottom RF coupling ring.

FIG. 61 is a side view of a plasma reactor having top and bottom RF coupling rings.

DETAILED DESCRIPTION

Figure 1A:
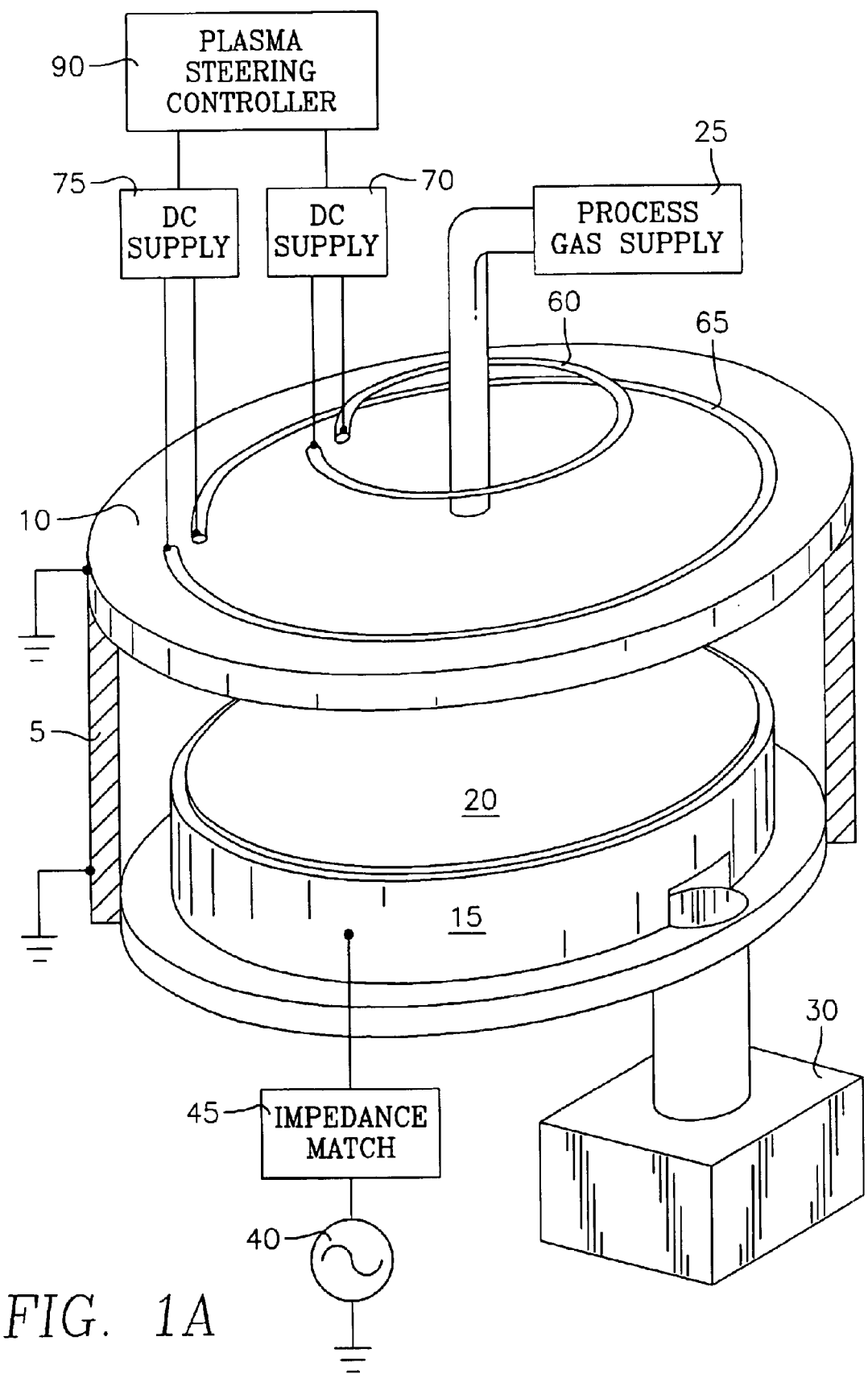
FIGS. 1A, 1B and 1C illustrate a plasma reactor with an overhead VHF electrode and overhead coils for controlling plasma ion uniformity.

The plasma ion density distribution exhibited by a particular plasma reactor is a function of chamber pressure, gas mixture and diffusion, and source power radiation pattern. In the present invention, this distribution is magnetically altered to approximate a selected or ideal distribution that has been predetermined to improve process uniformity. The magnetically altered or corrected plasma ion density distribution is such that process uniformity across the surface of the wafer or workpiece is improved. For this purpose, the magnetically corrected plasma distribution may be non-uniform or it may be uniform, depending upon the needs determined by the user. We have discovered that the efficiency with which an average magnetic field strength exerts pressure on a plasma to change its distribution to a desired one can be improved. This surprising result can be achieved in accordance with this discovery by increasing the radial component of the gradient of the magnetic field. The radial direction is understood to be about the axis of symmetry of the cylindrical chamber. Thus, what is needed is a magnetic field configuration which has a large radial gradient and a small field strength in other directions. Such a magnetic field is cusp-shaped with its axis of symmetry coinciding with the axis of the cylindrical reactor chamber. One way of producing a cusp-shaped magnetic field is to provide coils above and below the cylindrical chamber and run D.C. currents through these coils in opposite directions.

Depending upon the chamber design, it may be impractical to provide a coil below the wafer pedestal, and therefore in a first case, a top coil suffices for these purposes. In addition, what is needed is for the cusp-shaped magnetic field to be configurable or adjustable for accurate control or alteration of a plasma ion distribution inherent in a given plasma reactor chamber (the "ambient" plasma ion distribution). Since the plasma ion distribution provided in different capacitively coupled reactors can vary widely, such adjustability may be essential in some cases. The radial component of the magnetic field gradient is chosen to apply the magnetic pressure required to alter the ambient distribution to the desired distribution. For example, if the desired distribution is a uniform distribution, then the applied magnetic field is selected to counteract the non-uniformity in the radial distribution of plasma ion density exhibited by the reactor in the absence of the magnetic field. In this case, for example, if the reactor tends to have a center-high distribution of plasma ion density, then the magnetic field gradient is chosen to sustain the plasma density over the center of the wafer support pedestal and enhance it near the periphery to achieve uniformity.

Such adjustability of the cusp-shaped magnetic field is achieved in accordance with our discovery by providing at least a second overhead coil of a different (e.g., smaller) diameter than the first coil. The D.C. currents in the respective coils are independently adjustable so as to permit configuration of the cusp-shaped magnetic field in a highly flexible manner to alter virtually any ambient plasma ion distribution to approximate some desired plasma ion distribution. This choice of field configuration can be designed to modify center-high or center-low plasma ion density distributions.

One advantage that can be realized is two-fold, in that the cusp-shaped magnetic field has a large radial gradient relative to the magnetic field strength (as noted above) and therefore is highly efficient in exerting corrective pressure on the plasma; but, since the magnetic field is constant over time, there is far less tendency to produce arcing, and therefore a somewhat stronger magnetic field may be employed for even greater corrective capacity when required. As will be described later in this specification, this feature can be quite helpful at higher chamber pressures.

FIG. 1A illustrates a capacitively coupled plasma reactor capable of providing an adjustable cusp-shaped magnetic field. The reactor of FIG. 1A includes a cylindrical side wall 5, a ceiling 10 that is a gas distribution plate, and a wafer support pedestal 15 that holds a semiconductor workpiece 20. The ceiling 10 or gas distribution plate may be conductive so as to enable it to serve as an anode or it may have an anode attached to it. The ceiling 10 or gas distribution plate is typically made of aluminum and has an internal gas manifold and gas injection orifices in its interior surface that face into the chamber. A process gas supply 25 furnishes process gas to the gas distribution plate 10. A vacuum pump 30 controls the pressure inside the reactor chamber. Plasma source power for igniting and maintaining a plasma inside the reactor chamber is produced by an RF generator 40 connected through an impedance match circuit 45 to the wafer support pedestal 15 so that the wafer support pedestal serves as an RF electrode. The anode (which may be the ceiling 10 formed of a conductor material) is connected to RF ground so that is serves as the counter electrode. Such a reactor tends to have a very non-uniform plasma ion density distribution, which is typically center-high.

Figure 1B:
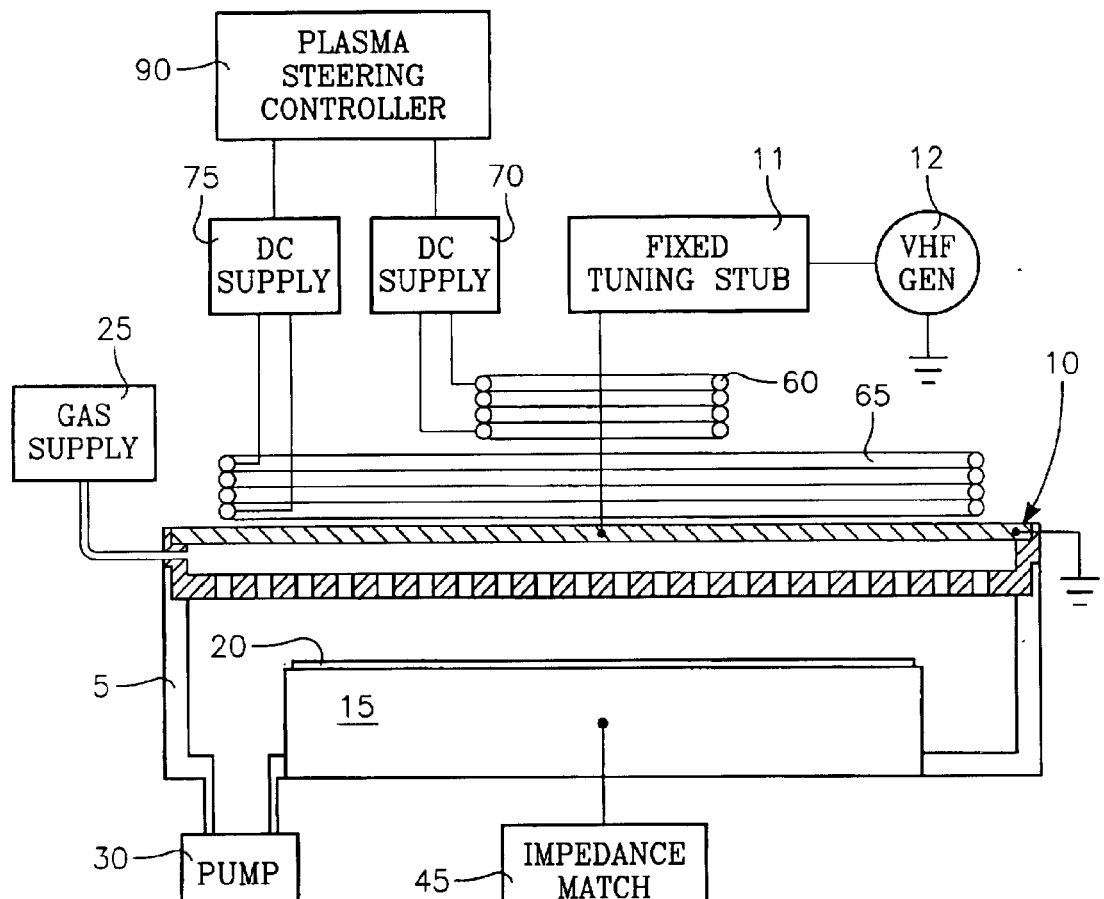

FIG. 1B illustrates a feature in which the ceiling 10, rather than being connected directly to ground as in FIG. 1A, is connected through an RF impedance match element 11 (shown only schematically) to a VHF signal generator 12 that furnishes the plasma source power. In this case, the RF generator 40 merely controls the RF bias on the semiconductor wafer or workpiece 20. (The RF impedance match element 11 may be a fixed tuning element such as for example a coaxial tuning stub or a strip line circuit.) Such a feature is discussed in greater detail in a later portion of this specification.

Figure 1C:
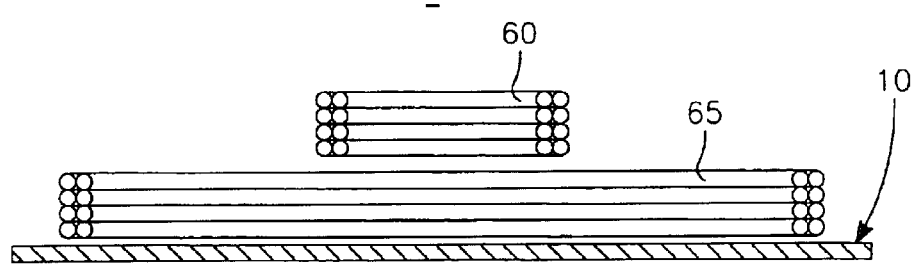

In order to control distribution of plasma ion density, a set of inductive coils are provided above the ceiling 10. In the case of FIG. 1A, the set of coils includes an inner coil 60 and an outer coil 65 which are coaxial with the cylindrical chamber and each constitutes single winding of a conductor. While the windings 60, 65 are illustrated in FIG. 1A as being single turns, they may each consist of plural turns arranged vertically, for example as shown in FIG. 1B. Or, as shown in FIG. 1C, the windings 60, 65 may extend both vertically and horizontally. In the case of FIG. 1A, the inner coil 60 is located farther above the ceiling 10 than the outer coil 65. However, in other cases this arrangement may be reversed, or the two coils 60, 65 may be at the same height above the ceiling 10.

Figure 2:
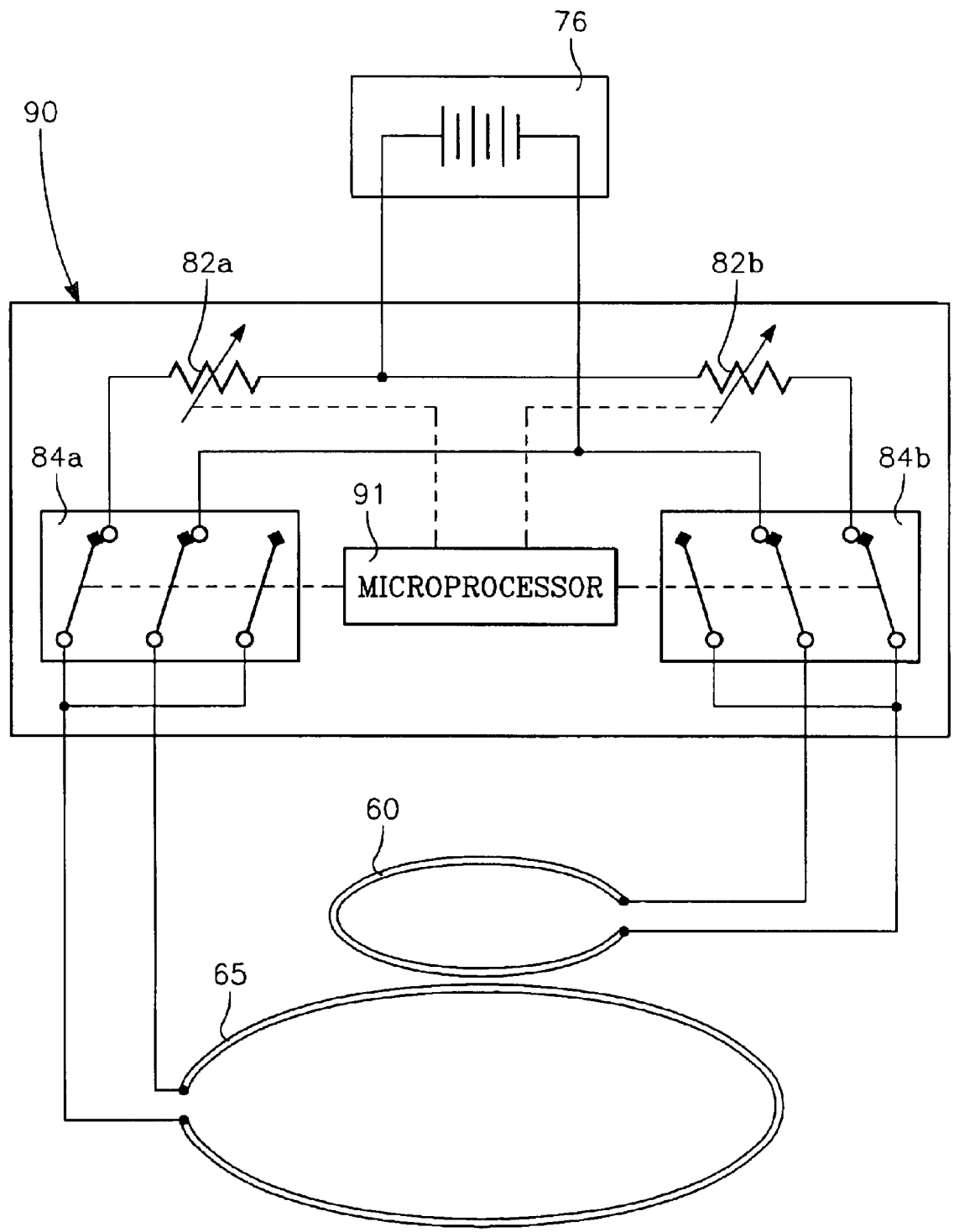
FIG. 2 illustrates an exemplary apparatus for controlling the overhead coils of FIG. 1.

In the case of FIGS. 1A and 1B, a controller 90 determines the magnitude and polarity of currents flowing to the respective overhead coils 60, 65 by controlling respective independent D.C. current supplies 70, 75 that are connected to respective ones of the coils 60, 65. Referring now to FIG. 2, a case is illustrated in which the controller 90 governs the D.C. currents to the coils 60, 65 from a D.C. current supply 76 that furnished current through the controller 90, the controller 90 being connected to respective ones of the coils 60, 65. In either case, the controller 90 is capable of causing D.C. currents of different polarities and magnitudes to flow in different ones of the coils 60, 65. In the case of FIG. 2, the controller 90 includes a pair of potentiometers 82a, 82b that adjust the D.C. current applied to the respective coils 60, 65 and a pair of ganged switches 84a, 84b that independently determine the polarity of the D.C. current applied to each of the coils 60, 65. A programmable device such as a microprocessor 91 can be included in the controller 90 in order to intelligently govern the potentiometers 82a, 82b and the ganged switches 84a, 84b.

The arrangement of the two coils 60, 65 illustrated in FIGS. 1A, 1B and 1C, in which the inner coil 60 is placed at a greater height above the ceiling 10 than the outer coil 65, provides certain advantages. Specifically, the radial component of the magnetic field gradient provided by either coil is, at least roughly, proportional to the radius of the coil and inversely proportional to the axial displacement from the coil. Thus, the inner and outer coils 60, 65 will perform different roles because of their different sizes and displacements: The outer coil 65 will dominate across the entire surface of the wafer 20 because of its greater radius and closer proximity to the wafer 20, while the inner coil 60 will have its greatest effect near the wafer center and can be regarded as a trim coil for finer adjustments or sculpting of the magnetic field. Other arrangements may be possible for realizing such differential control by different coils which are of different radii and placed at different displacements from the plasma. As will be described later in this specification with reference to certain working examples, different changes to the ambient plasma ion density distribution are obtained by selecting not only different magnitudes of the currents flowing in the respective overhead coils (60, 65) but also by selecting different polarities or directions of current flow for the different overhead coils.

Figure 3A:
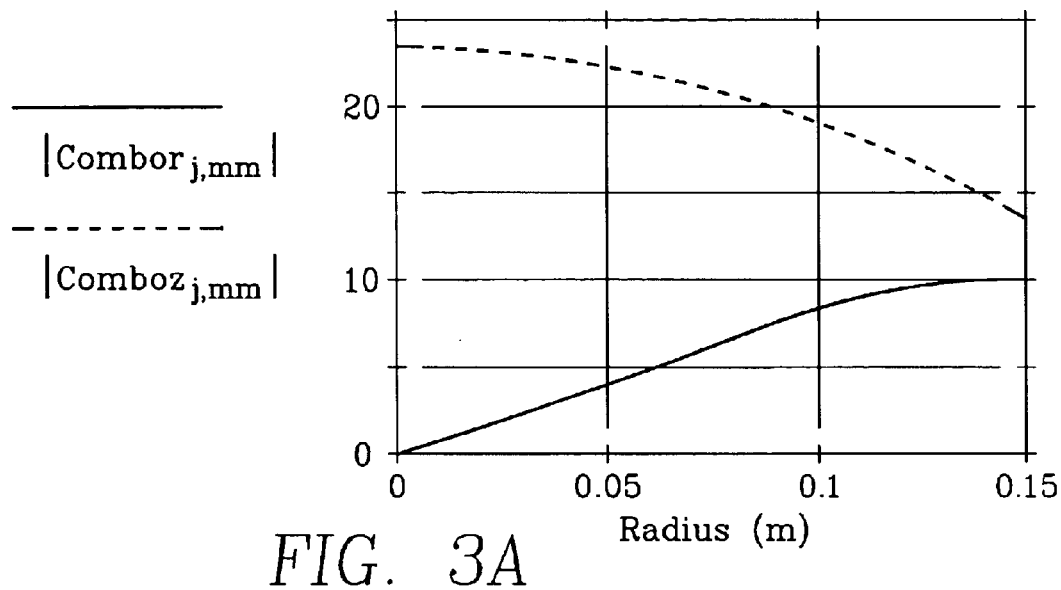
FIGS. 3A and 3B are graphical representations of a magnetic field of the overhead coils of FIG. 1
Figure 3B:
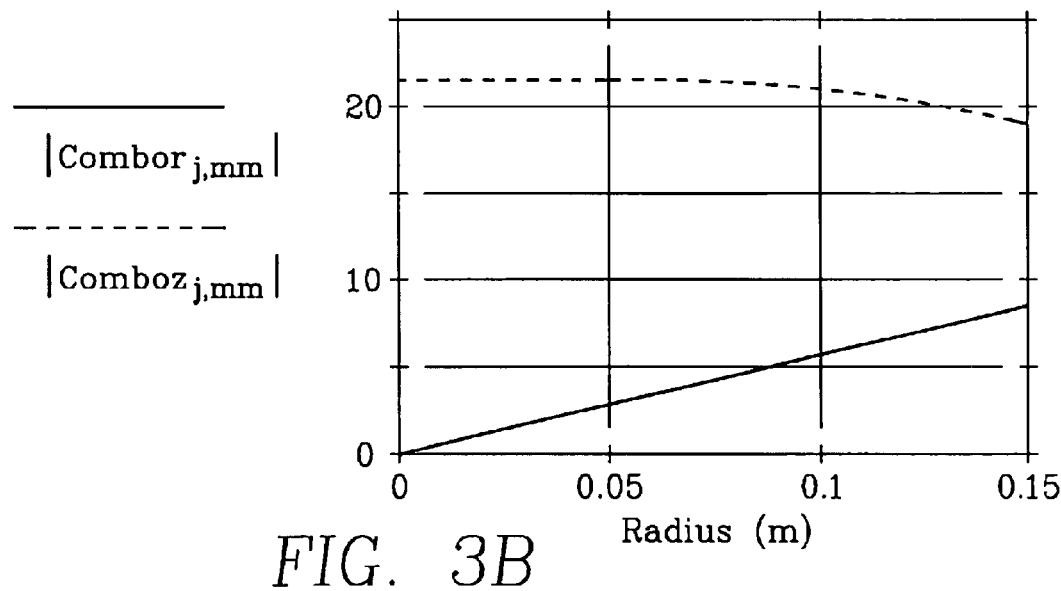
Figure 3C:
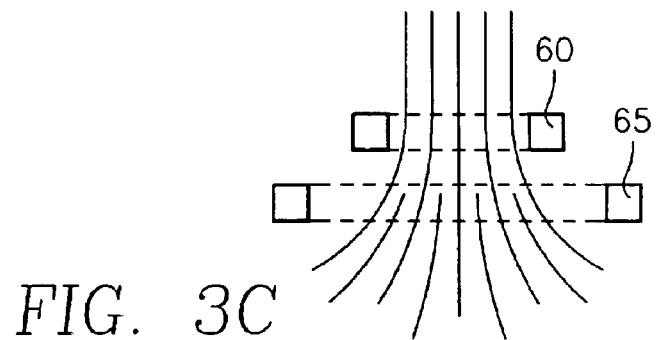
FIG. 3C is a spatial representation of the same field.

FIG. 3A illustrates the radial (solid line) and azimuthal (dashed line) components of the magnetic field produced by the inner coil 60 as a function of radial position on the wafer 20, in the case of FIG. 1A. FIG. 3B illustrates the radial (solid line) and azimuthal (dashed line) components of the magnetic field produced by the outer coil 65 as a function of radial position on the wafer 20. The data illustrated in FIGS. 3A and 3B were obtained in an implementation in which the wafer 20 was 300 mm in diameter, the inner coil 60 was 12 inches in diameter and placed about 10 inches above the plasma, and the outer coil 65 was 22 inches in diameter and placed about 6 inches above the plasma. FIG. 3C is a simplified diagram of the half-cusp shaped magnetic field line pattern produced by the inner and outer overhead coils 60, 65.

The controller 90 of FIG. 2 can change the currents applied to the respective coils 60, 65 in order to adjust the magnetic field at the wafer surface and thereby change the spatial distribution of plasma ion density. What will now be illustrated are the effects of different magnetic fields applied by different ones of the coils 60, 65, in order to illustrate how profoundly the controller 90 can affect and improve plasma ion distribution in the chamber by changing these magnetic fields. In the following examples, the spatial distribution of the etch rate across the wafer surface rather than the plasma ion distribution is measured directly. The etch rate distribution changes directly with changes in the plasma ion distribution and therefore changes in one are reflected by changes in the other.

Figure 4A:
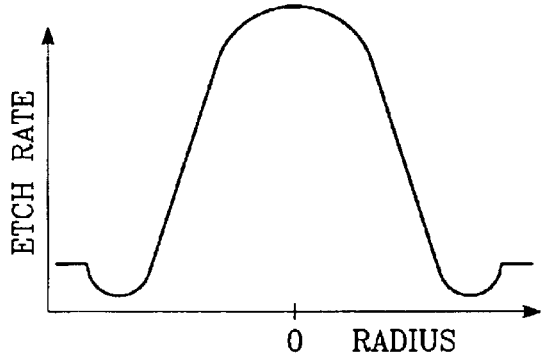
FIGS. 4A, 4B, 4C and 4D are graphs of the etch rate (vertical axis) on the wafer surface as a function of radial location (horizontal axis) for various modes of operation of the reactor of FIG. 1.

FIGS. 4A, 4B, 4C and 4D illustrate the beneficial effects realized using the inner coil 60 only at a low chamber pressure (30 mT). FIG. 4A illustrates measured etch rate (vertical Z axis) as a function of location (horizontal X and Y axes) on the surface of the wafer 20. FIG. 4A thus illustrates the spatial distribution of the etch rate in the plane of the wafer surface. The center-high non-uniformity of the etch rate distribution is clearly seen in FIG. 4A. FIG. 4A corresponds to the case in which no magnetic field is applied, and therefore illustrates a non-uniform etch rate distribution that is inherent in the reactor and needs correction. The etch rate has a standard deviation of 5.7% in this case. In FIGS. 4 and 5, the magnetic field strength will be described as the axial field near the center of the wafer although it is to be understood that the radial field is the one that works on the radial distribution of plasma ion density to improve uniformity. The axial field is chosen in this description because it is more readily measured. The radial field at the edge of the wafer typically is about one third the axial field at this location.

Figure 4B:
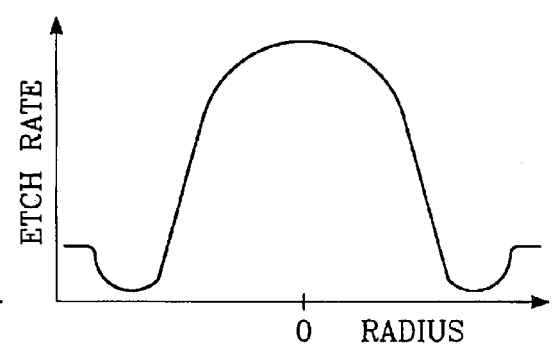

FIG. 4B illustrates how the etch rate distribution changes when the inner coil 60 has been energized to generate a magnetic field of 9 Gauss. The non-uniformity decreases to a standard deviation of 4.7%.

Figure 4C:
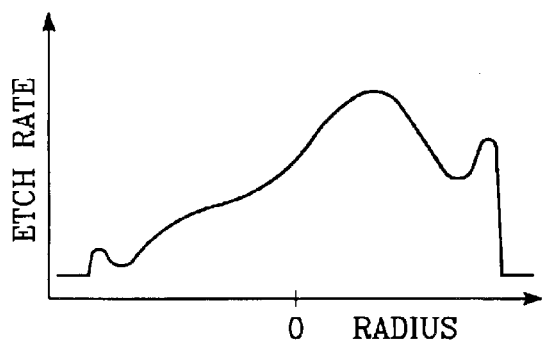

In FIG. 4C the magnetic field of the inner coil 60 has been increased to 18 Gauss, and it can be seen that the peak at the center has been greatly diminished, with the result that the etch rate standard deviation across the wafer is reduced to 2.1%.

Figure 4D:
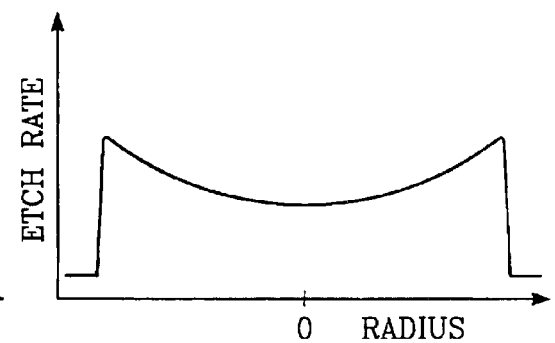

In FIG. 4D the magnetic field of the inner coil 60 has been further increased to 27 Gauss, so that the center high pattern of FIG. 4A has been nearly inverted to a center low pattern. The standard deviation of the etch rate across the wafer surface in the case of FIG. 4D was 5.0%.

Figure 5A:
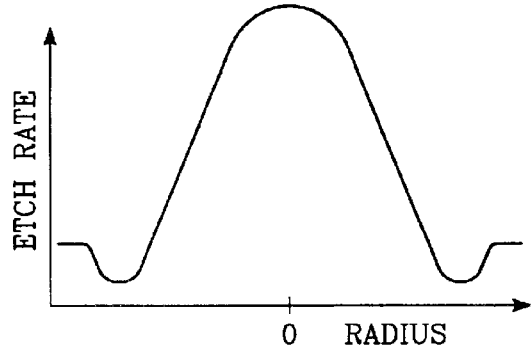
FIGS. 5A, 5B, 5C and 5D are graphs of the etch rate (vertical axis) on the wafer surface as a function of radial location (horizontal axis) for further modes of operation of the reactor of FIG. 1.

FIGS. 5A, 5B, 5C and 5D illustrate the beneficial effects of using both the coils 60, 65 at higher chamber pressures (200 mT). FIG. 5A corresponds to FIG. 4A and depicts the center-high etch rate non-uniformity of the reactor uncorrected by a magnetic field. In this case, the standard deviation of the etch rate across the wafer surface was 5.2%.

Figure 5B:
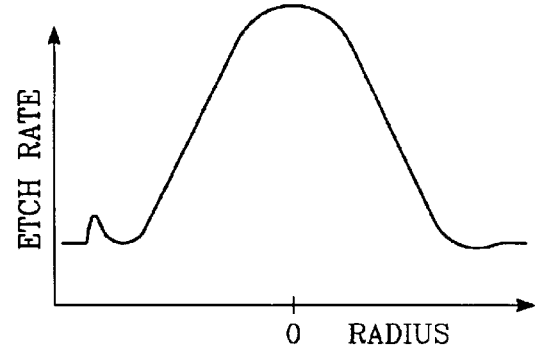

In FIG. 5B, the outer coil 65 has been energized to produce a 22 Gauss magnetic field, which decreases somewhat the center peak in the etch rate distribution. In this case, the etch rate standard deviation has been decreased to 3.5%.

Figure 5C:
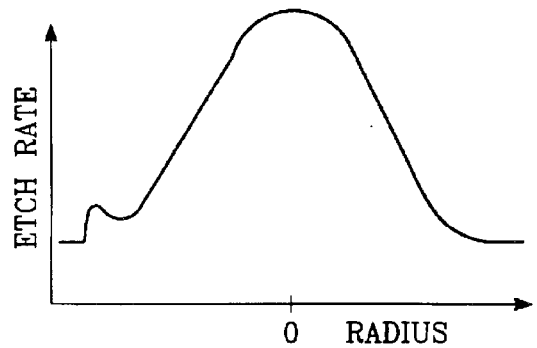

In FIG. 5C, both coils 60, 65 are energized to produce a 24 Gauss magnetic field. The result seen in FIG. 5C is that the center peak in the etch rate distribution has been significantly decreased, while the etch rate near the periphery has increased. The overall effect is a more uniform etch rate distribution with a low standard deviation of 3.2%.

Figure 5D:
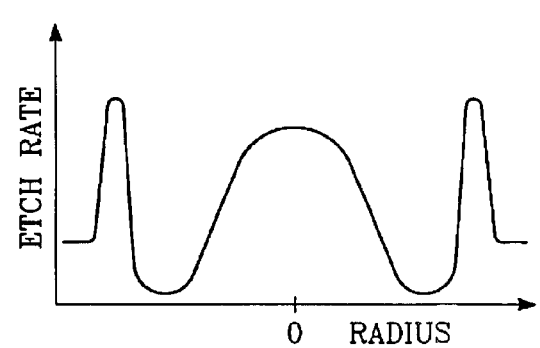

In FIG. 5D, both coils are energized to produce a 40 Guass magnetic field, producing an over-correction, so that the etch rate distribution across the wafer surface has been transformed to a center-low distribution. The etch rate standard deviation in this latter case has risen slightly (relative to the case of FIG. 5C) to 3.5%.

Comparing the results obtained in the low pressure tests of FIGS. 4A–4D with the high pressure tests of FIGS. 5A–5D, it is seen that the higher chamber pressure requires a much greater magnetic field to achieve a similar correction to etch rate non-uniform distribution. For example, at 30 mT an optimum correction was obtained using only the inner coil 60 at 18 Gauss, whereas at 300 mT a magnetic field of 24 Gauss using both coils 60, 65 was required to achieve an optimum correction.

Figure 6:
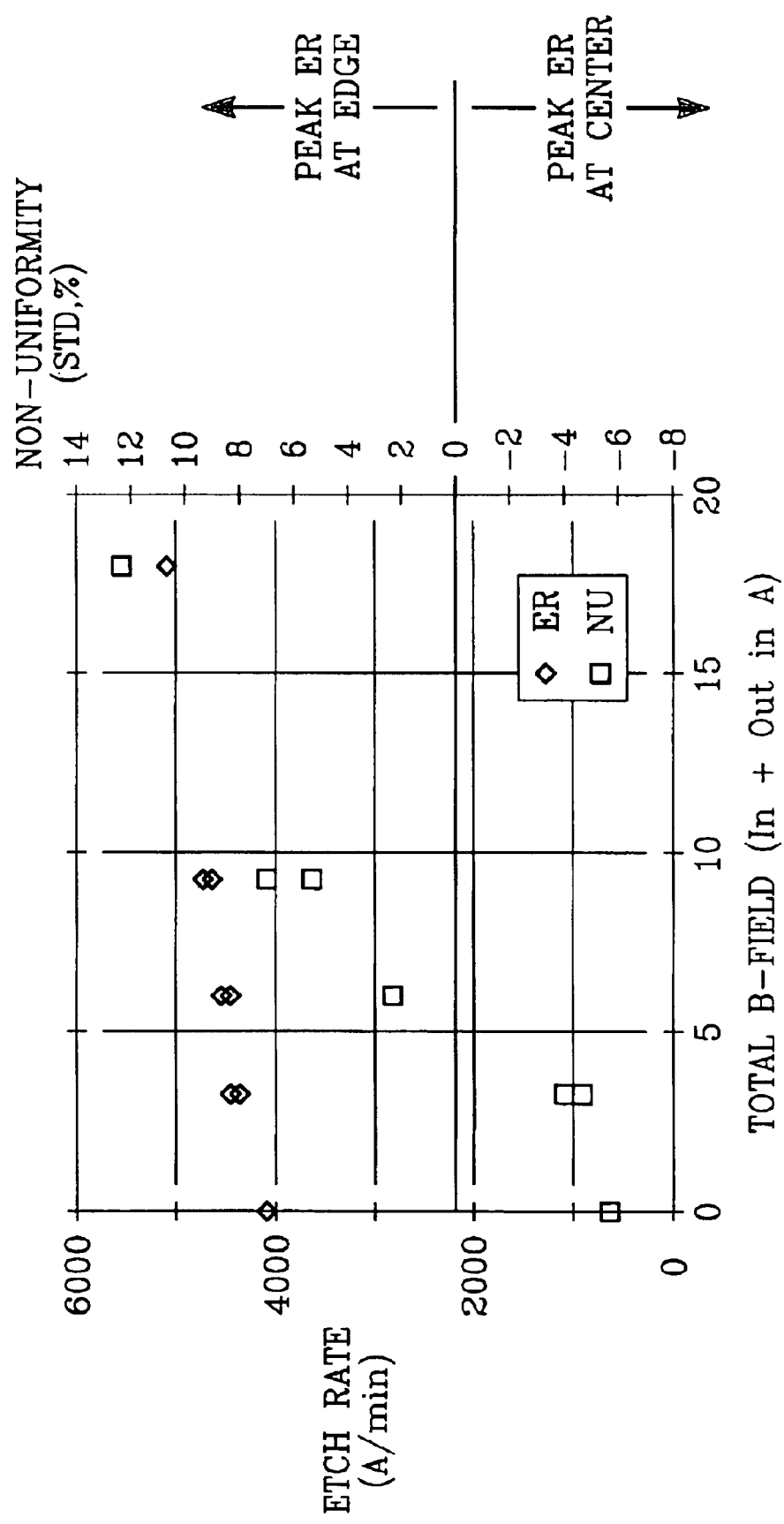
FIG. 6 is a graph depicting etch rate as a function of magnetic field.

FIG. 6 shows that the magnetic fields of the overhead coils greatly affect the uniformity of plasma ion density or etch rate distribution, but do not greatly affect etch rate itself. This is an advantage because, while it is desirable to improve uniformity of etch rate distribution, it is preferable to not change the etch rate chosen for a particular semiconductor process. In FIG. 6, the diamond symbols depict measured etch rate (left-hand vertical axis) as a function of magnetic field (horizontal axis), while the square symbols depict standard deviation (non-uniformity) of the etch rate (right-hand vertical scale) as a function of the magnetic field. The change in non-uniformity over the illustrated range is about one order of magnitude, the change in etch rate is only about 25%.

The overhead coil inductors 60, 65 of FIGS. 1A, 1B and 1C may be used with a conventional MERIE reactor. FIGS.

7 and 8 illustrate an case corresponding to FIG. 1A with the additional feature of four conventional MERIE electromagnets 92, 94, 96, 98 and an MERIE current controller 99. The current controller 99 provides A.C. currents to the respective MERIE electromagnets 92, 94, 96, 98. The respective currents are of the same low frequency but have their phases offset by 90 degrees so as to produce a slowly rotating magnetic field within the chamber in the conventional way.

Controlling Plasma Distribution with the Overhead Coils

In accordance with a method of the invention, plasma ion density distribution across the wafer surface that is inherent in a particular reactor is tailored in a particular way by selecting a particular the magnetic field produced by the overhead coils 60, 65. For example, the plasma distribution may be tailored to produce a more uniform etch rate distribution across the wafer surface. This tailoring is accomplished, for example, by programming the controller 90 to select optimum polarities and amplitudes of the D.C. current flow in the overhead coils. While the present example concerns a reactor with only two concentric overhead coils (i.e., the coils 60 and 65), the method can be carried out with more than two coils, and may provide more accurate results with a greater number of overhead coils. The magnetic field is tailored by the controller 90 to change the plasma ion density distribution across the wafer surface, which in turn affects the etch rate distribution.

A first step is to measure the etch rate distribution across the wafer surface in the absence of any corrective magnetic field from the overhead coils 60, 65. A next step is to determine a change in the plasma ion density distribution that renders the etch rate distribution more uniform. A final step is to determine a magnetic field that would produce the desired change in plasma ion density distribution. Given this magnetic field, the magnitudes and directions of the currents in the overhead coils 60, 65 necessary to produce such a field can be computed from well-known static magnetic field equations.

We have found a way of computing, from the magnetic field, pressure exerted by the magnetic field of the overhead coils 60, 65 on the plasma (the so-called "magnetic pressure"). This will be discussed below. The magnetic pressure on the plasma produces a change in plasma ion density distribution. This change in plasma ion density distribution produces a proportional change in etch rate distribution across the wafer surface, which can be directly observed. The plasma ion density distribution across the wafer surface and the etch rate distribution are therefore at least roughly related by a factor of proportionality.

Initially, the spatial distribution of the etch rate across the wafer surface is measured prior to the application of magnetic fields from the overhead coils 60, 65. From this, a desired change in etch rate distribution (to achieve a uniform distribution) can be determined. Next, the spatial distribution of the magnetic field produced by each overhead coil 60, 65 as a function of location within the chamber and current flow in the coil is determined analytically from the geometry of each coil. Then, by applying a known set of currents to the coils and then measuring the resulting change in etch rate distribution across the wafer surface, a linear scale factor can be deduced that relates the vector sum of the magnetic fields from all the coils at the wafer surface to the change in etch rate distribution at the wafer surface. (This scale factor is generally a function of neutral pressure in the plasma and is operative up to about 500 mT chamber pressure.) Therefore, given a desired change or correction in etch rate distribution (to achieve better uniformity), the necessary magnetic fields can be found (in a manner described later in this specification), and the corresponding coil currents can be inferred therefrom using the magnetic field spatial distribution function previously determined analytically.

The desired correction to the non-uniformity in etch rate distribution can be established in a variety of ways. For example, the 2-dimensional etch rate distribution across the wafer surface can be subtracted from a uniform or average etch rate to produce a "difference" distribution. The non-uniformities in etch rate distribution to be corrected in this method are the result of various factors in the reactor chamber, including non-uniform application of the capacitively coupled source power, non-uniform process gas distribution as well as non-uniform plasma ion density distribution. In the foregoing method, the non-uniformities are corrected by changing the plasma ion density distribution by magnetic pressure.

The following method can also be employed to establish a "corrected" plasma distribution that is non-uniform in some desired way. In this case, the correction to be made is the difference between the "uncorrected" or ambient plasma ion density distribution and the desired distribution (that is itself non-uniform). Thus, the method is useful for making the plasma density distribution either more uniform or of a particular selected density distribution pattern that is not necessarily uniform.

A series of steps for carrying out the foregoing method will now be described with reference to FIG. 9.

The first step (block 910 of FIG. 9) is to analytically determine, for each one of the overhead coils 60, 65, the expression for the magnetic field at the wafer surface as a function of current flow in the coil and radial location on the wafer surface. Using cylindrical coordinates, this expression may be written, for the $i^{th}$ coil, as $B_i(r, z=\text{wafer}, I_i)$. It is determined from the Biot-Savart law in a very straightforward manner.

The next step (block 920 of FIG. 9) is carried out with no current flowing in the overhead coils 60, 65. In this step, the spatial distribution of plasma ion density across the wafer surface is measured. This spatial distribution may be written as $n(r, z=\text{wafer})$. In this step, the plasma ion density distribution can be measured indirectly by measuring the etch rate distribution across the surface of a test wafer. The skilled worker can readily infer the plasma ion density distribution from the etch rate distribution.

Next, in the step of block 930, a correction, $c(r)$, to the measured plasma ion density spatial distribution function $n(r, z=\text{wafer})$ measured in the previous step is determined. The correction $c(r)$ may be defined in any number of appropriate ways. For example, it may be defined as the maximum value $n(r, z=\text{wafer})_{max}$ minus $n(r, z=\text{wafer})$. In this way, adding $c(r)$ to $n(r, z=\text{wafer})$ produces a "corrected" distribution with a uniform amplitude equal to $n(r)_{max}$. Of course, the correction function $c(r)$ may be defined differently to produce a different uniform amplitude. Or, as briefly noted above, if the desired distribution is non-uniform, then the correction is the difference between the desired distribution and $n(r, z=\text{wafer})$.

The next step (block 940) is to select a "test" current $I_i$ for each of the overhead coils 60, 65 and apply that current to the appropriate coil and measure the resulting plasma ion distribution, which may be written $n(r, z=\text{wafer})_{test}$. The change in ion distribution $\Delta n(r)$ is obtained by subtracting the ion distributions measured with and without the magnetic field:

$$\Delta n(r) = n(r, z=\text{wafer}) - n(r, z=\text{wafer})_{test}$$

The next step (block 950) is to compute a scale factor S relating the pressure gradient exerted by the magnetic field (i.e., the magnetic pressure) to the change in ion distribution Δn(r). This computation is performed by dividing the magnetic pressure gradient by Δn(r). The magnetic pressure gradient of the magnetic field B(r, z=wafer, $I_i$) of the $i^{th}$ coil is computed individually for each of the coils in accordance with the magneto-hydrodynamics equation:

$$\nabla_r P \approx -\nabla_r [B(r, z=\text{wafer}, I_i)^2/2\mu_0]$$

where the subscript r denotes radial component. The results thus obtained for each coil individually are then summed together. Therefore, the total magnetic pressure gradient is:

$$-\nabla_r \{\Sigma_i [B(r, z=\text{wafer}, I_i)^2/2\mu_0]\}$$

Therefore, the scale factor S is:

$$S = \{-\nabla_r \{\Sigma_i [B(r, z=\text{wafer}, I_i)^2/2\mu_0]\}\}/\Delta n(r)$$

This division operation may be carried out at different values of r and the results averaged to obtain S in scalar form. Otherwise, the scale factor S will be a function of r and used in the appropriate manner.

The scale factor S found in the step of block 950 is a link between the coil currents I, that determine the magnetic pressure and a resulting change in ion distribution. Specifically, given a set of coil currents $I_i$, a corresponding change in ion distribution n(r) can be computed by multiplying the magnetic pressure determined from the set of $I_i$ by the scale factor S:

$$\Delta n(r) = \{-\nabla_r \{\Sigma_i [B(r, z=\text{wafer}, I_i)^2/2\mu_0]\}\}/S$$

This fact provides the basis for the following step (block 960) in which a computer (such as the microprocessor 91) uses the foregoing equation to search for a set of coil currents $I_i$ that produces the best approximation to previously specified or desired change in plasma ion density distribution, Δn(r). In this case, the desired change is equal to the correction function c(r) computed in the step of block 930. In other words, the computer searches for a set of coil currents $I_i$ that satisfies the following condition:

$$\{-\nabla_r \{\Sigma_i [B(r, z=\text{wafer}, I_i)^2/2\mu_0]\}\} = c(r)S$$

This search may be carried out by well-known optimization techniques involving, for example, the method of steepest descents. Such techniques are readily carried out by the worker skilled in this field and need not be described here.

The magnitudes and polarities of the set of coil currents $I_i$ discovered by the search are then sent to the controller 90, which in turn applies these currents to the respective coils 60, 65.

Figure 10:
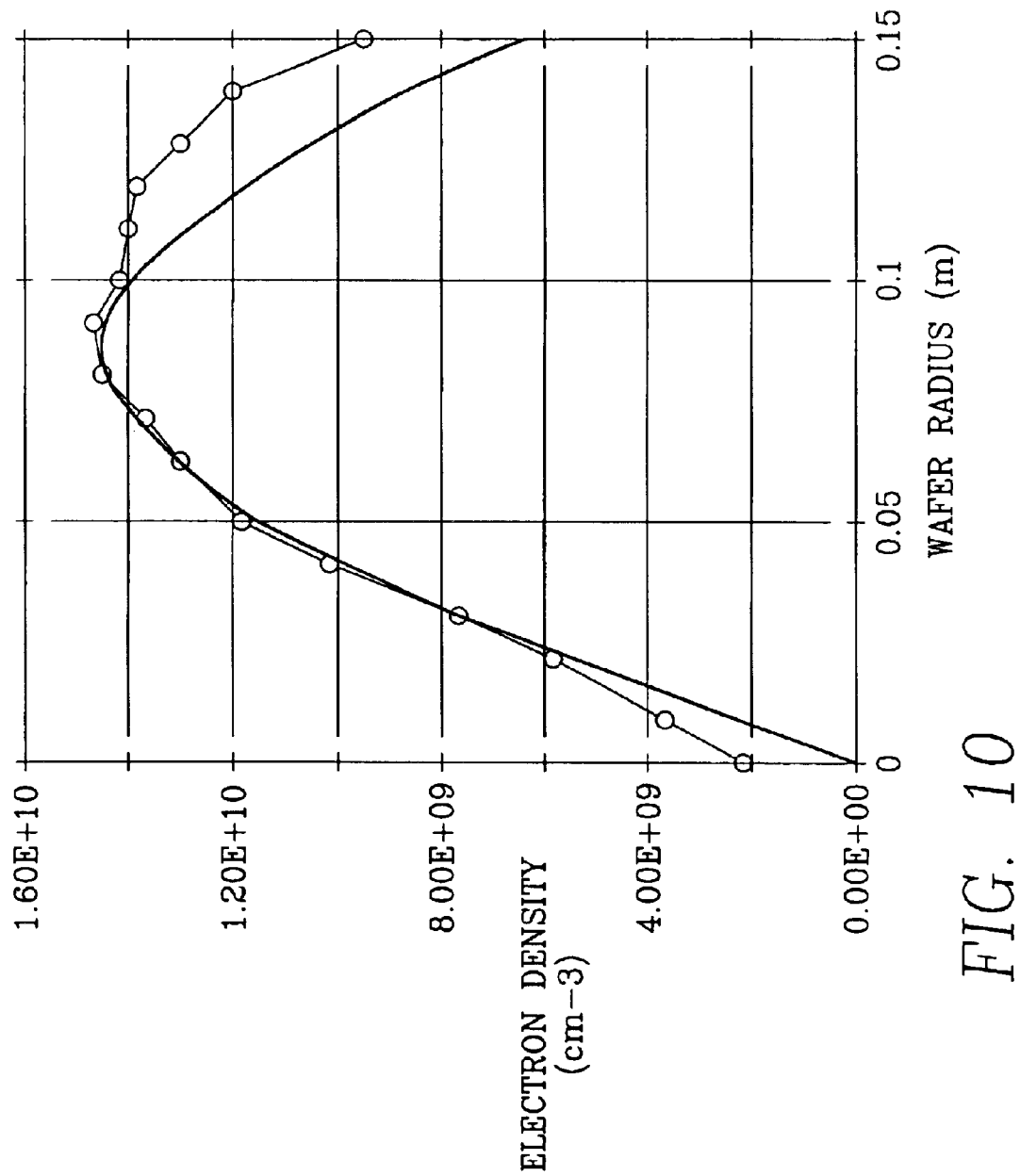
FIG. 10 is a graph illustrating a comparative example of magnetic pressure and ion or electron density as functions of radial location on the wafer surface in the reactor of FIG. 1A.

FIG. 10 compares magnetic pressure (solid line) with the measured change in plasma ion distribution (dotted line) as a function of radial position at the wafer surface. As discussed above, the magnetic pressure is the gradient of the square of the magnetic fields of the overhead coils. FIG. 10 indicates that there is good correlation between magnetic pressure and change in ion density distribution.

Figure 11:
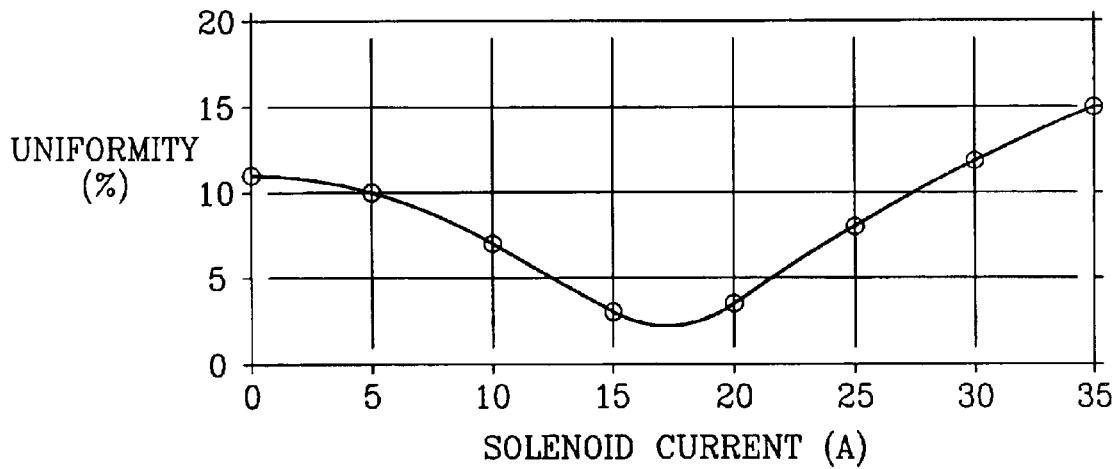
FIG. 11 is a graph depicting etch rate non-uniformity as a function of coil current.
Figure 12:
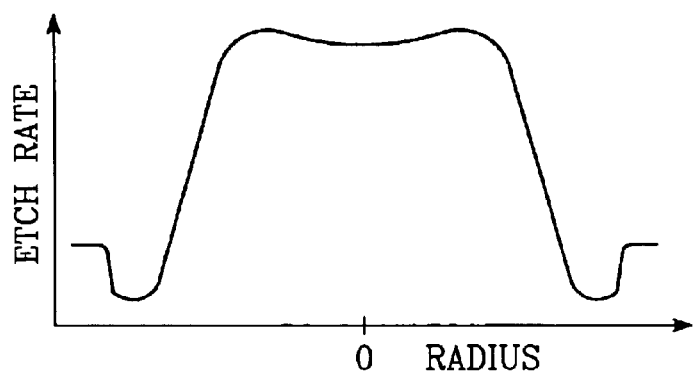
FIG. 12 illustrates radial ion distribution at zero coil current in the example of FIG. 11.

The application of such a method is illustrated in FIGS. 11–14. FIG. 11 illustrates how non-uniformity or the standard deviation (vertical axis) in the etch rate spatial distribution at the wafer surface varied with coil current in one of the overhead coils. At zero coil current, the standard deviation was about 12%, and the ion distribution was center-high as shown in FIG. 12.

Figure 13A:
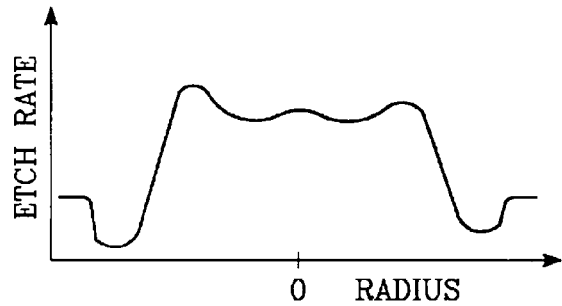
FIGS. 13A and 13B compare measured and predicted etch rate distributions at a coil current of about 11 amperes in the example of FIG. 11.
Figure 13B:
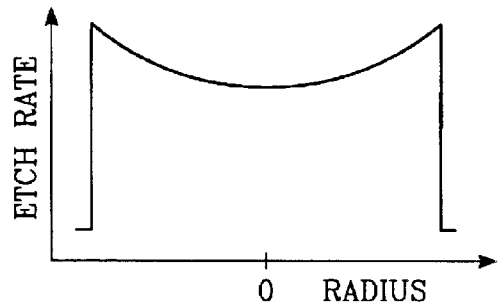

The minimum non-uniformity at about 3% was achieved at a coil current of about 17 amperes. This represents an improvement by about a factor of four (i.e., 12% to 3% standard deviation in the etch rate distribution). The actual or measured etch rate distribution was as shown in FIG. 13A, while the etch rate distribution predicted using the techniques of FIG. 9 was as shown in FIG. 13B.

Figure 14A:
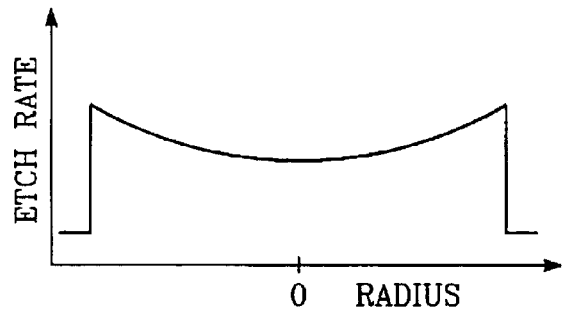
FIGS. 14A and 14B compare measured and predicted etch rate distributions at a coil current of about 35 amperes in the example of FIG. 11.
Figure 14B:
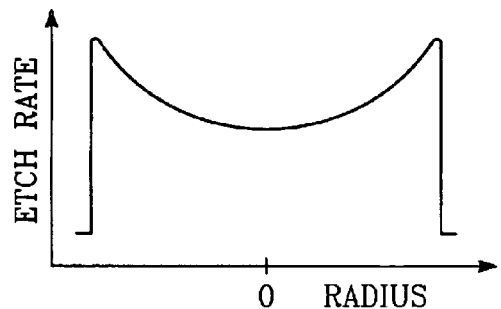

At the high coil current of 35 amperes, the etch rate distribution standard deviation was about 14%. The measured etch rate spatial distribution was as shown in FIG. 14A while the predicted distribution was as shown in FIG. 14B.

Referring again to FIG. 13A, the most uniform ion distribution obtained is certainly not flat and in fact has "bowl" shape, being concave near the periphery and convex near the center. It is possible that with a greater number of independent overhead coils (e.g., three or more), the optimization of currents may be carried out with greater resolution and better uniformity in results. Therefore, the invention is not limited to the cases having only two coils. The invention may be implemented with varying results using less than or more than two overhead coils.

Figure 15:
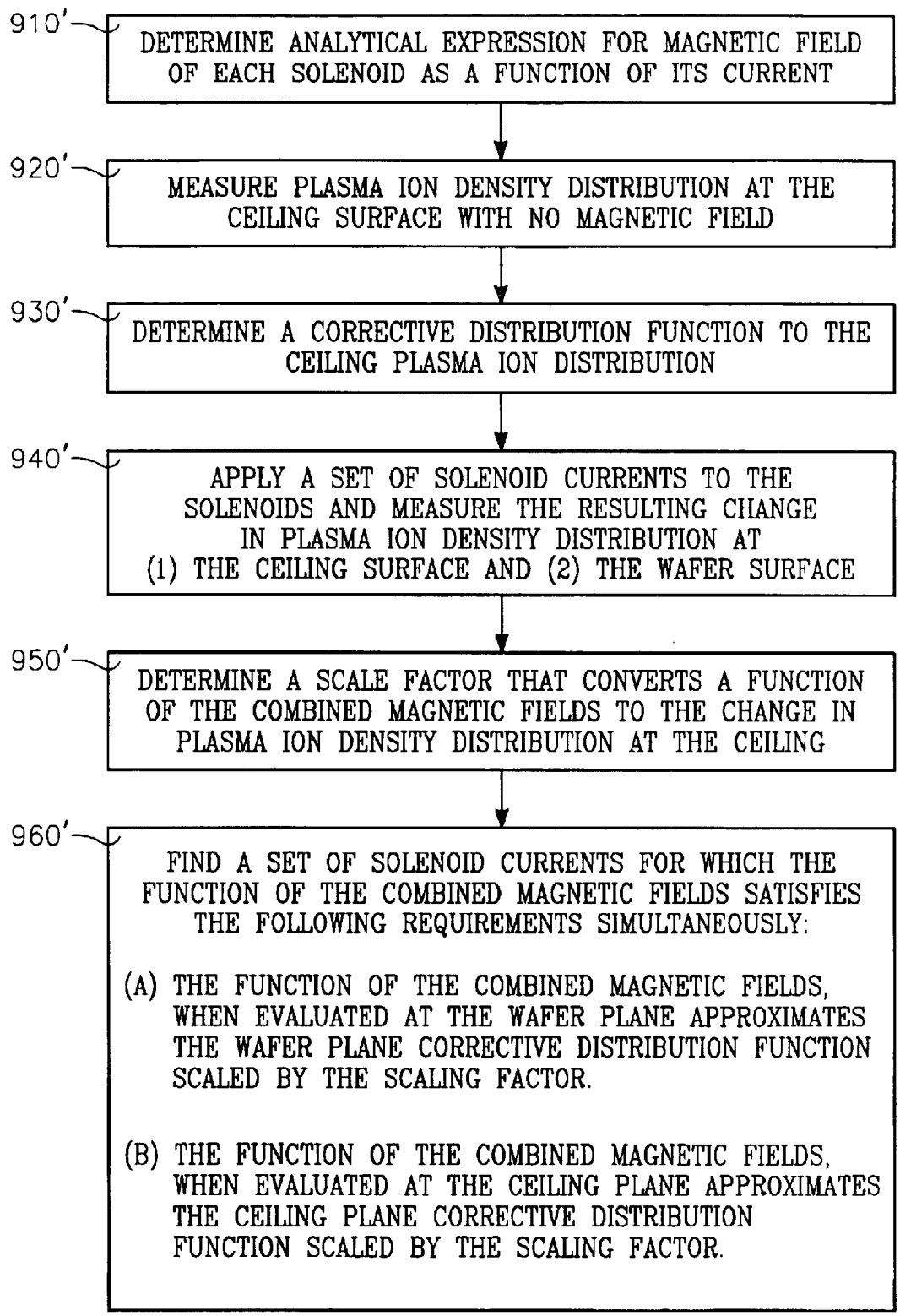
FIG. 15 depicts a further method of operating the reactor of FIG. 1A.

The same method may be applied in order to control plasma ion density distribution or etch rate distribution at the ceiling surface. Such an approach may be useful during chamber cleaning operations, for example. FIG. 15 illustrates a version of the method of FIG. 9 in which uniformity of the spatial distribution of ion density (or, etch rate) is optimized. The steps of FIG. 15, namely blocks 910', 920', 930', 940', 950' and 960' are the same as the steps of FIG. 9, namely blocks 910, 920, 930, 940, 950 and 960, except that they are carried out for the ceiling plane rather than the wafer plane:

The first step (block 910' of FIG. 15) is to analytically determine, for each one of the overhead coils 60, 65, the expression for the magnetic field at the ceiling surface as a function of current flow in the coil and radial location on the wafer surface. Using cylindrical coordinates, this expression may be written, for the $i^{th}$ coil, as $B_r(r, z=\text{ceiling}, I_i)$. It is determined from simple static magnetic field equations and is a function not only of coil current $I_i$ and radial location r on the ceiling surface but also of certain constants such as the radius of the coil and the distance, z=ceiling, between the coil and the ceiling interior surface.

The next step (block 920' of FIG. 15) is carried out with no current flowing in the overhead coils 60, 65. In this step, the spatial distribution of plasma ion density across the ceiling surface is measured. This spatial distribution may be written as n(r, z=ceiling). In this step, the plasma ion density distribution can be measured by a conventional probe or other indirect techniques.

Next, in the step of block 930', a correction, c'(r), to the measured plasma ion density spatial distribution function n(r, z=ceiling) measured in the previous step is determined. (It should be noted that the prime notation is employed here to distinguish the computations of FIG. 15 from those of FIG. 9 described above, and does not connote a derivative as used herein.) The correction c'(r) may be defined in any number of appropriate ways. For example, it may be defined as the maximum value n(r, z=ceiling)max minus n(r, z=ceiling). In this way, adding c'(r) to n(r, z=ceiling) produces a "corrected" distribution with a uniform amplitude equal to $n(r)_{max}$. Of course, the correction function c'(r) may be defined differently to produce a different uniform amplitude. Also, if a particular non-uniform distribution is desired, then the correction is the difference between the uncorrected or ambient plasma distribution n(r, z=ceiling) and the desired non-uniform distribution. Thus, the method can be employed to establish either a desired plasma ion distribution having a particular non-uniform pattern or to establish a uniform plasma ion density distribution.

The next step (block 940') is to select a "test" current $I_i$ for each of the overhead coils 60, 65 and apply that current to the appropriate coil and measure the resulting plasma ion distribution, which may be written $n(r, z=\text{ceiling})_{test}$. The change in ion distribution $\Delta n(r)$ is obtained by subtracting the ion distributions measured with and without the magnetic field:

$$\Delta n'(r) = n(r, z=\text{ceiling}) - n(r, z=\text{ceiling})_{test}$$

The next step (block 950') is to compute a scale factor S' relating the pressure gradient exerted by the magnetic field (i.e., the magnetic pressure) to the change in ion distribution $\Delta n'(r)$. This computation is performed by dividing the magnetic pressure gradient by $\Delta n'(r)$. The magnetic pressure gradient of the magnetic field $B(r, z=\text{ceiling}, I_i)$ of the $i^{th}$ coil is computed individually for each of the coils in accordance with the magneto-hydrodynamics equation:

$$\nabla_r P = -\nabla_r [B(r, z=\text{ceiling}, I_i)^2/2\mu_0]$$

where the subscript r denotes radial component. The results thus obtained for each coil individually are then summed together. Therefore, the total magnetic pressure gradient is:

$$-\nabla_r \{\Sigma_i [B(r, z=\text{wafer}, I_i)^2/2\mu_0]\}$$

Therefore, the scale factor S is:

$$S' = \{-\nabla_r \{\Sigma_i [B(r, z=\text{wafer}, I_i)^2/2\mu_0]\}\}/\Delta n'(r)$$

The scale factor S' found in the step of block 950' is a link between the coil currents $I_i$ that determine the magnetic pressure and a resulting change in ion distribution. Specifically, given a set of coil currents $I_i$, a corresponding change in ion distribution n'(r) can be computed by multiplying the magnetic pressure determined from the set of $I_i$ by the scale factor S':

$$\Delta n'(r) = \{-\nabla_r \{\Sigma_i [B(r, z=\text{wafer}, I_i)^2/2\mu_0]\}\}/S'$$

This fact provides the basis for the following step (block 960') in which a computer (such as the microprocessor 91) uses the foregoing equation to search for a set of coil currents $I_i$ that produces the best approximation to previously specified or desired change in plasma ion density distribution, $\Delta n'(r)$. In this case, the desired change is equal to the correction function c'(r) computed in the step of block 930'. In other words, the computer searches for a set of coil currents $I_i$ that satisfies the following condition:

$$\{-\nabla_r \{\Sigma_i [B(r, z=\text{wafer}, I_i)^2/2\mu_0]\}\} = c'(r)S'$$

This search may be carried out by well-known optimization techniques involving, for example, the method of steepest descents. Such techniques are readily carried out by the worker skilled in this field and need not be described here.

The magnitudes and polarities of the set of coil currents $I_i$ discovered by the search are then sent to the controller 90, which in turn applies these currents to the respective coils 60, 65.

With only a single overhead coil, the apparatus can be used to optimize plasma ion distribution uniformity at either the wafer or the ceiling but not both simultaneously. With at least two overhead coils (e.g., the overhead coils 60 and 65), plasma ion distribution uniformity can be at least approximately optimized at both the wafer and the ceiling simultaneously.

Steering Plasma with the Overhead Coils

We have discovered that the coil currents $I_i$ may be selected in such a manner as to steer the plasma toward the ceiling and/or side walls or to steer it to the wafer surface. The coil currents $I_i$ may also be selected to improve uniformity of plasma density distribution at the ceiling surface in a manner similar to the method of FIG. 9. As a result, the plasma may be concentrated during processing on the wafer, and then during cleaning may be concentrated on the ceiling and/or side walls. By thus concentrating the plasma at the ceiling, cleaning time may be reduced.

Figure 16:
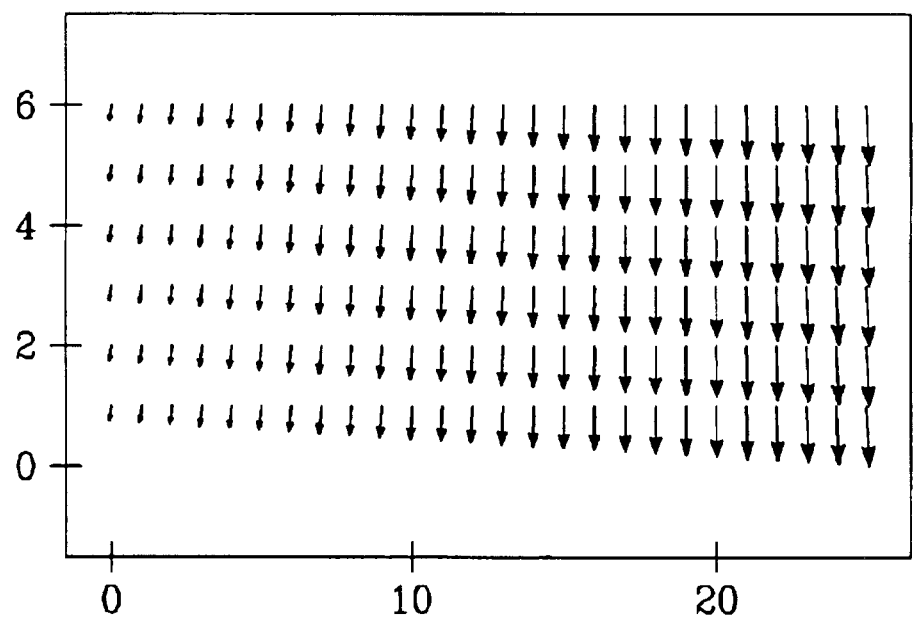
FIG. 16 illustrates a magnetic field distribution obtained in a reactor corresponding to FIG. 1A.
Figure 17:
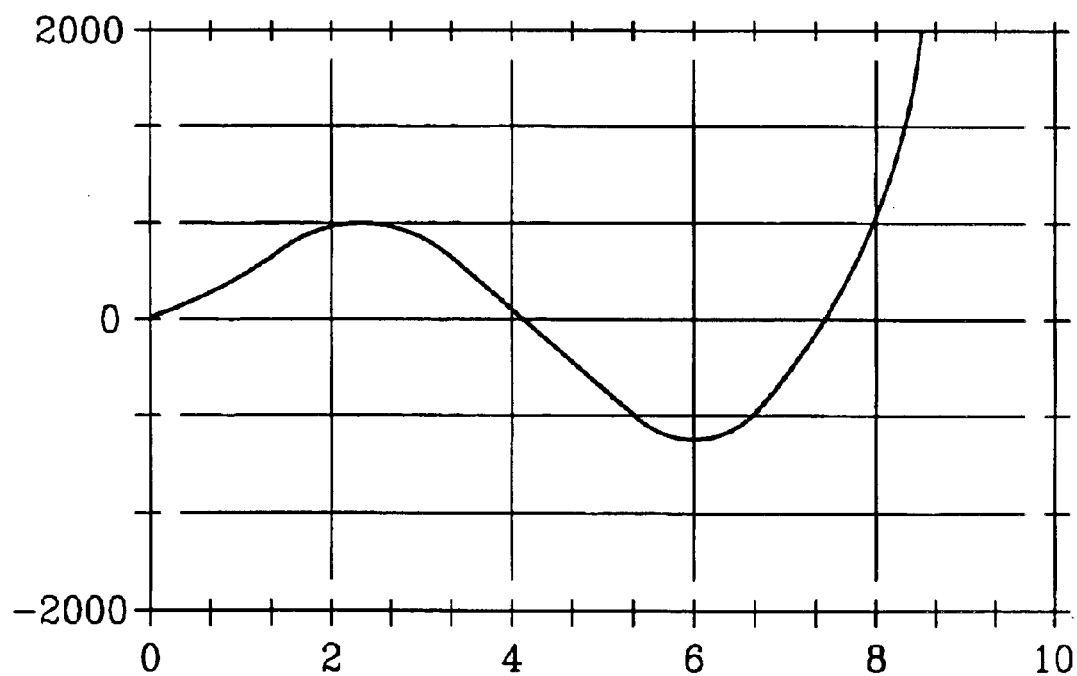
FIG. 17 depicts the gradient of the square of the magnetic field of FIG. 16 in the wafer plane.

In one example, the plasma was steered to the side wall of the chamber by the controller 90 applying a current of −17.5 amperes to the inner coil 60 and a current of +12.5 amperes to the outer coil 65. FIG. 16 illustrates a radial portion of the chamber interior extending along the horizontal axis from zero radius to the periphery of the chamber and extending along the vertical axis from the wafer surface to the ceiling. The small arrows in FIG. 16 indicate the magnitude and direction of the magnetic field at various locations in the chamber when the plasma is steered to the side wall of the chamber by the controller 90 applying a current of −17.5 amperes to the inner coil 60 and a current of +12.5 amperes to the outer coil 65. FIG. 17 illustrates the corresponding gradient of the square of the magnetic field at the wafer surface as a function of radial position.

Figure 18:
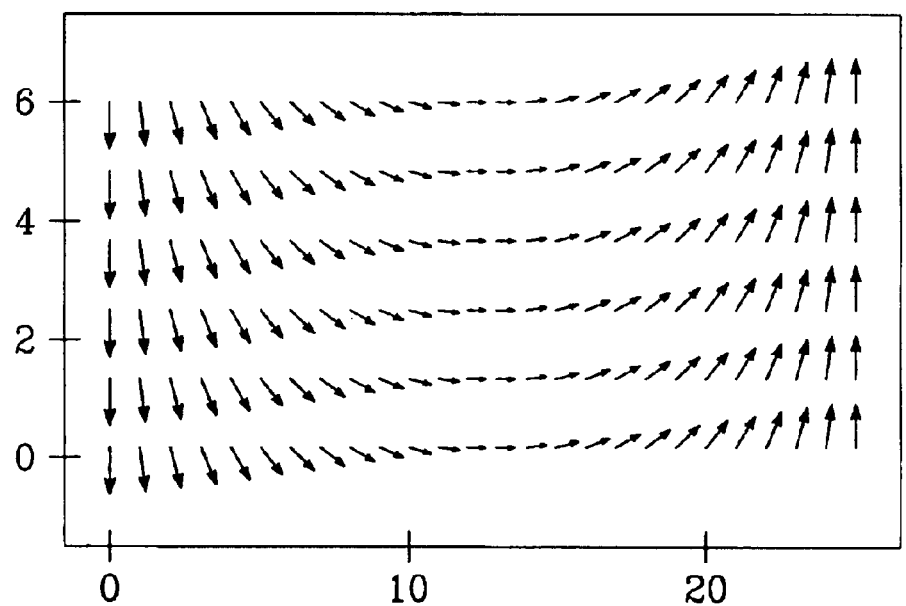
FIG. 18 illustrates another magnetic field distribution obtained in a reactor corresponding to FIG. 1A.
Figure 19:
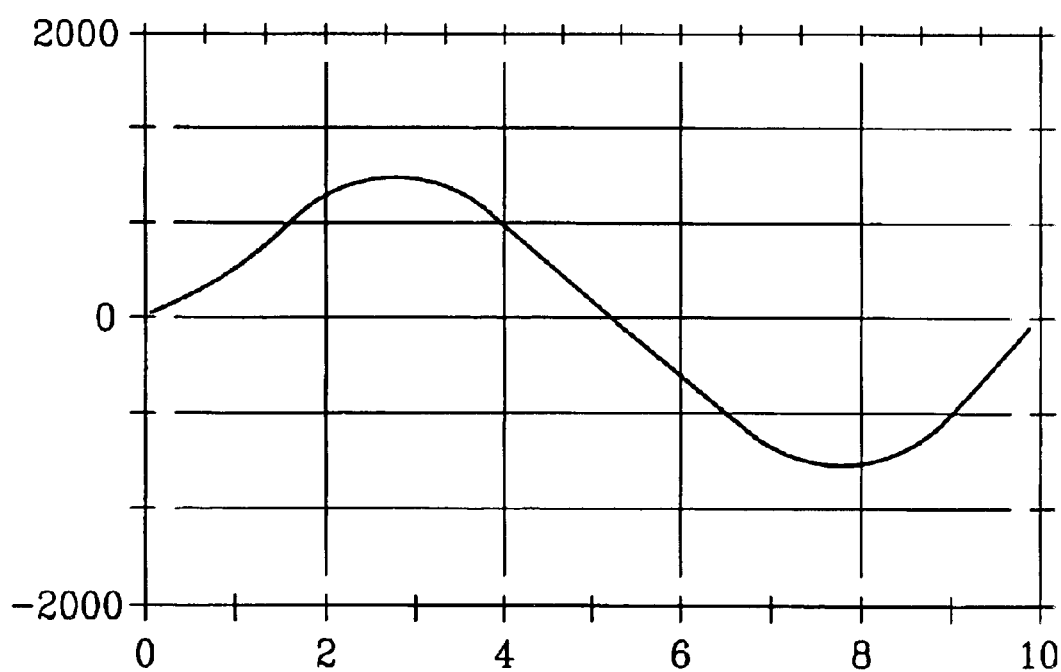
FIG. 19 depicts the gradient of the square of the magnetic field of FIG. 18 in the wafer plane.

In another example, the plasma was steered to the roof of the chamber by the controller 90 applying a current of −12.5 amperes to the inner coil 60 and a current of +5 amperes to the outer coil 65. FIG. 18 illustrates a radial portion of the chamber interior extending along the horizontal axis from zero radius to the periphery of the chamber and extending along the vertical axis from the wafer surface to the ceiling. The small arrows in FIG. 18 indicate the magnitude and direction of the magnetic field at various locations in the chamber when the plasma is steered to the side wall of the chamber by the controller 90 applying a current of −12.5 amperes to the inner coil 60 and a current of +5 amperes to the outer coil 65. FIG. 19 illustrates the corresponding gradient of the square of the magnetic field at the wafer surface as a function of radial position.

Figure 20:
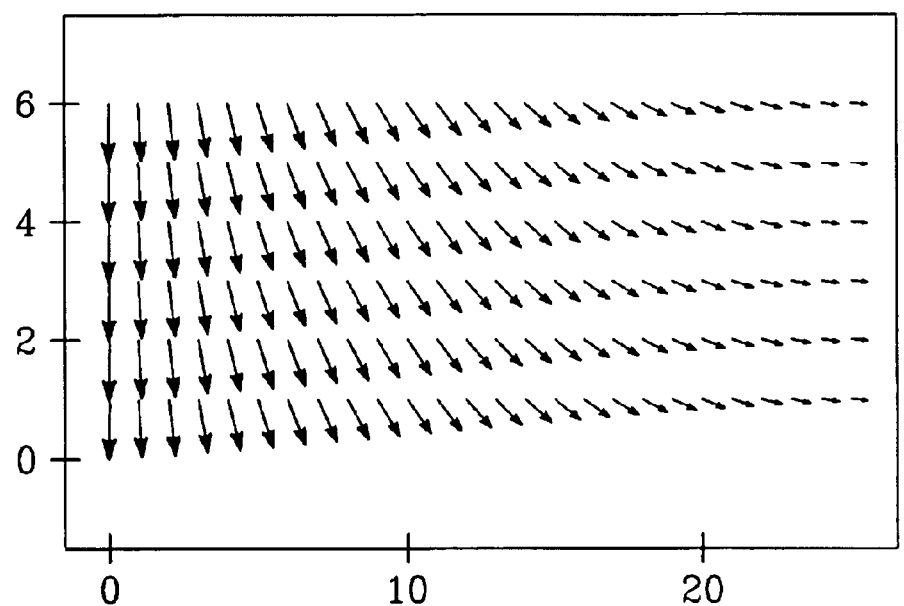
FIG. 20 illustrates a yet further magnetic field distribution obtained in a reactor corresponding to FIG. 1A.
Figure 21:
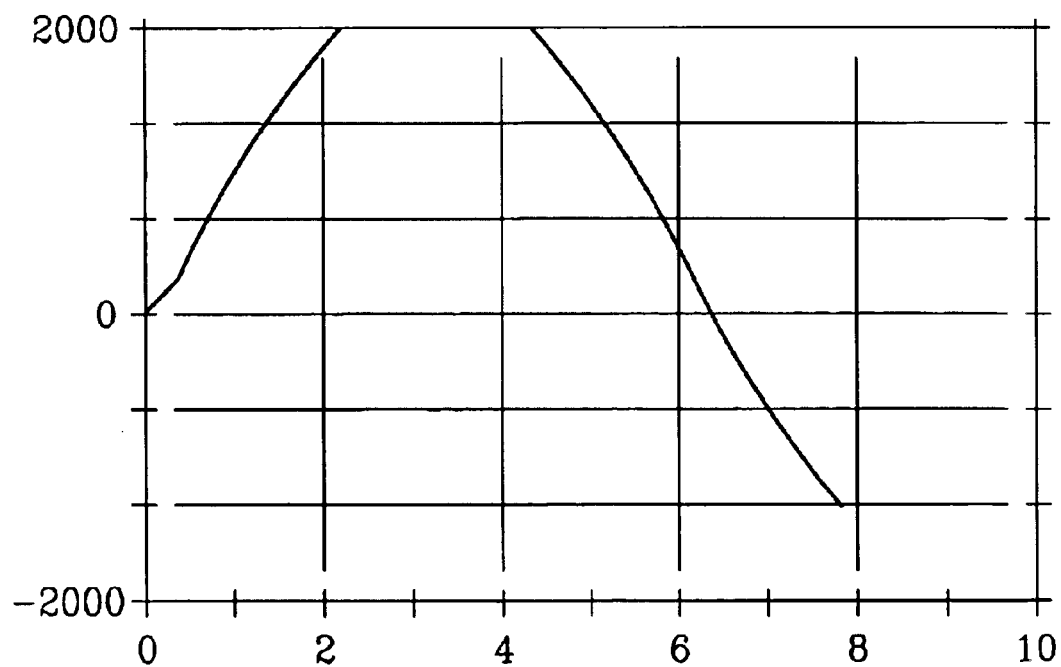
FIG. 21 depicts the gradient of the square of the magnetic field of FIG. 20 in the wafer plane.

In a further example, plasma was steered along field lines extending from the center of the ceiling to the side wall by the controller 90 applying a current of −25 amperes to the inner coil 60 and a current of +2.75 to the outer coil 65. FIG. 20 illustrates a radial portion of the chamber interior extending along the horizontal axis from zero radius to the periphery of the chamber and extending along the vertical axis from the wafer surface to the ceiling. The small arrows in FIG. 20 indicate the magnitude and direction of the magnetic field at various locations in the chamber when the plasma is steered to the side wall of the chamber by the controller 90 applying a current of −25 amperes to the inner coil 60 and a current of +2.5 amperes to the outer coil 65. FIG. 21 illustrates the corresponding gradient of the square of the magnetic field at the wafer surface as a function of radial position.

FIG. 17 shows that a high positive magnetic pressure on the plasma is exerted near the edge of the chamber when the plasma is steered to the edge. FIG. 19 shows that a low magnetic pressure on the plasma is exerted near the edge of the chamber when the plasma is directed to the edge of the ceiling. FIG. 21 shows that a high negative pressure is present near the chamber edge when the field lines extend from the ceiling to the edge.

Thus, the currents in the overhead coils 60, 65 may be chosen to direct the plasma to various locations in the chamber that may require cleaning, such as the ceiling and the side wall. Or, the plasma may be concentrated more near the wafer. In order to steer the plasma to either the wafer or the ceiling, or to apportion the plasma between the wafer and the ceiling in accordance with some steering ratio SR, a method such as that illustrated in FIG. 22 may be carried out.

Figure 22:
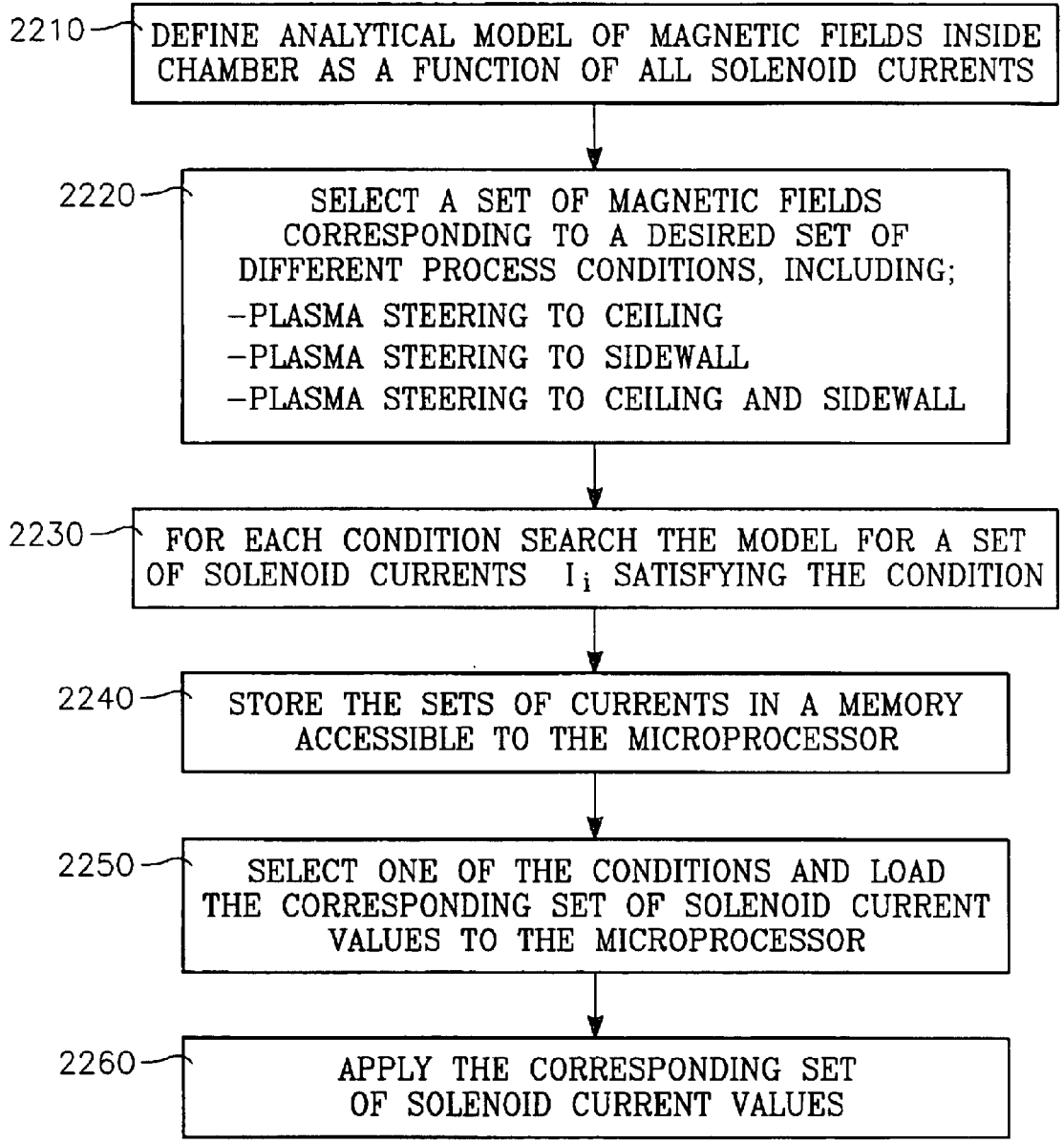
FIG. 22 depicts yet another method of operating the reactor of FIG. 1A.

Referring now to FIG. 22, the first step (block 2210 of FIG. 22) is to define an analytical model of the magnetic field inside the chamber as a function of all coil currents in the overhead coils (e.g., the pair of coils 60, 65). This is readily accomplished using static magnetic field equations by a worker skilled in this field, and need not be described here. The magnetic field is the sum of the individual magnetic fields from each of the coils. Each individual magnetic field is a function of the diameter of the respective coil, the location of each coil, the current flow in the coil and the location in the chamber. Thus, the magnetic field produced by the $i^{th}$ coil may be written as:

$$B(x, y, z, I_i)$$

so that the total magnetic field is:

$$\Sigma_i\{B(x, y, z, I_i)\}$$

The next step (block 2220) is to select a set of magnetic fields that fulfill a set of desired process conditions. For example, to steer plasma to the ceiling, a magnetic field is selected that produces a magnetic pressure on the plasma that pushes the plasma toward the ceiling, as illustrated in the example of FIG. 18. To steer the plasma toward the side wall, a magnetic field is chosen that produces a magnetic pressure on the plasma that pushes the plasma toward the periphery, as illustrated in FIG. 16.

For each magnetic field defined in the step of block 2220 above that fulfills a particular condition, a computer searches the model defined in the step of block 2210 for a set of coil currents that produce the desired magnetic field. This is the next step of block 2230. Each set of currents found in the step of block 2230 is stored along with the name of the corresponding condition in a memory location associated with the corresponding process condition (block 2240 of FIG. 22). Whenever a particular process condition is selected (e.g., steering the plasma to the ceiling), then the microprocessor 91 fetches the set of current values from the corresponding memory location (block 2250) and causes the corresponding currents to be applied to the appropriate coils (block 2260).

Figure 23:
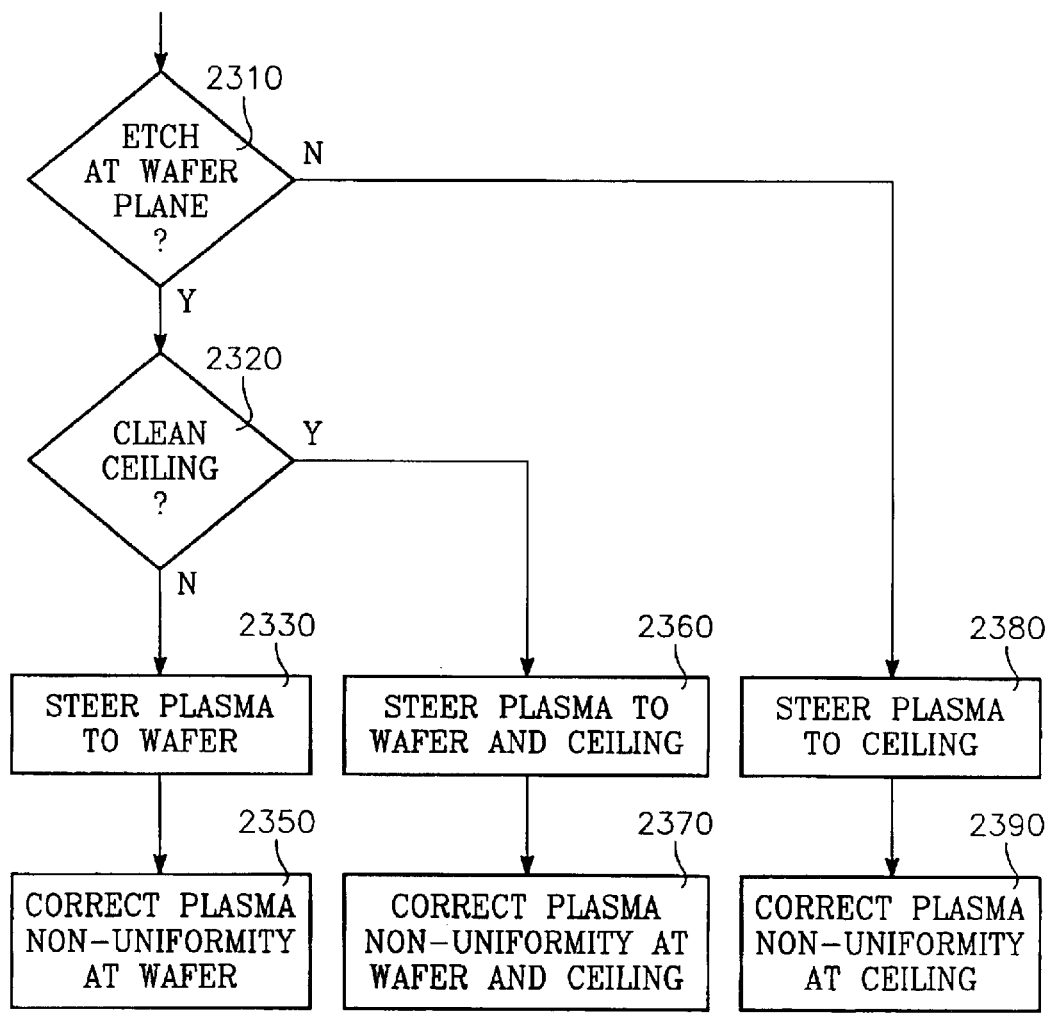
FIG. 23 illustrates an exemplary microcontroller operation for controlling the reactor of FIG. 1A.

FIG. 23 shows how the microprocessor 91 may be programmed to respond to user inputs. A determination is first made whether the processing includes etching of the wafer surface (block 2310 and whether the process includes cleaning (etching) the ceiling (block 2320). If only the wafer is to be etched, then the plasma is steered to the wafer (block 2330) and the plasma distribution uniformity at the wafer surface is optimized (block 2350) using the method of FIG. 9. If the wafer is to etched while the ceiling is to cleaned at the same time, then the plasma density is apportioned between the ceiling and the wafer (block 2360) and plasma density uniformity is optimized at the wafer surface as in FIG. 9 and at the ceiling as in FIG. 15 (block 2370). If only the ceiling is to be cleaned, then the plasma is steered to the ceiling (block 2380) and plasma density uniformity at the ceiling is optimized (block 2390).

Figure 24:
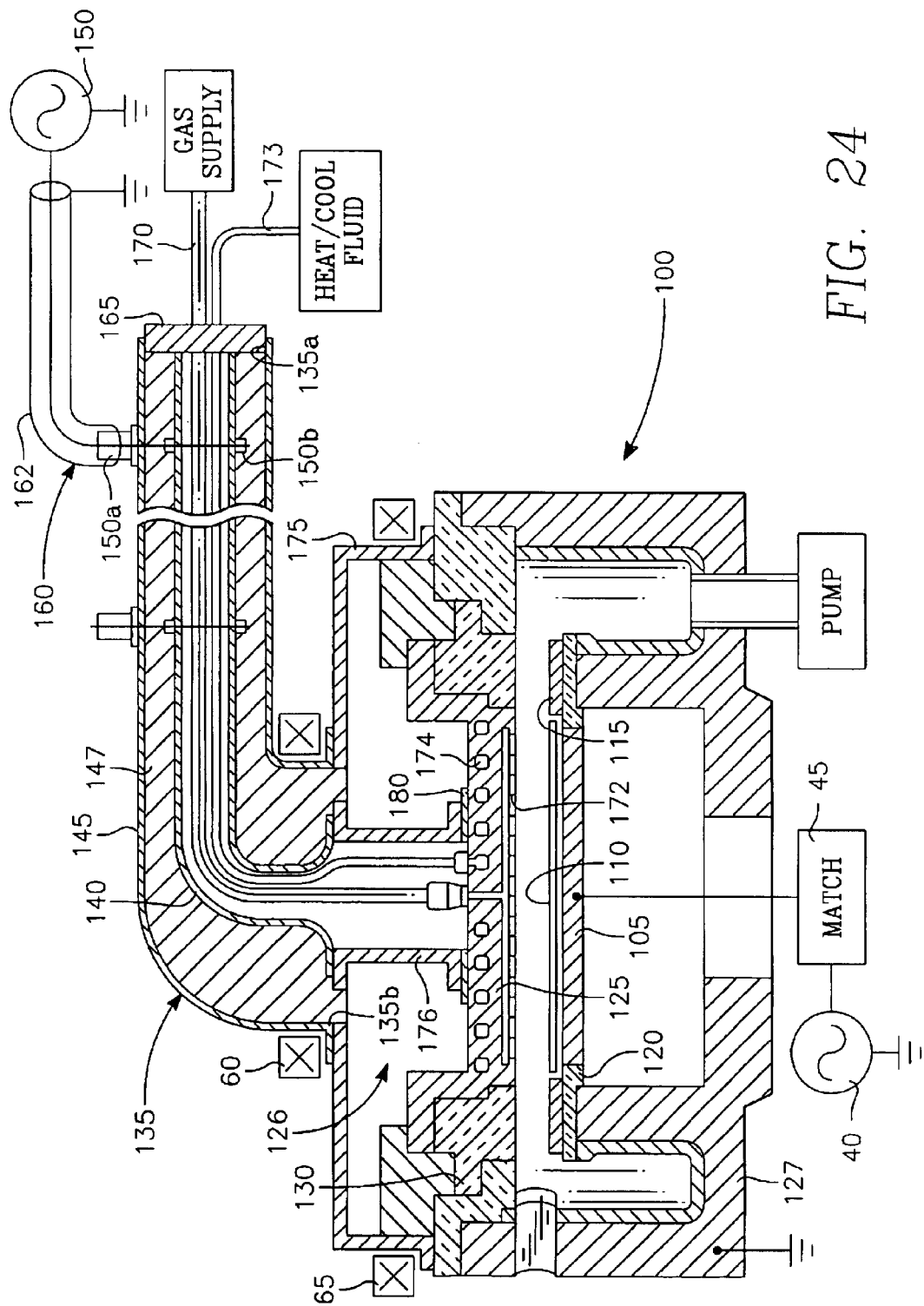
FIG. 24 illustrates a plasma reactor including features contained in the reactor of FIG. 1A.

Use with VHF Overhead Electrode:

FIG. 24 illustrates how the inner and outer coils 60, 65 may be combined with a capacitively coupled reactor that has an overhead electrode connected to a VHF plasma source power generator through a fixed tuning stub. Such a reactor is described in U.S. patent application Ser. No. 10/028,922 filed Dec. 19, 2001 by Daniel Hoffman et al. entitled "Plasma Reactor with Overhead RF Electrode Tuned to the Plasma" and assigned to the present assignee, the disclosure of which is incorporated herein by reference.

Referring to FIG. 24, a plasma reactor includes a reactor chamber 100 with a wafer support 105 at the bottom of the chamber supporting a semiconductor wafer 110. A process kit may include, in an exemplary implementation, a conductive or semi-conductive ring 115 supported by a dielectric ring 120 on a grounded chamber body 127. The chamber 100 is bounded at the top by a disc shaped overhead conductive electrode 125 supported at a gap length above the wafer 110 on grounded chamber body 127 by a dielectric seal. In one implementation, the wafer support 105 is movable in the vertical direction so that the gap length may change. In other implementations, the gap length may be a fixed predetermined length. The overhead electrode 125 may be a metal (e.g., aluminum) which may be covered with a semi-metal material (e.g., Si or SiC) on its interior surface, or it may be itself a semi-metal material. An RF generator 150 applies RF power to the electrode 125. RF power from the generator 150 is coupled through a coaxial cable 162 matched to the generator 150 and into a coaxial stub 135 connected to the electrode 125. The stub 135 has a characteristic impedance, has a resonance frequency, and provides an impedance match between the electrode 125 and the coaxial cable 162 or the output of the RF power generator 150, as will be more fully described below. The chamber body is connected to the RF return (RF ground) of the RF generator 150. The RF path from the overhead electrode 125 to RF ground is affected by the capacitance of the dielectric seal 120 and by the capacitance of the dielectric seal 130. The wafer support 105, the wafer 110 and the process kit conductive or semiconductive ring 115 provide the primary RF return path for RF power applied to the electrode 125.

As in the case of FIG. 1A, the inner coil 60 is less than half the diameter of the outer coil 65 and is in a plane farther away from the chamber than the outer coil 65. The outer coil 65 is located at or close to the plane of the top of the electrode 125, while the inner coil 60 is located well above the electrode 125. As in the case of FIG. 1, the D.C. currents in the coils 60, 65 are controlled by the plasma steering controller 90 governing the current supplies 70, 75 of the coils 60, 65.

The capacitance of the overhead electrode assembly 126, including the electrode 125, the process kit 115, 120 and the dielectric seal 130 measured with respect to RF return or ground was, in one exemplary case, 180 pico farads. The electrode assembly capacitance is affected by the electrode area, the gap length (distance between wafer support and overhead electrode), and by factors affecting stray capacitances, especially the dielectric values of the seal 130 and of the dielectric ring 120, which in turn are affected by the dielectric constants and thicknesses of the materials employed. More generally, the capacitance of the electrode assembly 126 (an unsigned number or scalar) is equal or nearly equal in magnitude to the negative capacitance of the plasma (a complex number) at a particular source power frequency, plasma density and operating pressure, as will be discussed below.

Many of the factors influencing the foregoing relationship are in great part predetermined due to the realities of the plasma process requirements needed to be performed by the reactor, the size of the wafer, and the requirement that the processing be carried out uniformly over the wafer. Thus, the plasma capacitance is a function of the plasma density and the source power frequency, while the electrode capacitance is a function of the wafer support-to-electrode gap (height), electrode diameter, and dielectric values of the insulators of the assembly. Plasma density, operating pressure, gap, and electrode diameter must satisfy the requirements of the plasma process to be performed by the reactor. In particular, the ion density must be within a certain range. For example, silicon and dielectric plasma etch processes generally require the plasma ion density to be within the range of $10^9$ to $10^{12}$ ions/cc. The wafer electrode gap provides an optimum plasma ion distribution uniformity for 8 inch wafers, for example, if the gap is about 2 inches. The electrode diameter is preferably at least as great as, if not greater than the diameter of the wafer. Operating pressures similarly have practical ranges for typical etch and other plasma processes.

But it has been found that other factors remain which can be selected to achieve the above preferred relationship, particularly choice of source frequency and choice of capacitances for the overhead electrode assembly 126. Within the foregoing dimensional constraints imposed on the electrode and the constraints (e.g., density range) imposed on the plasma, the electrode capacitance can be matched to the magnitude of the negative capacitance of the plasma if the source power frequency is selected to be a VHF frequency, and if the dielectric values of the insulator components of electrode assembly 126 are selected properly. Such selection can achieve a match or near match between source power frequency and plasma-electrode resonance frequency.

Accordingly in one exemplary case, for an 8-inch wafer the overhead electrode diameter is approximately 11 inches, the gap is about 2 inches, the plasma density and operating pressure is typical for etch processes as above-stated, the VHF source power frequency is 210 MHz (although other VHF frequencies could be equally effective), and the source power frequency, the plasma electrode resonance frequency and the stub resonance frequency are all matched or nearly matched.

More particularly, these three frequencies are slightly offset from one another, with the source power frequency being 210 MHz, the electrode-plasma resonant frequency being approximately 200 MHz, and the stub frequency being about 220 MHz, in order to achieve a de-tuning effect which advantageously reduces the system Q. Such a reduction in system Q renders the reactor performance less susceptible to changes in conditions inside the chamber, so that the entire process is much more stable and can be carried out over a far wider process window.

A currently preferred mode has chamber and pedestal diameters suitable for accommodating a 12 inch diameter wafer, a wafer-to-ceiling gap of about 1.25 inch and an VHF source power frequency of 162 MHz (rather than the 210 MHz referred to above).

The coaxial stub 135 is a specially configured design which further contributes to the overall system stability, its wide process window capabilities, as well as many other valuable advantages. It includes an inner cylindrical conductor 140 and an outer concentric cylindrical conductor 145. An insulator 147 (denoted by cross-hatching in FIG. 24), having a relative dielectric constant of 1 for example, fills the space between the inner and outer conductors 140, 145. The inner and outer conductors 140, 145 may be formed, for example, of nickel-coated aluminum. In an exemplary case, the outer conductor 145 has a diameter of about 4 inches and the inner conductor 140 has a diameter of about 1.5 inches. The stub characteristic impedance is determined by the radii of the inner and outer conductors 140, 145 and the dielectric constant of the insulator 147. The stub 135 of the case described above has a characteristic impedance of 65Ω. More generally, the stub characteristic impedance exceeds the source power output impedance by about 20%–40% and preferably by about 30%. The stub 135 has an axial length of about 29 inches (a half wavelength at 220 MHz) in order to have a resonance in the vicinity of 220 MHz to generally match while being slightly offset from the VHF source power frequency of 210 MHz.

A tap 160 is provided at a particular point along the axial length of the stub 135 for applying RF power from the RF generator 150 to the stub 135, as will be discussed below. The RF power terminal 150b and the RF return terminal 150a of the generator 150 are connected at the tap 160 on the stub 135 to the inner and outer coaxial stub conductors 140, 145, respectively. These connections are made via a generator-to-stub coaxial cable 162 having a characteristic impedance that matches the output impedance of the generator 150 (typically, 50 Ω) in the well-known manner. A terminating conductor 165 at the far end 135a of the stub 135 shorts the inner and outer conductors 140, 145 together, so that the stub 135 is shorted at its far end 135a. At the near end 135b (the unshorted end) of the stub 135, the outer conductor 145 is connected to the chamber body via an annular conductive housing or support 175, while the inner conductor 140 is connected to the center of electrode 125 via a conductive cylinder or support 176. A dielectric ring 180 is held between and separates the conductive cylinder 176 and the electrode 125.

The inner conductor 140 provides a conduit for utilities such as process gases and coolant. The principal advantage of this feature is that, unlike typical plasma reactors, the gas line 170 and the coolant line 173 do not cross large electrical potential differences. They therefore may be constructed of metal, a less expensive and more reliable material for such a purpose. The metallic gas line 170 feeds gas outlets 172 in or adjacent the overhead electrode 125 while the metallic coolant line 173 feeds coolant passages or jackets 174 within the overhead electrode 125.

An active and resonant impedance transformation is thereby provided by this specially configured stub match between the RF generator 150, and the overhead electrode assembly 126 and processing plasma load, minimizing reflected power and providing a very wide impedance match space accommodating wide changes in load impedance. Consequently, wide process windows and process flexibility is provided, along with previously unobtainable efficiency in use of power, all while minimizing or avoiding the need for typical impedance match apparatus. As noted above, the stub resonance frequency is also offset from ideal match to further enhance overall system Q, system stability and process windows and multi-process capability.

Matching the Electrode-Plasma Resonance Frequency and the VHF
Source Power Frequency:

As outlined above, a principal feature is to configure the overhead electrode assembly 126 for resonance with the plasma at the electrode-plasma resonant frequency and for the matching (or the near match of) the source power frequency and the electrode-plasma frequency. The electrode assembly 126 has a predominantly capacitive reactance while the plasma reactance is a complex function of frequency, plasma density and other parameters. (As will be described below in greater detail, a plasma is analyzed in terms of a reactance which is a complex function involving imaginary terms and generally corresponds to a negative capacitance.) The electrode-plasma resonant frequency is determined by the reactances of the electrode assembly 126 and of the plasma (in analogy with the resonant frequency of a capacitor/inductor resonant circuit being determined by the reactances of the capacitor and the inductor). Thus the electrode-plasma resonant frequency may not necessarily be the source power frequency, depending as it does upon the plasma density. The problem, therefore, is to find a source power frequency at which the plasma reactance is such that the electrode-plasma resonant frequency is equal or nearly equal to the source power frequency, given the constraints of practical confinement to a particular range of plasma density and electrode dimensions. The problem is even more difficult, because the plasma density (which affects the plasma reactance) and the electrode dimensions (which affect electrode capacitance) must meet certain process constraints. Specifically, for dielectric and conductor plasma etch processes, the plasma density should be within the range of $10^9$–$10^{12}$ ions/cc, which is a constraint on the plasma reactance. Moreover, a more uniform plasma ion density distribution for processing 8-inch diameter wafers for example, is realized by a wafer-to-electrode gap or height of about 2 inches and an electrode diameter on the order of the wafer diameter, or greater, which is a constraint on the electrode capacitance. On the other hand, a different gap may be utilized for a 12-inch diameter wafer.

Accordingly, by matching (or nearly matching) the electrode capacitance to the magnitude of the negative capacitance of the plasma, the electrode-plasma resonant frequency and the source power frequency are at least nearly matched. For the general conductor and dielectric etch process conditions enumerated above (i.e., plasma density between $10^9$–$10^{12}$ ions/cc, a 2-inch gap and an electrode diameter on the order of roughly 11 inches), the match is possible if the source power frequency is a VHF frequency. Other conditions (e.g., different wafer diameters, different plasma densities, etc.) may dictate a different frequency range to realize such a match in carrying out this feature of the reactor. As will be detailed below, under favored plasma processing conditions for processing 8-inch wafers in several principal applications including dielectric and metal plasma etching and chemical vapor deposition, the plasma capacitance in one typical working example having plasma densities as set forth above was between −50 and −400 pico farads. In an exemplary case the capacitance of the overhead electrode assembly 126 was matched to the magnitude of this negative plasma capacitance by using an electrode diameter of 11 inches, a gap length (electrode to pedestal spacing) of approximately 2 inches, choosing a dielectric material for seal 130 having a dielectric constant of 9, and a thickness of the order of one inch, and a dielectric material for the ring 120 having a dielectric constant of 4 and thickness of the order of 10 mm.

The combination of electrode assembly 126 and the plasma resonates at an electrode-plasma resonant frequency that at least nearly matches the source power frequency applied to the electrode 125, assuming a matching of their capacitances as just described. We have discovered that for favored etch plasma processing recipes, environments and plasmas, this electrode-plasma resonant frequency and the source power frequency can be matched or nearly matched at VHF frequencies; and that it is highly advantageous that such a frequency match or near-match be implemented. In an exemplary case, the electrode-plasma resonance frequency corresponding to the foregoing values of plasma negative capacitance is approximately 200 MHz, as will be detailed below. The source power frequency is 210 MHz, a near-match in which the source power frequency is offset slightly above the electrode-plasma resonance frequency in order to realize other advantages to be discussed below.

The plasma capacitance is a function of among other things, plasma electron density. This is related to plasma ion density, which needs, in order to provide good plasma processing conditions, to be kept in a range generally $10^9$ to $10^{12}$ ions/cc. This density, together with the source power frequency and other parameters, determines the plasma negative capacitance, the selection of which is therefore constrained by the need to optimize plasma processing conditions, as will be further detailed below. But the overhead electrode assembly capacitance is affected by many physical factors, e.g. gap length (spacing between electrode 125 and the wafer); the area of electrode 125; the range of the dielectric loss tangent for the dielectric seal 130; the choice of dielectric constant of the dielectric seal 130 between electrode 125 and grounded chamber body 127; the choice of dielectric constant for the process kit dielectric seal 130; and the thickness of the dielectric seals 130 and 120 and the thickness and dielectric constant of the ring 180. This permits some adjustment of the electrode assembly capacitance through choices made among these and other physical factors affecting the overhead electrode capacitance. We have found that the range of this adjustment is sufficient to achieve the necessary degree of matching of the overhead electrode assembly capacitance to the magnitude of the negative plasma capacitance. In particular, the dielectric materials and dimensions for the seal 130 and ring 120 are chosen to provide the desired dielectric constants and resulting dielectric values. Matching the electrode capacitance and the plasma capacitance can then be achieved despite the fact that some of the same physical factors influencing electrode capacitance, particularly gap length, will be dictated or limited by the following practicalities: the need to handle larger diameter wafers; to do so with good uniformity of distribution of plasma ion density over the full diameter of the wafer; and to have good control of ion density vs. ion energy.

Given the foregoing range for the plasma capacitance and the matching overhead electrode capacitance, the electrode-plasma resonance frequency was approximately 200 MHz for a source power frequency of 210 MHz.

A great advantage of choosing the capacitance of the electrode assembly 126 in this manner, and then matching the resultant electrode-plasma resonant frequency and the source power frequency, is that resonance of the electrode and plasma near the source power frequency provides a wider impedance match and wider process window, and consequently much greater immunity to changes in process conditions, and therefore greater performance stability. The entire processing system is rendered less sensitive to variations in operating conditions, e.g., shifts in plasma impedance, and therefore more reliable along with a greater range of process applicability. As will be discussed later in the specification, this advantage is further enhanced by the small offset between the electrode-plasma resonant frequency and the source power frequency.

Figure 25:
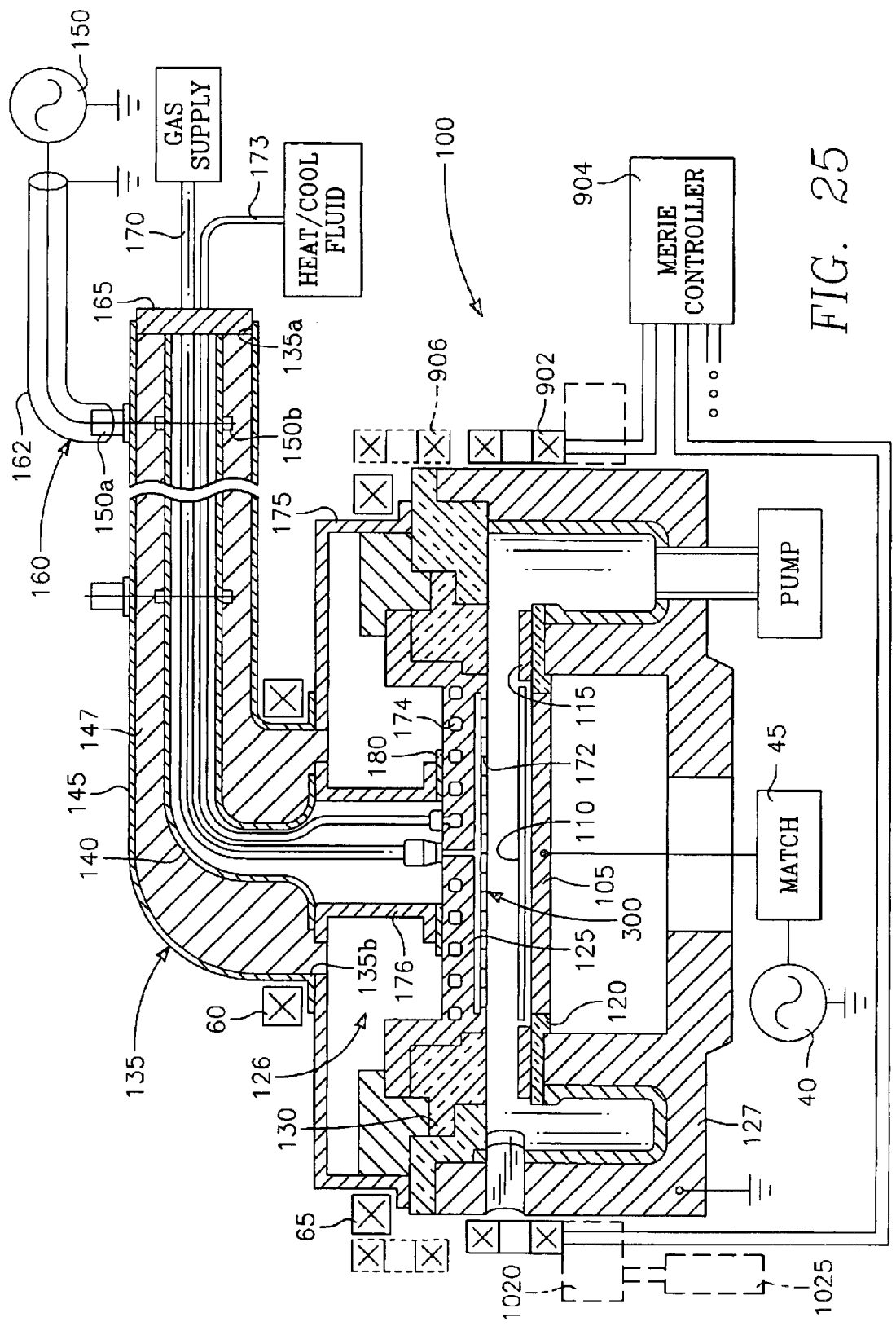
FIG. 25 illustrates another plasma reactor including features contained in the reactor of FIG. 1A.

FIG. 25 illustrate how the inner and outer coils 60, 65 may be combined with a capacitively coupled reactor that has an overhead electrode connected to a VHF plasma source power generator through a fixed tuning stub, and has MERIE electromagnets around its periphery. Such a reactor is described in U.S. patent application Ser. No. 10/028,922 filed Dec. 19, 2001 by Daniel Hoffman et al. entitled "Plasma Reactor with Overhead RF Electrode Tuned to the Plasma" and assigned to the present assignee, the disclosure of which is incorporated herein by reference.

Referring to FIG. 25, a VHF capacitively coupled plasma reactor includes the following elements found in the reactor of FIG. 1A: a reactor chamber 100 with a wafer support 105 at the bottom of the chamber supporting a semiconductor wafer 110. A process kit in the illustrated case consists of a semi-conductive or conductive ring 115 supported by a dielectric ring 120 on the grounded chamber body 127. The chamber 100 is bounded at the top by a disc shaped overhead aluminum electrode 125 supported at a predetermined gap length above the wafer 110 on grounded chamber body 127 by a dielectric seal 130. The overhead electrode 125 also may be a metal (e.g., aluminum) which may be covered with a semi-metal material (e.g., Si or SiC) on its interior surface, or it may be itself a semi-metal material. An RF generator 150 applies RF power to the electrode 125. RF power from the generator 150 is coupled through a coaxial cable 162 matched to the generator 150 and into a coaxial stub 135 connected to the electrode 125. The stub 135 has a characteristic impedance, resonance frequency, and provides an impedance match between the electrode 125 and the coaxial cable 162/RF power generator 150, as will be more fully described below. The chamber body is connected to the RF return (RF ground) of the RF generator 150. The RF path from the overhead electrode 125 to RF ground is affected by the capacitance of the process kit dielectric ring 120 and the dielectric seal 130. The wafer support 105, the wafer 110 and the process kit semiconductive (or conductive) ring 115 provide the primary RF return path for RF power applied to the electrode 125.

As in the case of FIG. 1A, the inner coil 60 is less than half the diameter of the outer coil 65 and is in a plane farther away from the chamber than the outer coil 65. The outer coil 65 is located at or close to the plane of the top of the electrode 125, while the inner coil 60 is located well above the electrode 125. As in the case of FIG. 1, the D.C. currents in the coils 60, 65 are controlled by the plasma steering controller 90 governing the current supplies 70, 75 of the coils 60, 65.

Figure 7:
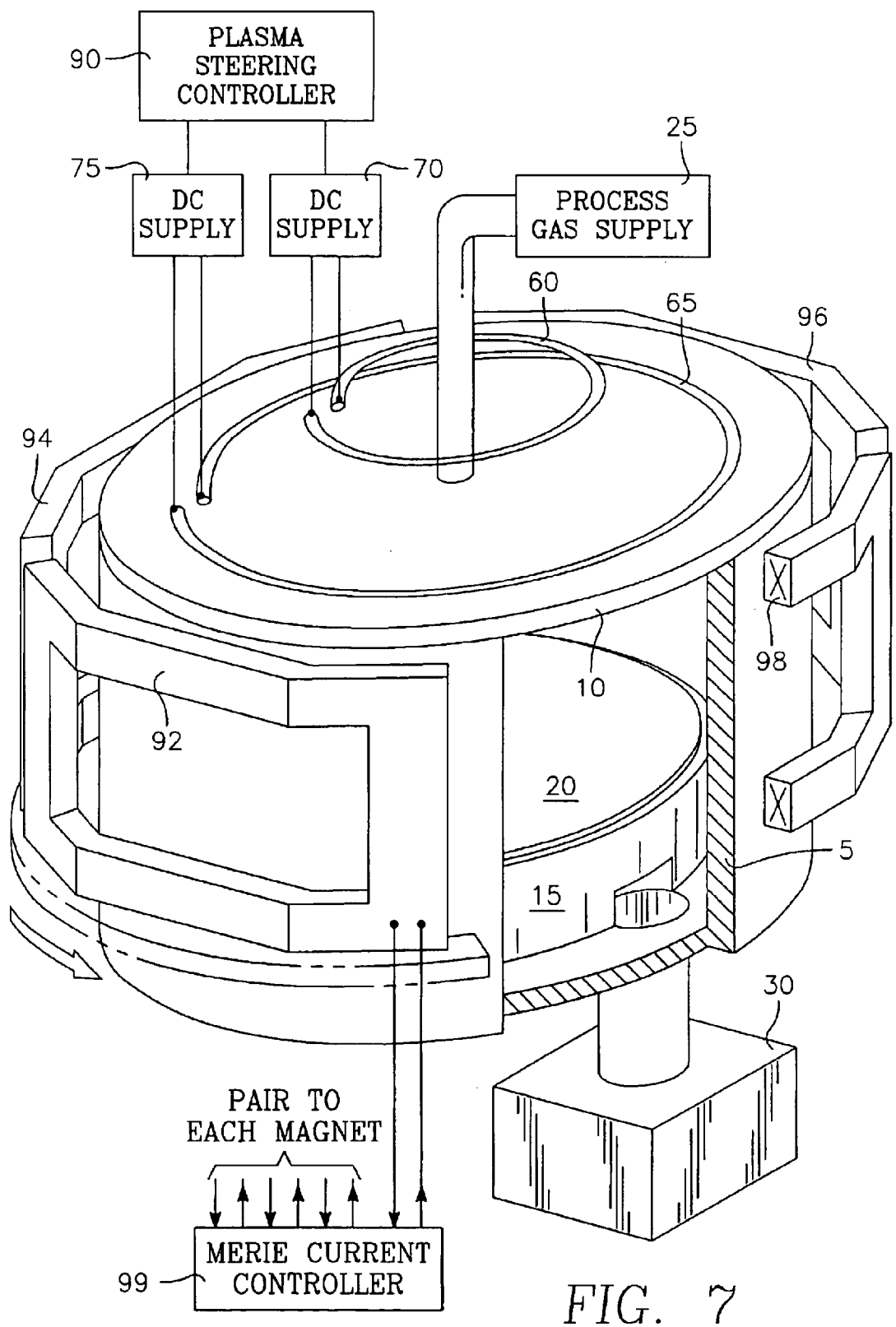
FIGS. 7 and 8 illustrate the reactor of FIG. 1A with MERIE magnets.
Figure 8:
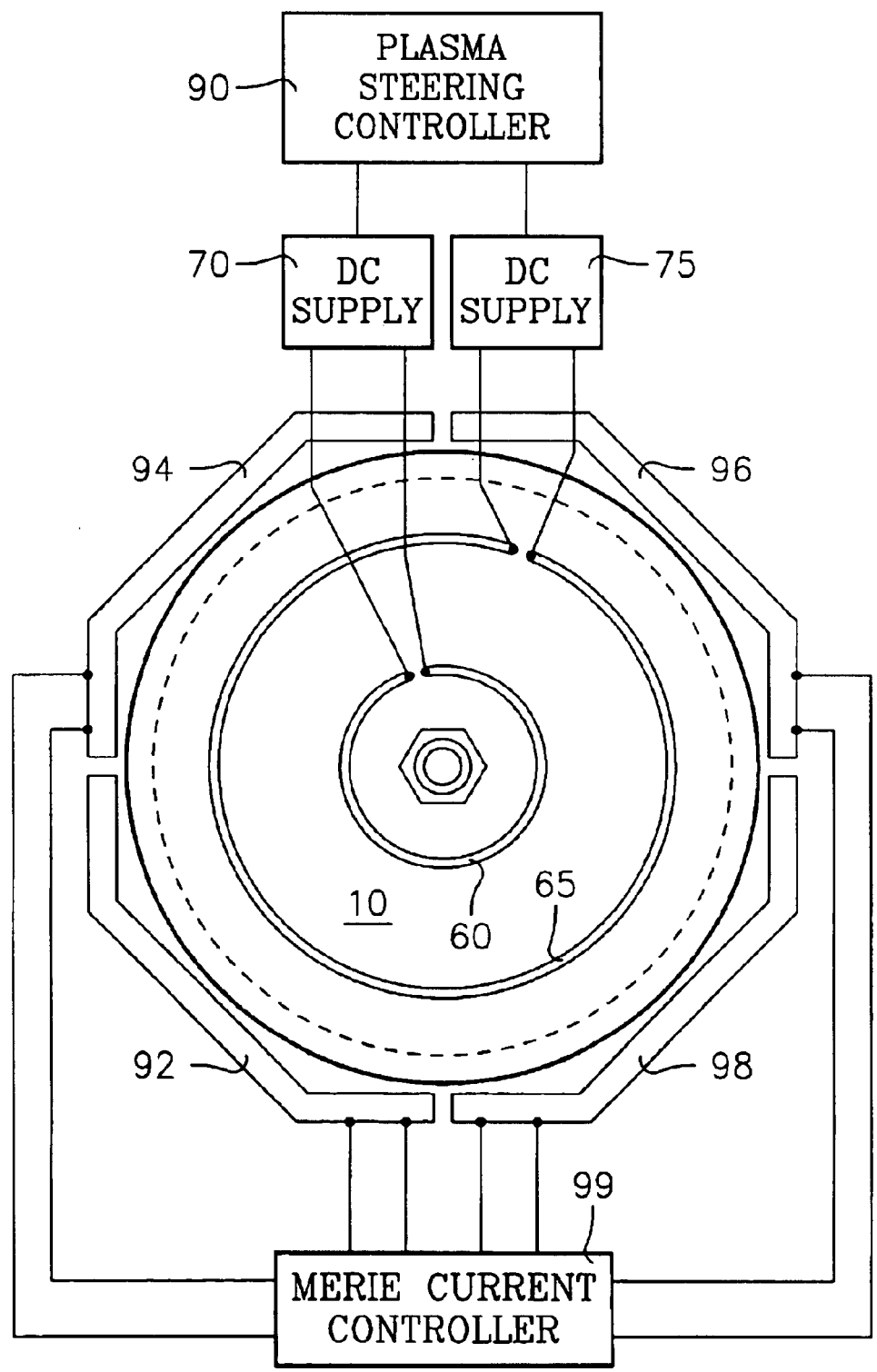

The improvement in plasma density distribution uniformity is achieved by the introduction of a set of MERIE electromagnets 902 spaced equally about the periphery of the wafer support pedestal and outside of the reactor chamber (like those shown in FIGS. 7 and 8). These MERIE magnets are adapted to produce a magnetic field that slowly rotates about the axis of symmetry of the cylindrical chamber generally across the surface of the wafer support pedestal. In one case this feature is realized by the MERIE magnets 902 having electromagnet windings wound about respective axes tangent to the circumference of the wafer support pedestal. In this case, an MERIE current controller 904 controls the individual current to each MERIE magnet. A circulating magnetic field is generated in the plane of the workpiece support by the controller 904 providing individual AC currents to each of the individual magnet windings of the same frequency but offset in phase by 90 degrees (or by 360 degrees divided by the number of MERIE magnets). In an alternative case, the feature of a rotating magnetic field is realized by a support frame 1020 (dashed line) supporting all of the MERIE magnets that is rotated about the axis of symmetry by a rotor 1025 (dashed line). In this alternative case, the MERIE magnets are permanent magnets.

A second array of MERIE magnets 906 (shown in dashed line) equally spaced about the workpiece or wafer support pedestal but in a higher plane than the first set of MERIE magnets 902 may be provided as well. Both sets of magnets lie in respective planes that are near the plane of the workpiece support.

The controller 910 applies a low frequency (0.5–10 Hz) AC current to each of the electromagnets 902, 906, the phases of the currents applied to neighboring magnets being offset as described above by 90 degrees. The result is a magnetic field that rotates about the axis of symmetry of the workpiece support at the low frequency of the AC current. The magnetic field causes the plasma to be drawn toward the magnetic field near the workpiece surface and to circulate with the field. This stirs the plasma so that its density distribution becomes more uniform. As a result, reactor performance is significantly improved because more uniform etch results are obtained across the entire surface of the wafer.

Combination Overhead Electrode and Gas Distribution Plate

It is desirable to feed the process gas from the overhead ceiling to improve uniformity of gas distribution within the chamber. For this purpose, the overhead electrode 125 in the cases of FIGS. 24 and 25 can be a gas distribution showerhead, and therefore has a large number of gas injection ports or small holes 300 in its bottom surface facing the workpiece support 105. In an exemplary case, the holes 300 were between 0.01 and 0.03 inch in diameter and their centers were uniformly spaced apart by about ⅜ inch.

Figure 26:
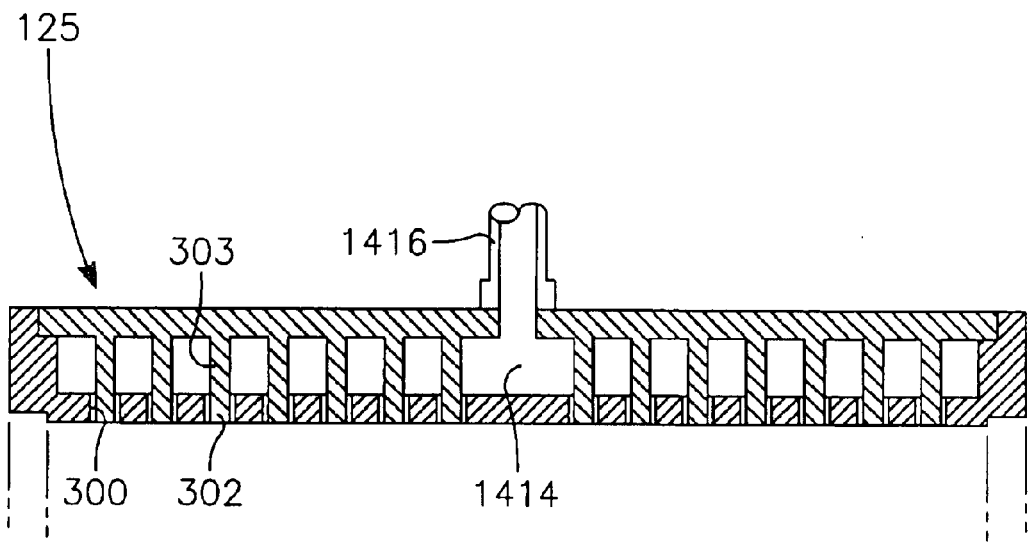
FIGS. 26, 27, 28, 29A and 29B illustrate a gas distribution plate for the reactors of FIGS. 1A, 24 and 25.
Figure 27:
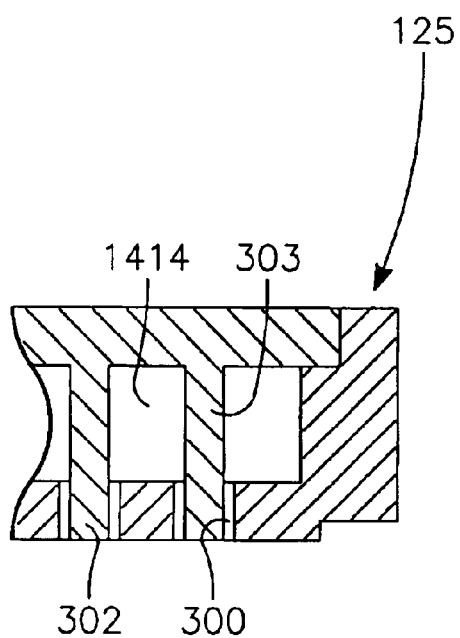
Figure 28:
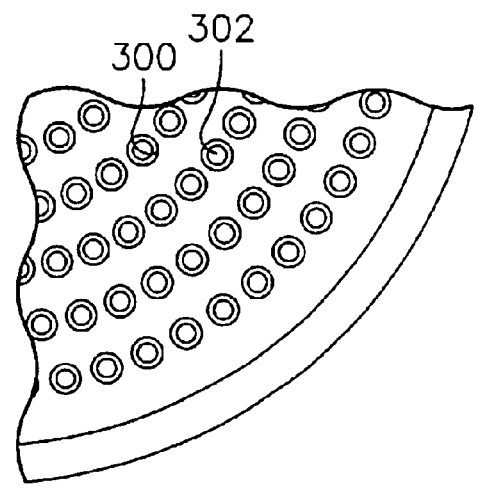

The overhead electrode/gas distribution plate 125 (hereinafter referred to as the gas distribution plate 125) has improved resistance to arcing. This is due to the introduction of an arc suppression feature that excludes process gas and/or plasma from the center of each opening or hole 300. This arc suppressing feature is a set of center pieces or disks 302 in the centers of the holes 300 supported at the ends of respective cylindrical fingers or thin rods 303 as shown in the cross-sectional view of FIG. 26 and the enlarged cross-sectional view of FIG. 27. Arcing within a typical gas distribution plate tends to occur near the center of the gas injection holes. Therefore, placing the center pieces 302 at the center of each hole 300 prevents process gas from reaching the center of each hole 300 and therefore reduces the occurrence of arcing. As shown in the plan view of FIG. 28, introduction of the center pieces 302 in the holes 300 transforms the otherwise circular openings or holes 300 into annular openings.

Figure 29A:
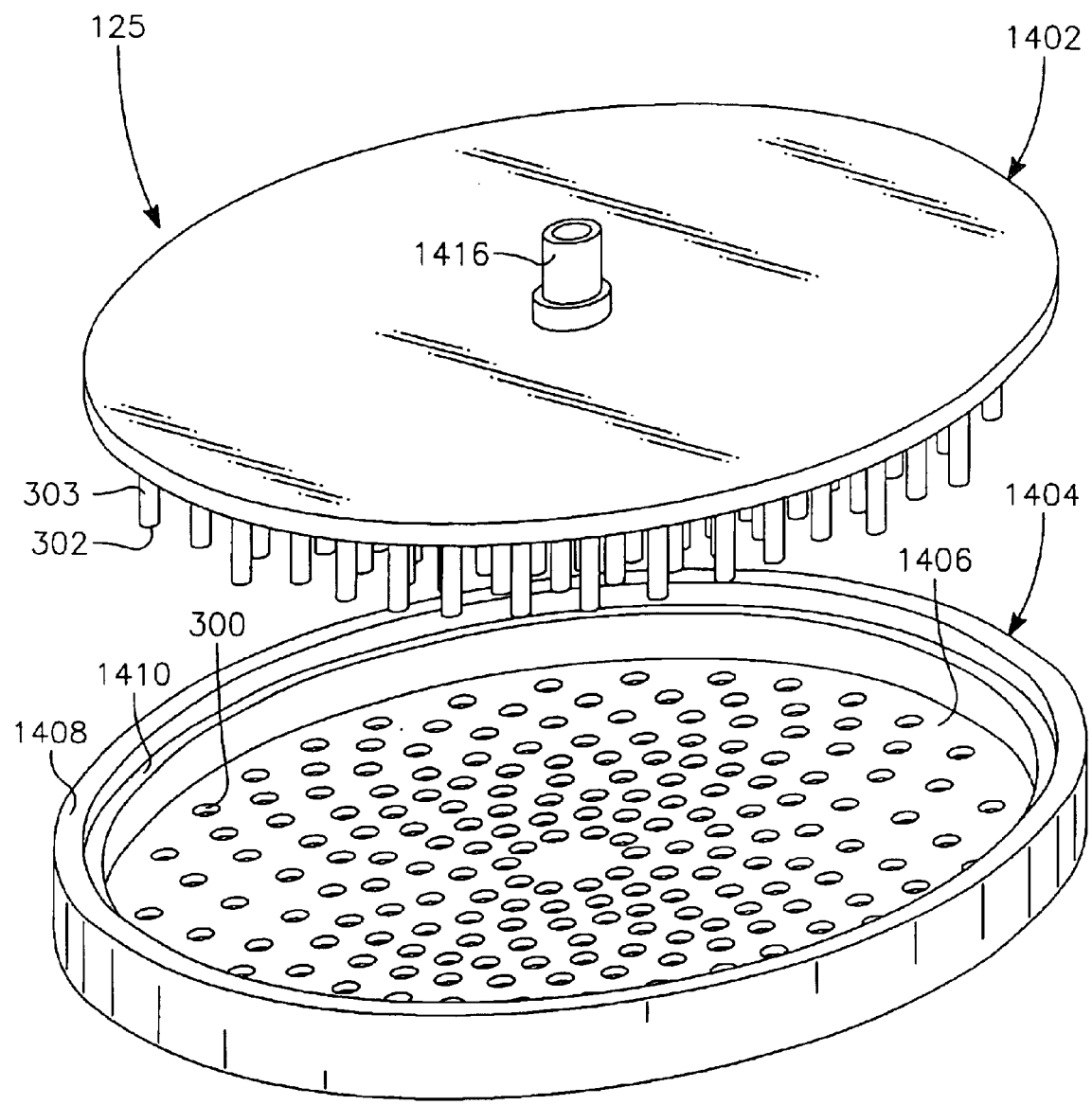

Referring to FIG. 29A, the gas distribution plate 125 with improved arc suppression constitutes a cover 1402 and a base 1404. The base 1404 is a discoid plate 1406 with the gas injection openings formed therethrough surrounded by an annular wall 1408 having an interior shoulder 1410. The cover 1402 is also a discoid plate. The disks 302 are the end sections of the cylindrical fingers 303 attached to and extending downwardly from the bottom surface of the cover 1402. The outer edge of the cover 1402 rests on the shoulder 1410 of the base 1404 to form a gas manifold 1414 (FIG. 26) between the cover 1402 and the base 1404. Process gas flows into the manifold 1414 from a gas inlet 1416 in the center of the cover 1402.

Figure 29B:
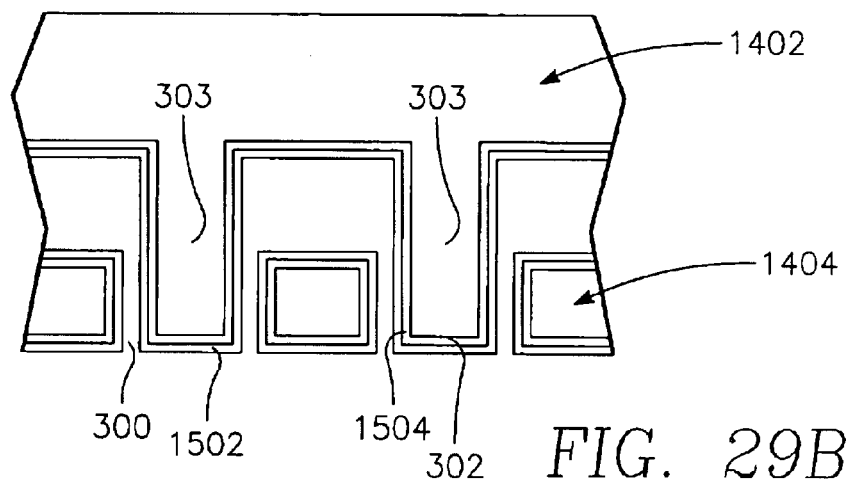
Figure 30:
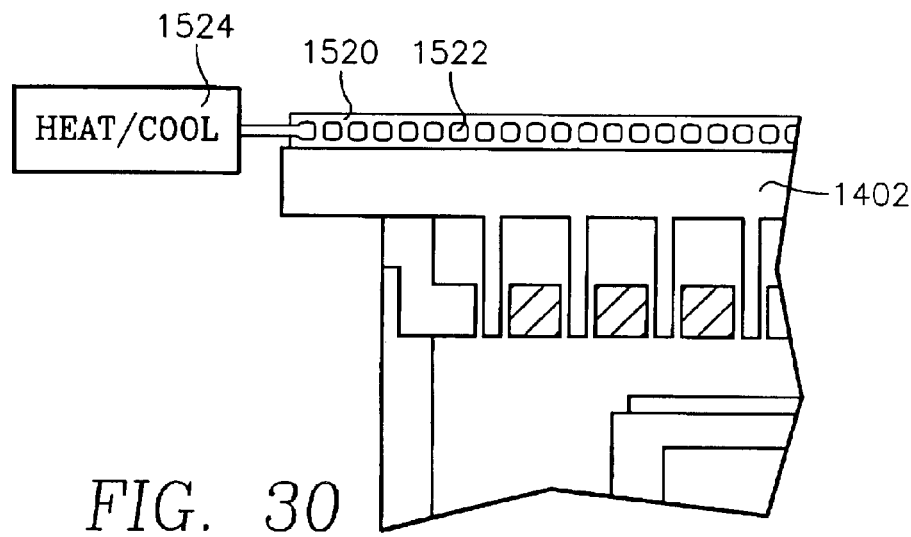
FIGS. 30 and 31 illustrate thermal control features in gas distribution plate like that of FIG. 26.
Figure 31:
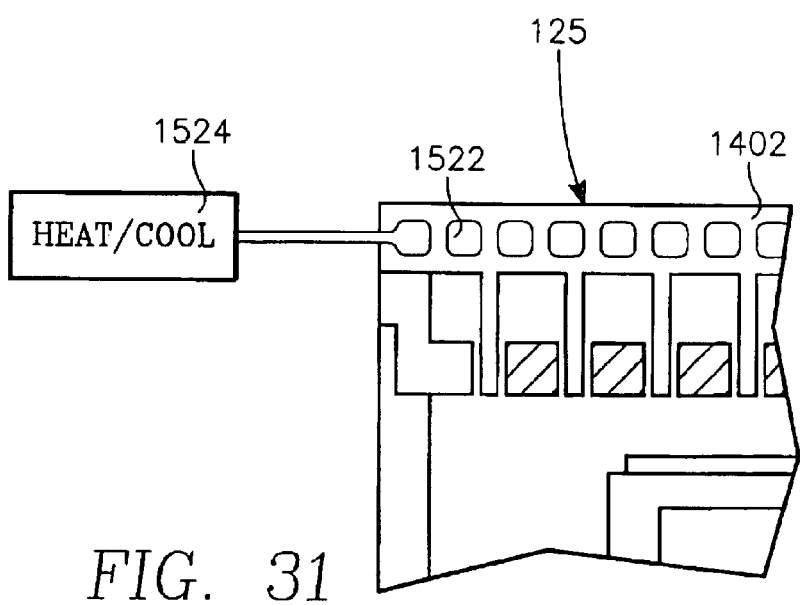

The portions of the gas distribution plate 125 that contact process gas or plasma in the chamber can be formed of a metal such as aluminum coated with a semiconductor processing compatible material such as silicon carbide. In this example, all surfaces of the gas distribution plate, with the exception of the top surface of the cover 1402, are covered with a silicon carbide coating 1502 as indicated in the enlarged partial cross-sectional view of FIG. 29B. As shown in FIG. 30, the aluminum top surface of the cover 1402 is in contact with a temperature-controlled member 1520 that may be water-cooled by water jackets 1522 with coolant circulated by a heat exchanger 1524, so that the thermally conductive aluminum material of the gas distribution plate 125 has a controlled temperature. Alternatively, as shown in FIG. 31, the water jackets may be within the gas distribution plate 125.

However, in order for the silicon carbide coating 1502 to have the same controlled temperature, there must be a thermally conductive bond between the silicon carbide coating and the aluminum. Otherwise, the temperature of the silicon carbide coating could fluctuate uncontrollably. In order to achieve good thermal conductivity between the aluminum material of the gas distribution plate 125 and the silicon carbide coating, a polymer bonding layer 1504 is formed between the aluminum gas distribution plate and the silicon carbide coating 1502, as shown in FIG. 29A. FIG. 29A shows that the polymer bonding layer 1504 is between the silicon carbide coating 1502 and the aluminum base 1404. The polymer bonding layer provides good thermal conductivity between the aluminum and the silicon carbide coating 1502, so that the temperature of the coating 1502 is controlled by the heat exchanger 1524.

Figure 32:
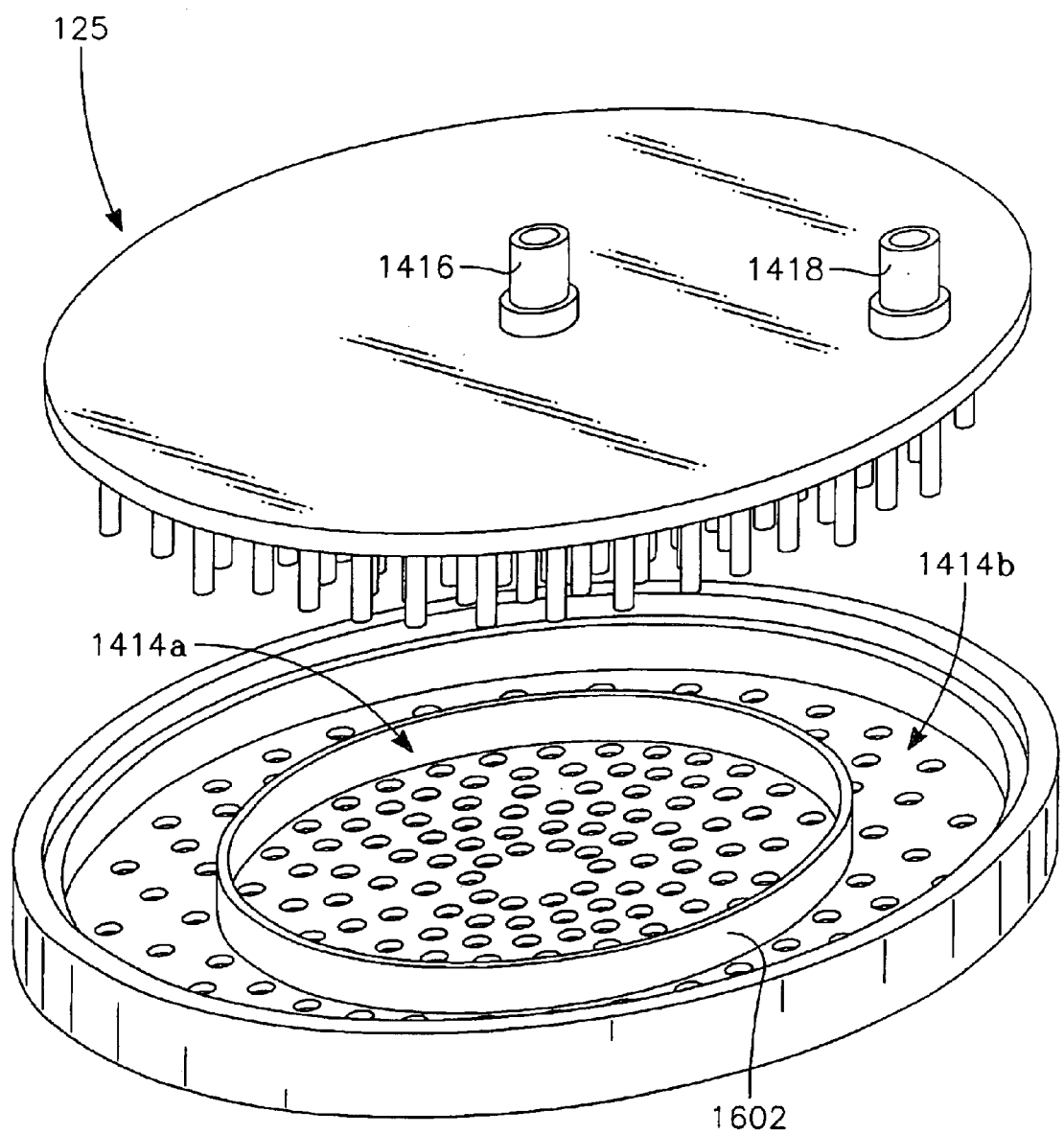
FIGS. 32 and 33 illustrate a gas distribution plate corresponding to FIG. 26 having dual zone gas flow control.
Figure 33:
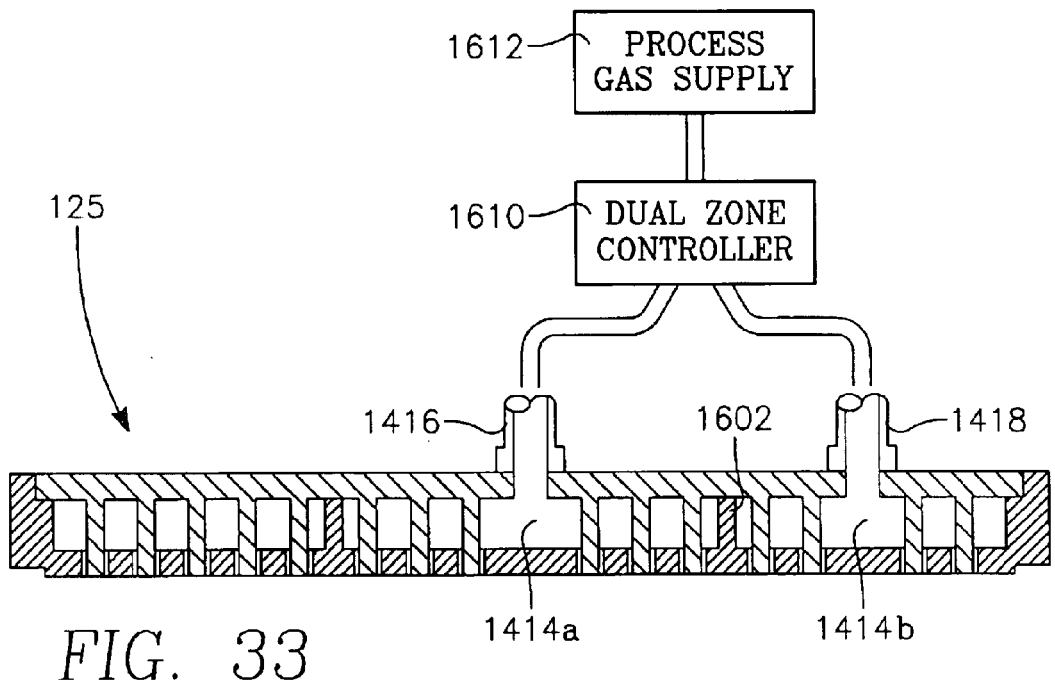
Figure 35:
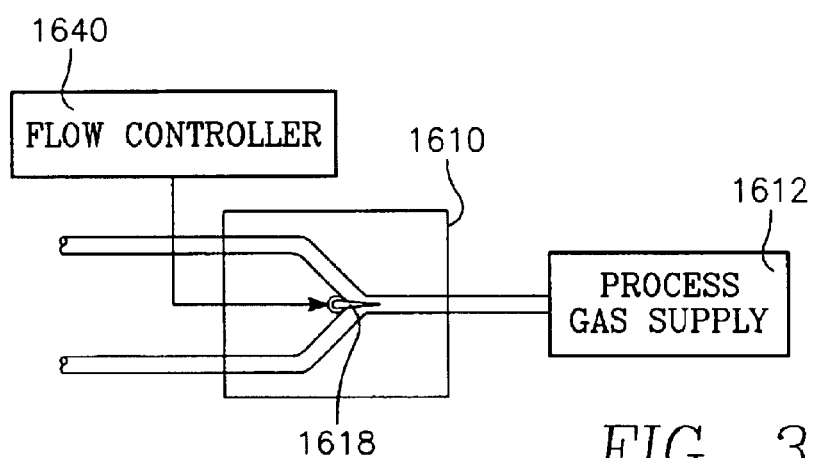
FIGS. 35 and 36 illustrate exemplary dual zone gas flow controllers.
Figure 36:
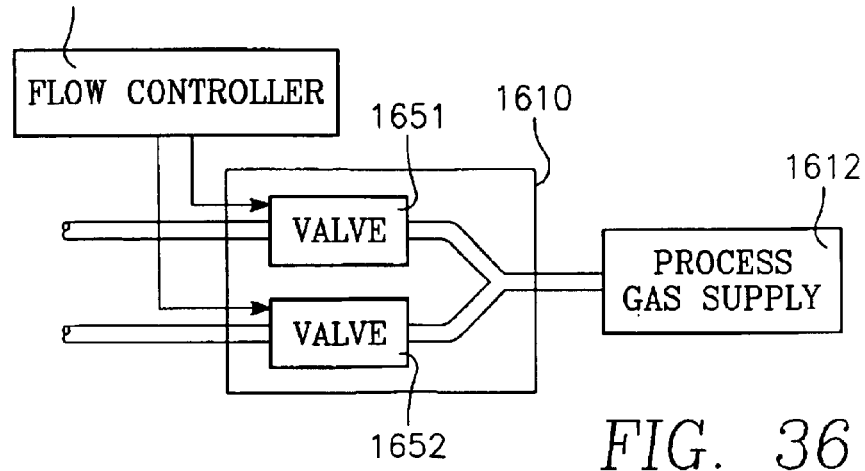
Figure 34:
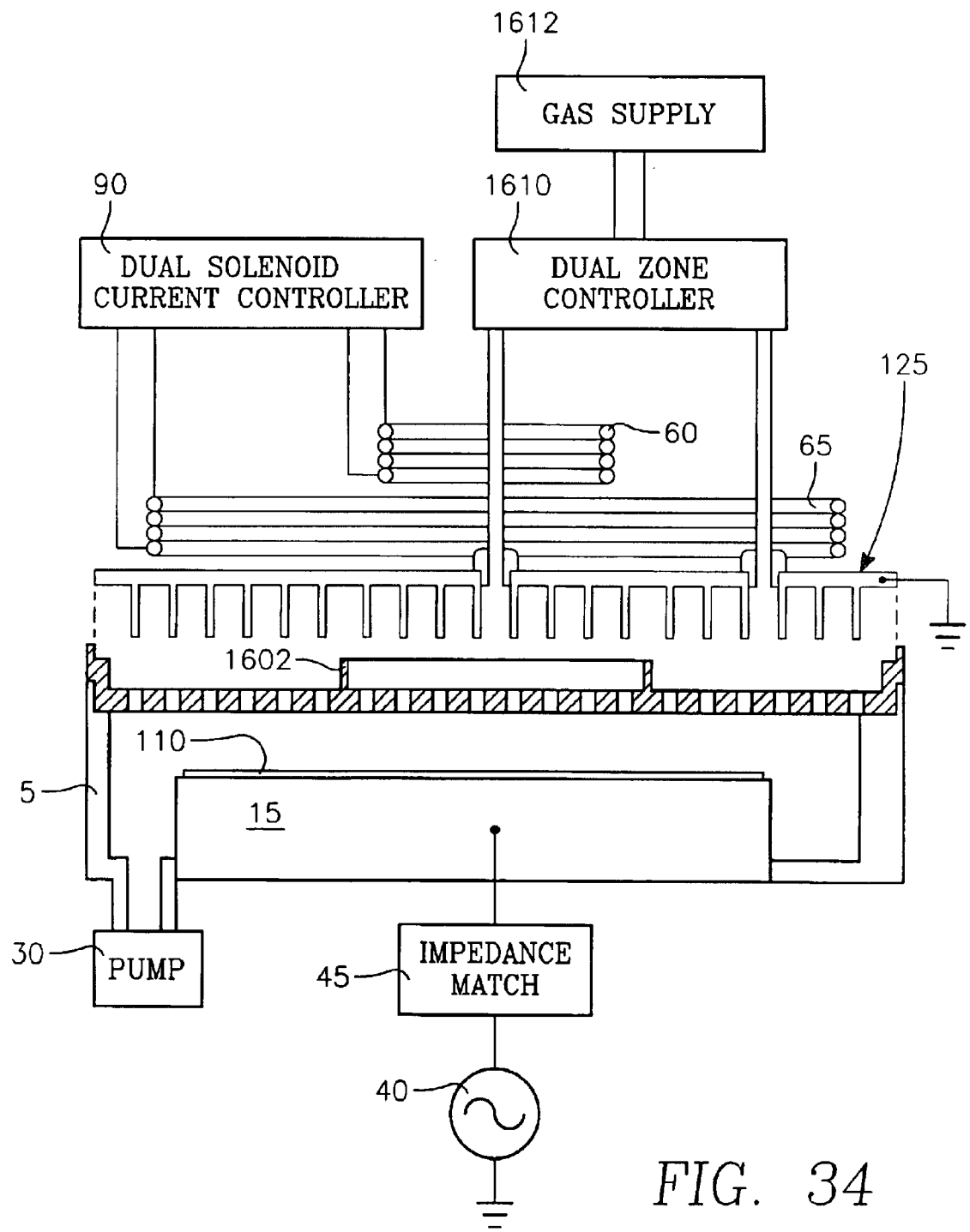
FIG. 34 illustrates a plasma reactor corresponding to FIG. 1A having the dual zone gas distribution plate.

FIGS. 32, 33 and 34 illustrate how the gas distribution plate 125 of FIG. 29A can be modified to provide dual zone gas flow control. Such a feature can be employed to help correct an etch rate or deposition rate spatial distribution that is either center high or center low by selecting a process gas distribution that is complementary. Specifically, an annular partition or wall 1602 divides the gas manifold 1414 into a center manifold 1414a and an outer manifold 1414b. In addition to the center gas feed 1416 that feeds the center manifold 1414a, another gas feed 1418 between the center and periphery of the gas distribution plate 125 feeds the outer manifold 1414b. A dual zone controller 1610 apportions gas flow from a process gas supply 1612 between the inner and outer gas feeds 1416, 1418. FIG. 35 illustrates one implementation of the valve 1610 in which an articulating vane 1618 controls the relative amount of gas flow to the inner and outer manifolds 1414a, 1414b of the gas distribution plate. An intelligent flow controller 1640 governs the position of the vane 1618. In another implementation illustrated in FIG. 36, a pair of valves 1651, 1652 perform individual gas flow control for respective radial zones of the chamber.

Figure 37:
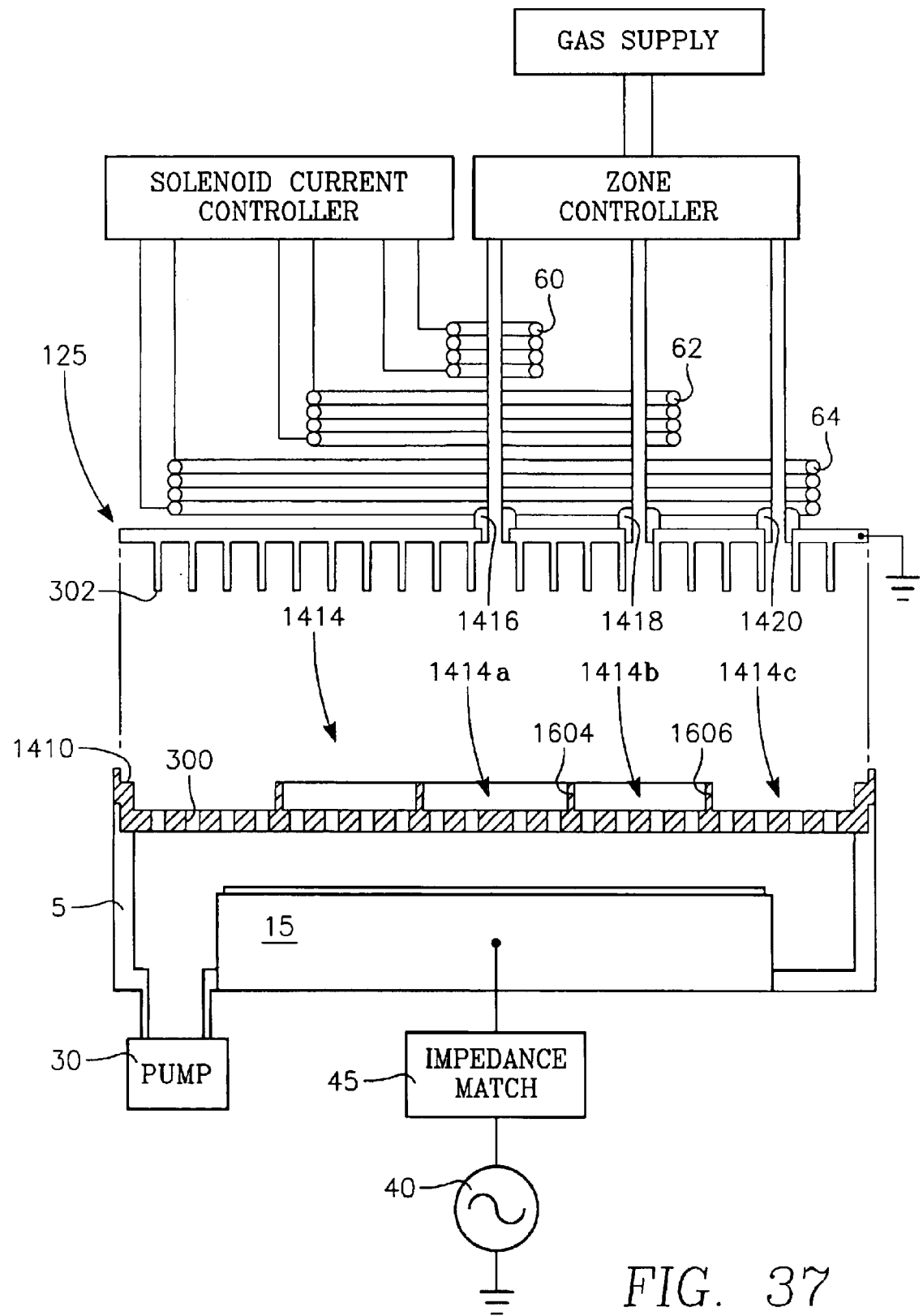
FIG. 37 illustrates a plasma reactor corresponding to FIG. 34 having three overhead coils for controlling plasma ion distribution.

FIG. 37 illustrates an case in which the gas distribution plate 125 has three gas flow zones, the manifold 1414 being separated by inner and outer annular partitions 1604, 1606 into three manifolds 1414a, 1414b and 1414c. Three respective gas feeds 1416, 1418, 1420 provide gas flow to the respective manifolds 1414a, b, c.

While various cases have been described above in this specification as having a pair of overhead coils 60, 65, FIG. 37 shows that there can be more than two overhead coils. In fact, the case of FIG. 37 is illustrated as having three concentric overhead coils or coils 60, 64 and 65. By increasing the number of independently controlled overhead coils, it is felt the resolution with which processing non-uniformities are corrected is increased.

Figure 38:
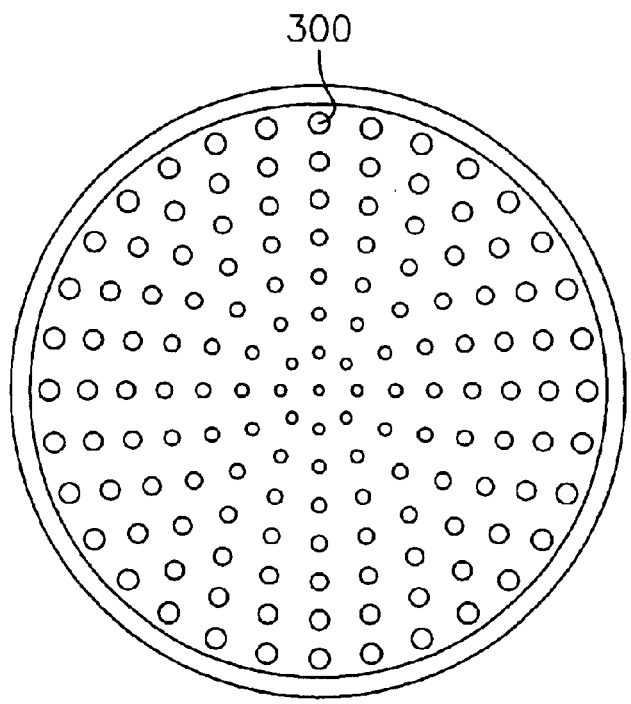
FIGS. 38 and 39 depict different gas injection hole patterns in the gas distribution plate of FIG. 26 for producing center low or center high gas flow distributions, respectively.
Figure 39:
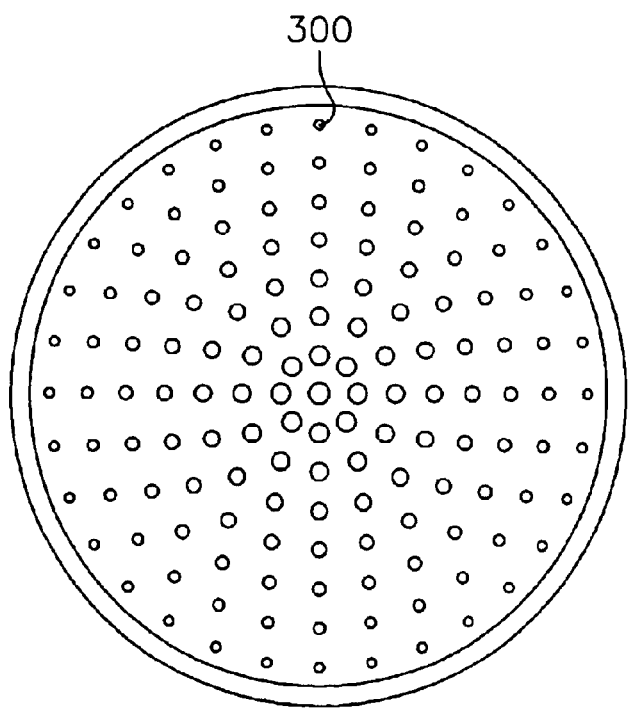

The multiple zone gas distribution plates of FIGS. 34 and 37 enjoy the advantage of flexible control over gas apportionment between inner and outer processing zones of the workpiece. However, another way of customizing gas flow is to do so permanently by providing different gas injection hole sizes at different radii of the gas distribution plate 125. For example, if the reactor tends to exhibit a spatial etch rate distribution that is center high, then less gas would be supplied near the center and more at the periphery of the chamber by using smaller gas injection holes 300 at the center and larger ones near the periphery. Such a gas distribution plate is illustrated in plan view in FIG. 38. For a center low etch distribution, the opposite hole arrangement would be employed as illustrated in FIG. 39.

Figure 9:
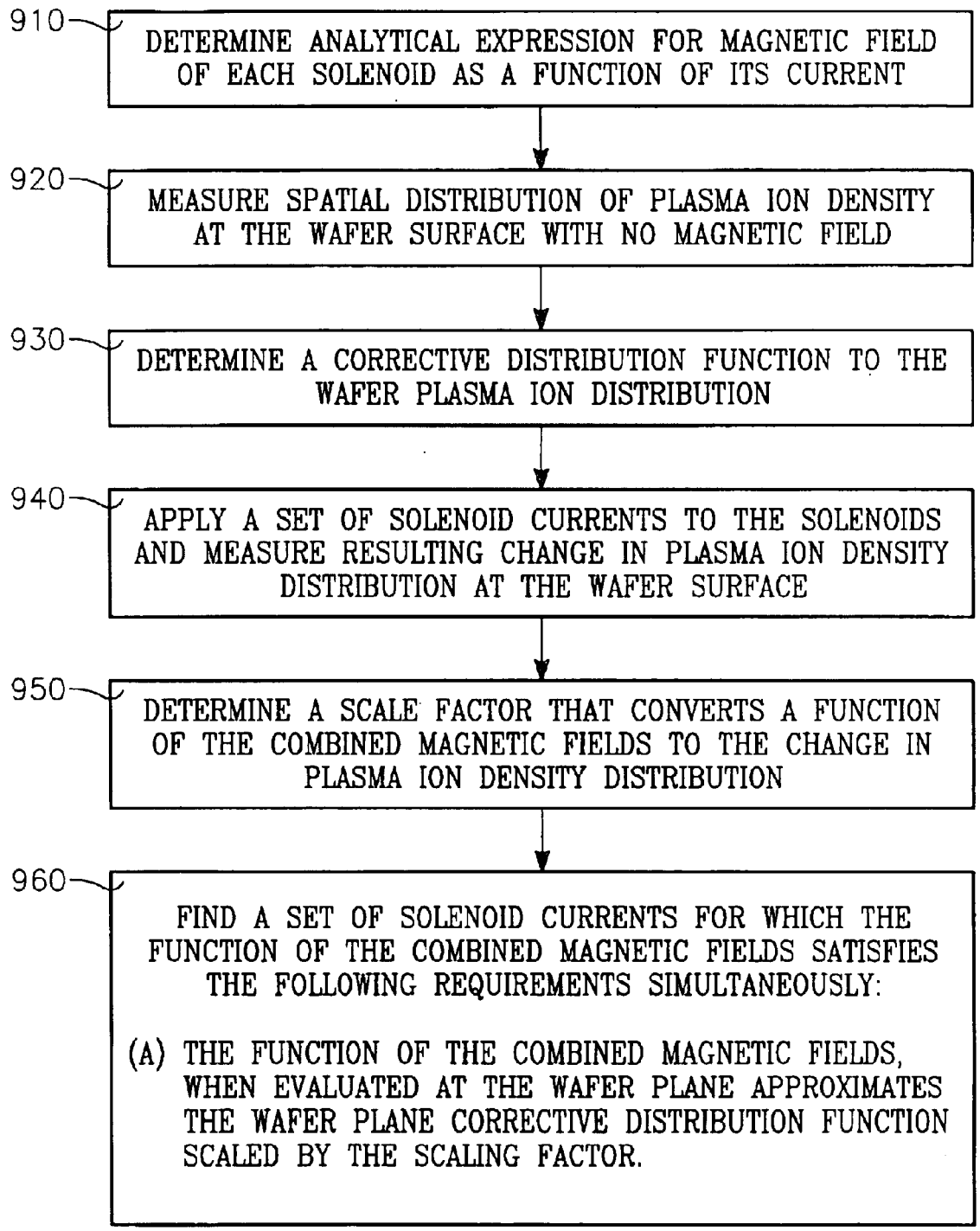
FIG. 9 depicts a method of operating the reactor of FIG. 1A.

Plasma Steering in the Reactor of FIG. 9:

Plasma steering as described above with reference to FIGS. 11–14 was performed in the case of FIG. 9. A magnetic field pointing to the side wall was produced by applying a current of −13 amperes to the inner coil 60 and a current of +1.4 amperes to the outer coil 65. A magnetic field pointing toward the periphery of the ceiling or electrode 125 was produced by applying a current of −13 amperes to the inner coil 60 and a current of +5.2 amperes to the outer coil 65. A dense magnetic field at the side wall was produced by applying a current of −13 amperes to the inner coil 60 and a current of +9.2 amperes to the outer coil 65. We found that the etch rate of chamber surfaces during cleaning were improved by as much as 40% by applying a magnetic field pointing toward the periphery of the ceiling or electrode 125 in the manner described above.

Figure 40:
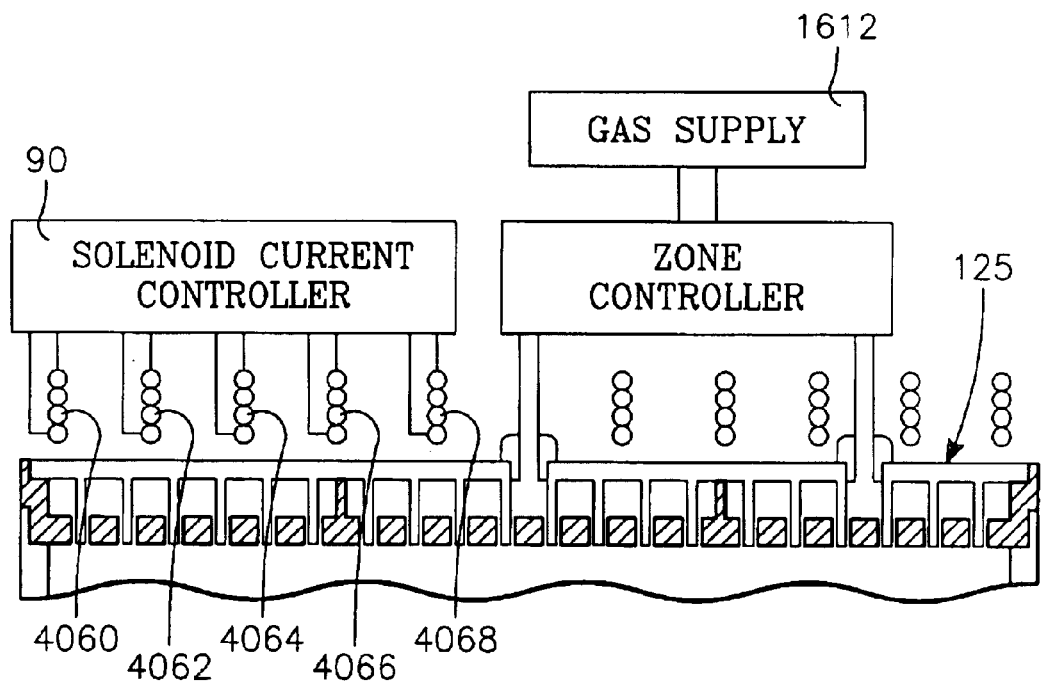
FIGS. 40, 41, 42 and 43 illustrate different arrangements of overhead coils for controlling plasma ion distribution.
Figure 41:
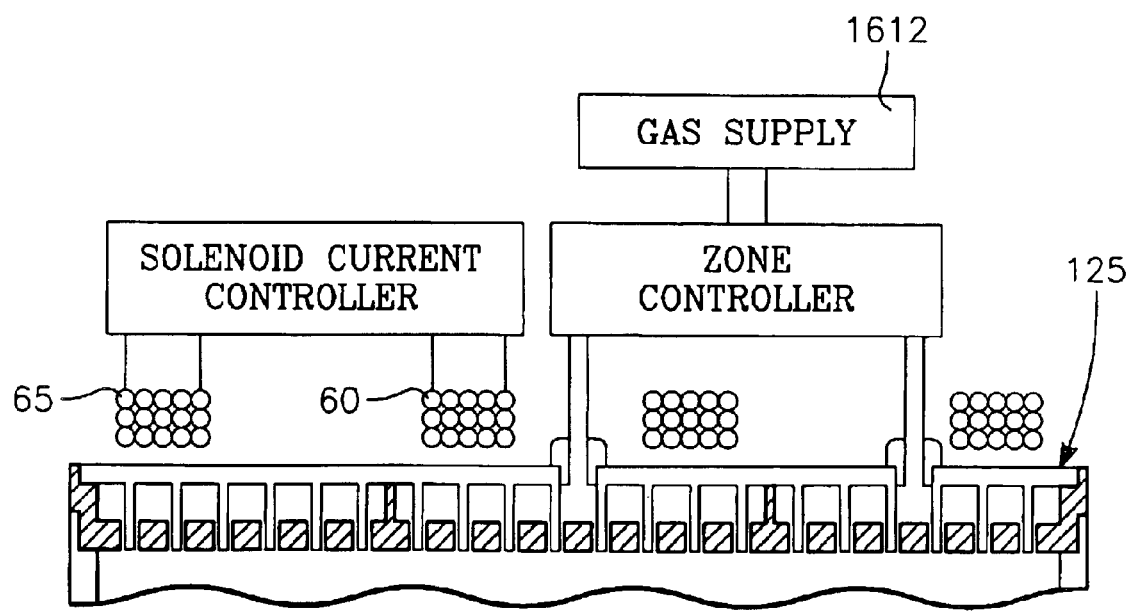
Figure 42:
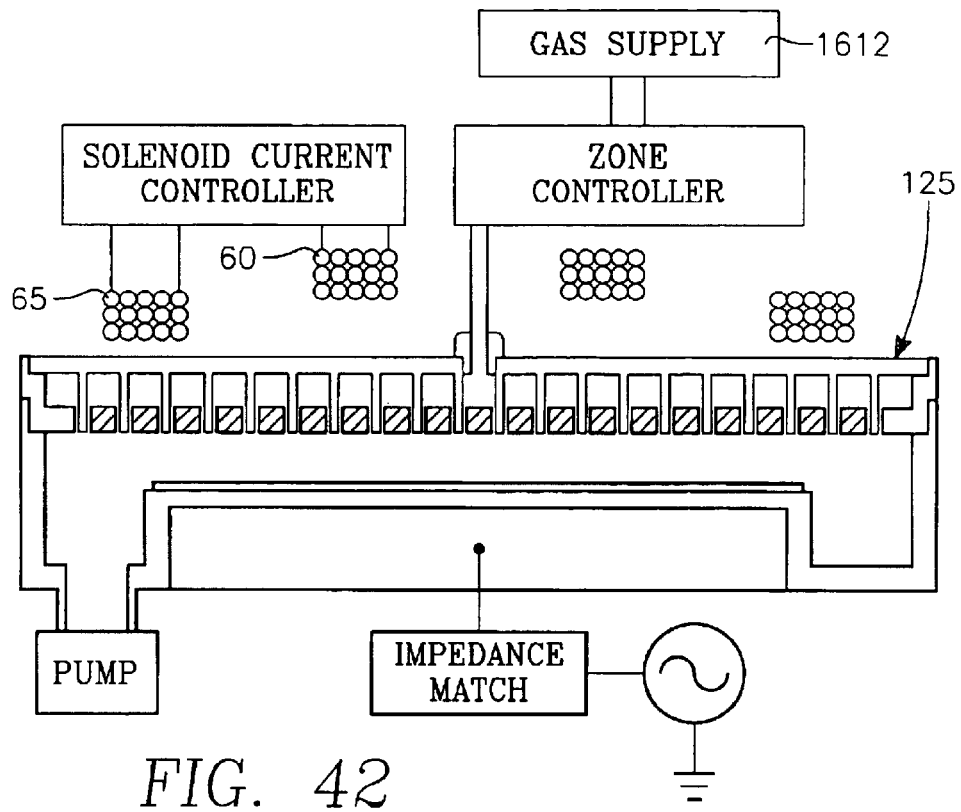
Figure 43:
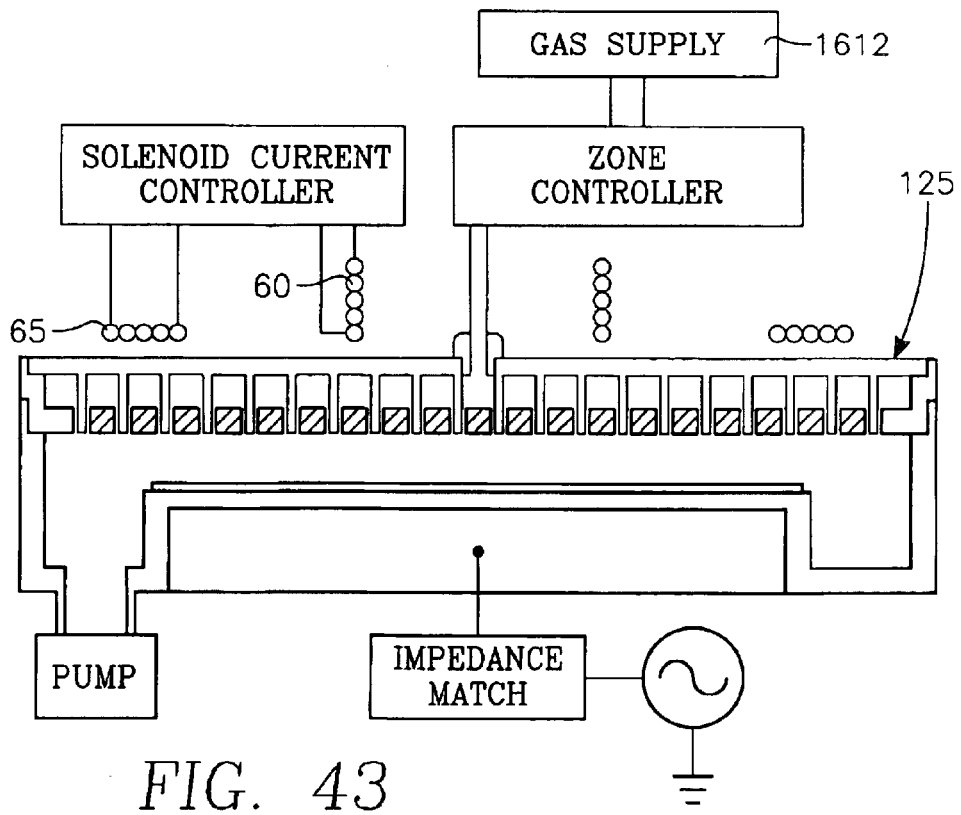

Coil Configurations:

While the foregoing cases have been described with reference to the inner and outer coils 60, 65, a greater number of coils may be employed. For example, the case of FIG. 40 has five overhead coils 4060, 4062, 4064, 4066, 4068, each with its own current separately controlled by the controller 90. The coils 4060, 4062, 4064, 4066, 4068 may be at the same height above the ceiling 125 (as in FIG. 40) or at different heights. FIG. 41 illustrates an case in which the overhead coils 60, 65 are at the same height. In FIG. 41, the windings in each coil 60, 65 are stacked in both vertical and radial directions. FIGS. 42 and 43 illustrate different cases in which the coils 60, 65 have windings extending in the vertical direction and in the radial direction.

Figures 44, 45:
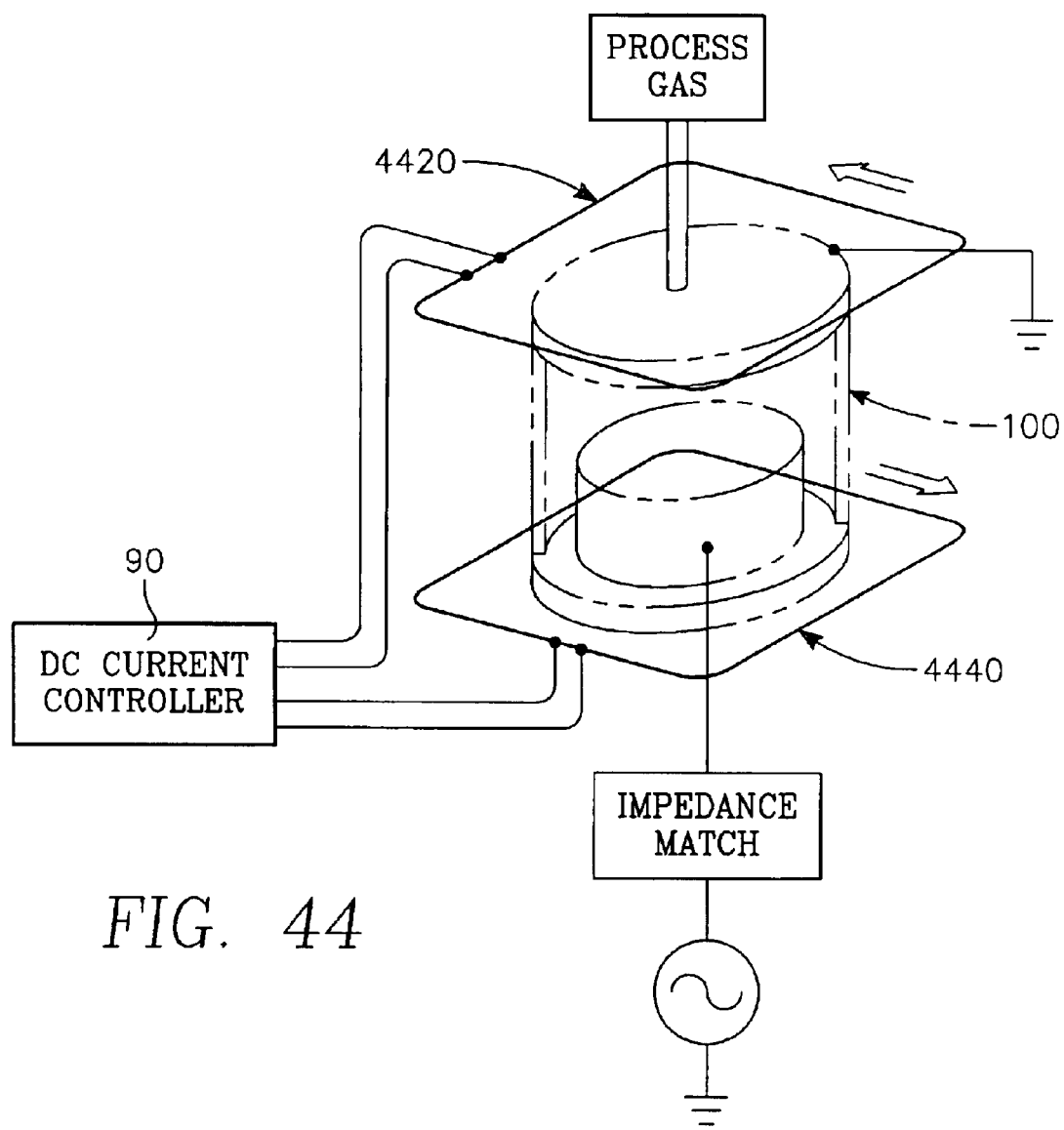
FIGS. 44 and 45 illustrate a plasma reactor corresponding to FIG. 1A in which the overhead coils are replaced by upper and lower magnetic coils above and below the reactor chamber to produce a cusp-shaped magnetic field best seen in FIG. 45.

As discussed previously in this specification with reference to FIG. 1A, magnetic pressure on the plasma for correcting non-uniform distribution is proportional to the radial component of the gradient of the square of the magnetic field. Thus, the most efficient approach is to employ a magnetic field having a large radial gradient, such as a cusp-shaped magnetic field. As further discussed above, the greater efficiency of the cusp-shaped magnetic field reduces the required strength of the magnetic field for a given amount of magnetic pressure, thereby reducing or eliminating device damage associated with high magnetic fields. FIG. 44 illustrates an case in which a fully cusp-shaped magnetic field is produced by a pair of coils 4420, 4440 located above and below the chamber, respectively. Current flow in the top and bottom coils 4420, 4440 is clockwise and counter-clockwise, respectively. FIG. 45 is a simplified illustration of the magnetic field line pattern of the fully cusp-shaped magnetic field produced by the pair of coils 4420, 4440.

Figure 46:
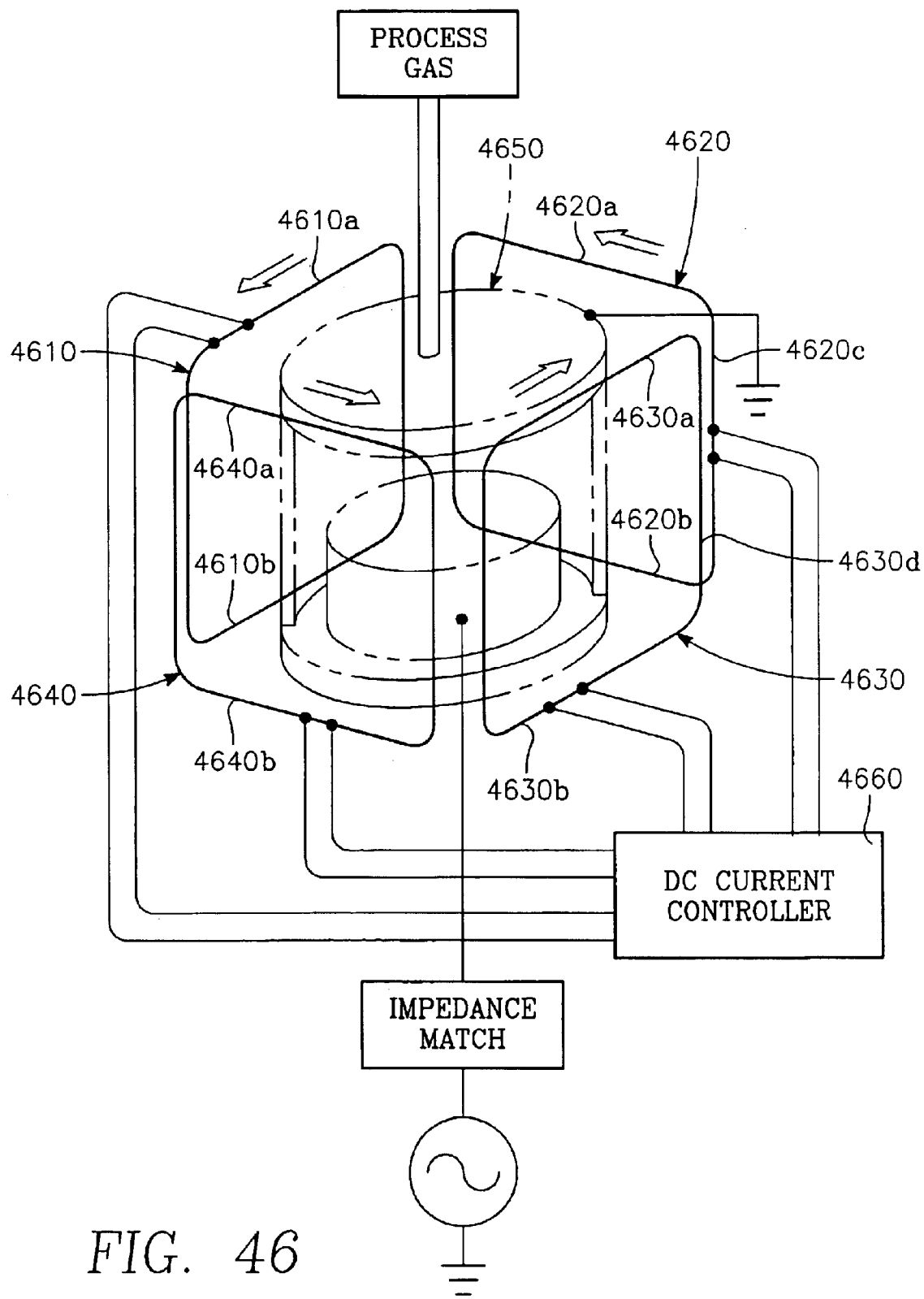
FIG. 46 illustrates how the upper and lower coils of FIGS. 44 can be replaced by configurable magnetic field (CMF) coils operated in such a manner as to produce the cusp-shaped magnetic field of FIG. 45.

FIG. 46 illustrates an case in which the four electromagnets 4610, 4620, 4630, 4640 of a conventional MERIE reactor 4650 are employed to generate the fully cusp-shaped magnetic field of FIG. 45. A current controller 4660 controlling the currents in each of the electromagnets 4610, 4620, 4630, 4640 is programmed to apply D.C. currents flowing in the same (e.g., clockwise) direction in all the electromagnets 4610, 4620, 4630, 4640, as indicated by the arrows in FIG. 46. In this way the D.C. currents in the top conductors 4610a, 4620a, 4630a, 4640a form a clockwise current loop, the D.C. currents in the bottom conductors 4610b, 4620b, 4630b, 4640b form a counter-clockwise current loop, while at each corner of the array the currents in the vertical conductors of adjacent electromagnets (e.g., the pair of vertical conductors 4620c and 4630d) cancel the magnetic fields of one another at the wafer surface. The net effect is to produce clockwise and counter-clockwise current loops at the top and bottom of the chamber, respectively, analogous to the case of FIG. 44, with the same resulting fully cusp-shaped magnetic field illustrated in FIG. 45. The reactor of FIG. 46 is operated in any one of three modes:

(1) magnetic pressure mode, in which the cusp-shaped field is produced;
(2) sine wave mode, in which four sine wave currents are applied in quadrature to the four electromagnets 4610, 4620, 4630, 4640 to produce a slowly rotating magnetic field over the wafer surface;
(3) configurable magnetic field (CMF) mode, in which the four electromagnets 4610, 4620, 4630, 4640 are grouped into to opposing sets of adjacent pairs, one pair having one D.C. current and the opposite pair having the opposite D.C. current, to produce generally straight magnetic field lines extending across the wafer surface in a diagonal direction relative to the orientation of the four electromagnets 4610, 4620, 4630, 4640. This grouping is rotated by switching the currents so that the magnetic field rotates through four diagonal orientations. A time sequence of these orientations are illustrated in FIGS. 47A, 47B, 47C and 47D.

In FIG. 47A, the electromagnets 4610, 4620 have a positive D.C. current flow while the electromagnets 4630, 4640 have negative D.C. current flow, and the resulting average magnetic field direction is generally from the upper left corner to the lower right corner of the drawing. In FIG. 47B, the groupings have been switched so that the electromagnets 4620, 4630 have the positive current flow while the electromagnets 4640, 4610 have the negative current flow, and the average magnetic field has rotated clockwise by 90 degrees. FIGS. 47C and 47D complete the cycle. The strength of the magnetic field lines is determined by the magnitude difference in the positive and negative D.C. currents thus applied, and may be adjusted by programming the controller 4650 as desired.

The method of FIG. 9 may be employed in the CMF mode to accurately select the D.C. currents of the four electromagnets 4610, 4620, 4630, 4640 to produce the best correction for non-uniform etch rate or plasma ion density distribution. In applying the method of FIG. 9 to the CMF mode of FIGS. 47A–D, the coils of each of the electromagnets or coils 4610, 4620, 4630, 4640 are substituted for the overhead coils 60, 65, and all steps of FIG. 9 are performed in accordance with that substitution. The only difference is that the calculation of the magnetic field from each coil is computed as an average over the four time periods corresponding to FIGS. 47A–D.

Figure 48:
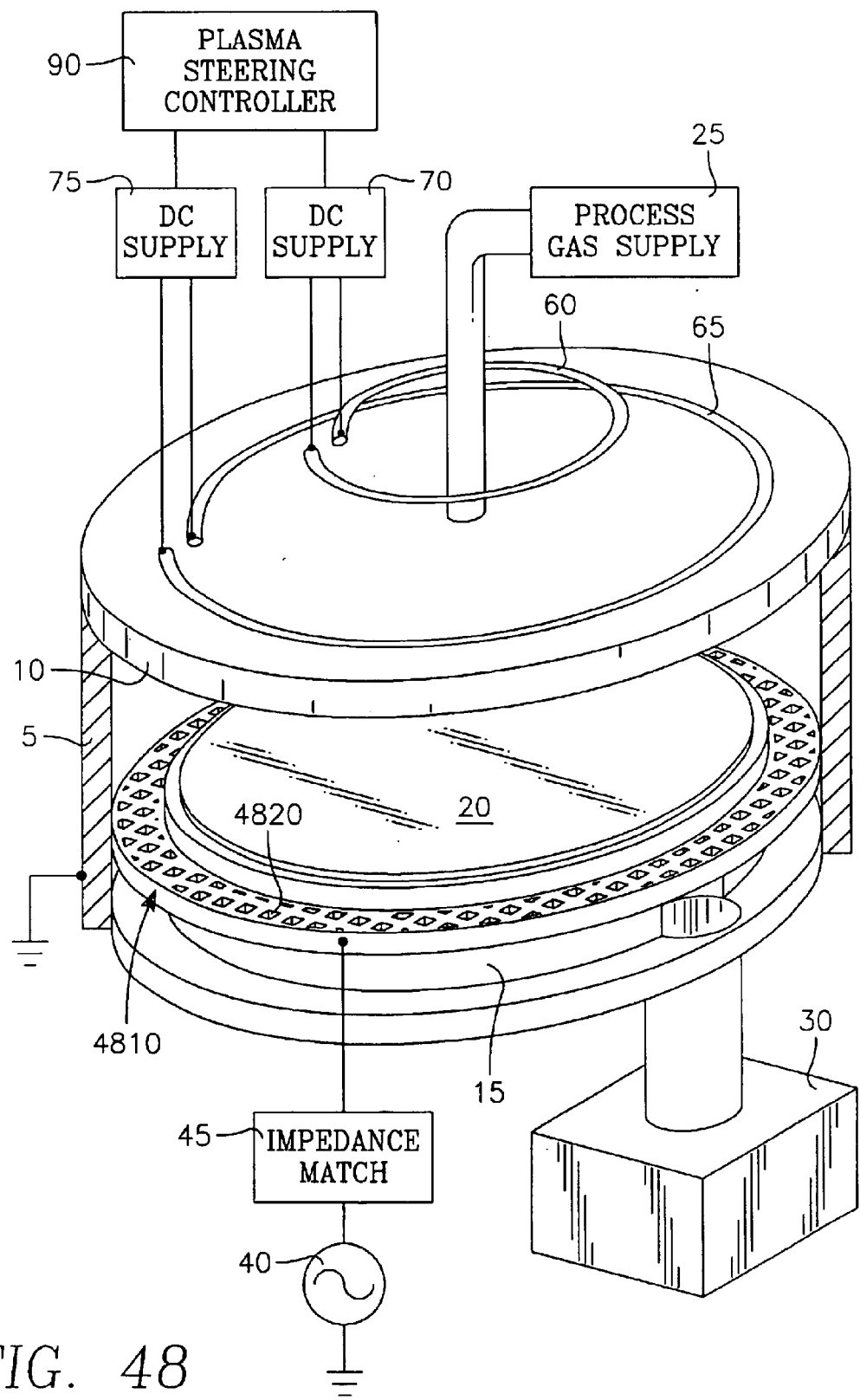
FIGS. 48, 49 and 50 illustrate an annular apertured plate in the reactor of FIG. 1A for preventing plasma ions from entering the reactor's pumping annulus.

FIG. 48 illustrates a reactor including a special grating 4810 inserted over the pumping annulus. The grating 4810 is formed of a semiconductive material such as silicon carbide or of a conductive material such as aluminum and has openings 4820 for permitting gas to be evacuated from the chamber through the pumping annulus. The special grating 4810 excludes plasma from the pumping annulus, providing needed protection and process control. For this purpose, the distance across the interior of each opening 4820 in the radial plane is no greater than twice the plasma sheath thickness. In this way it very difficult if not impossible for a plasma to penetrate through the grating 4810. This reduces or eliminates plasma interaction with chamber surfaces within the pumping annulus.

Figure 49:
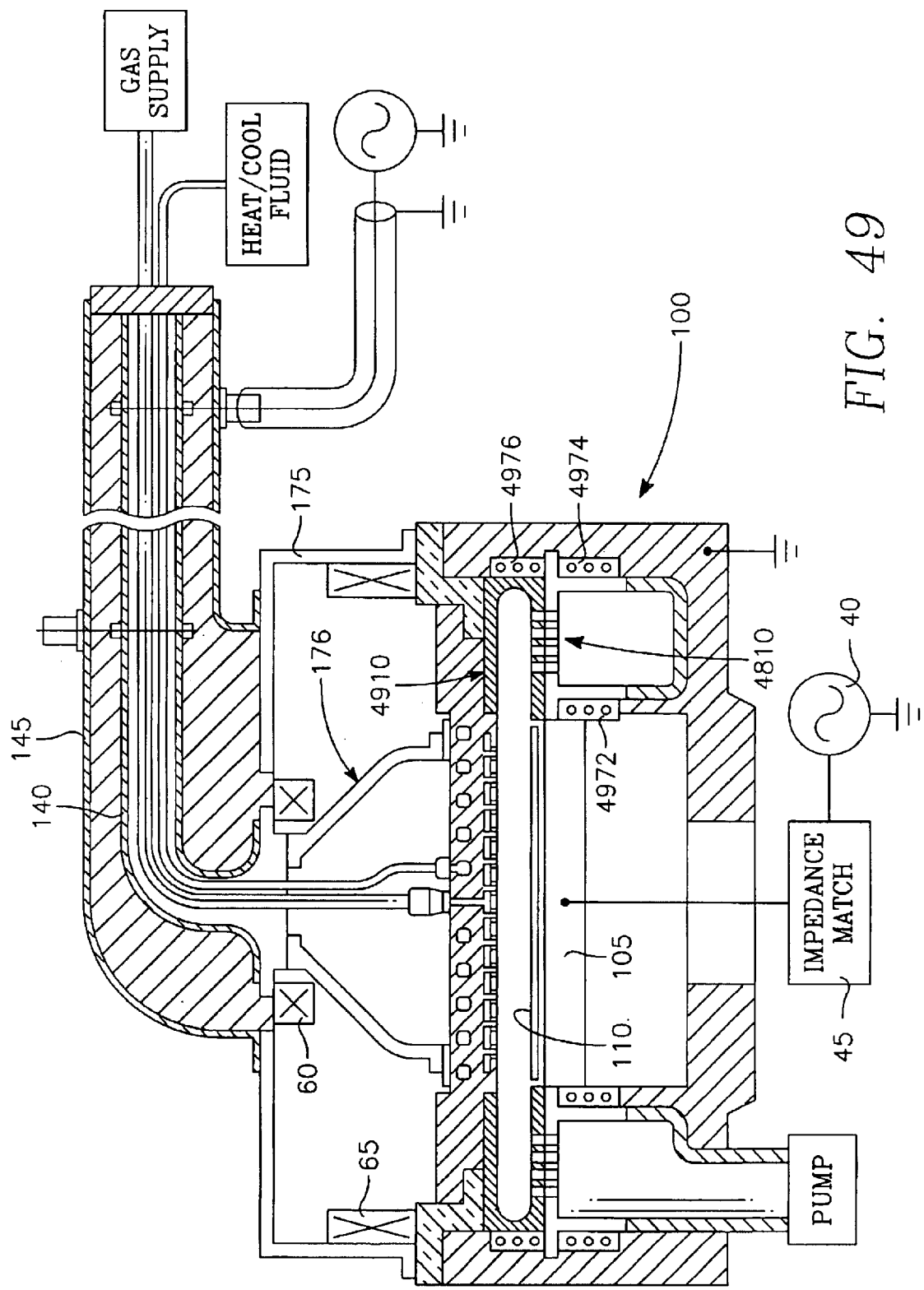
Figure 50:
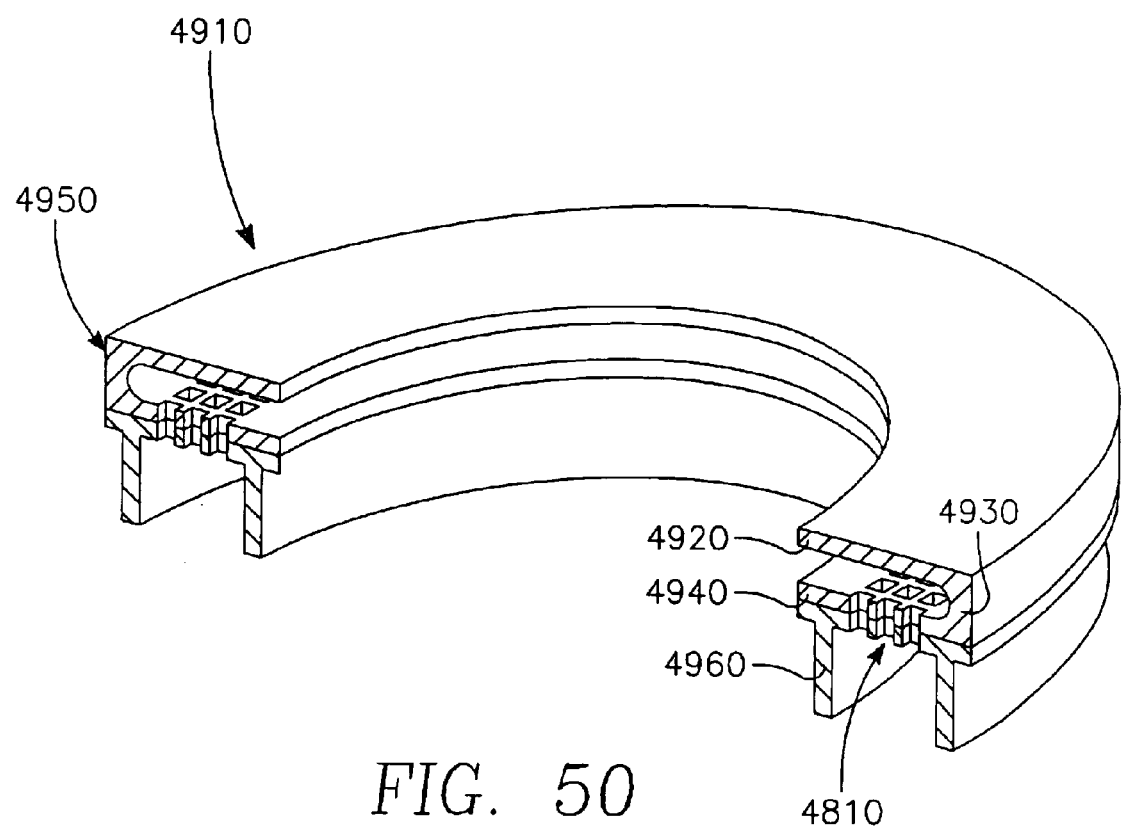

FIGS. 49 and 50 illustrate an integrally formed removable chamber liner 4910 that incorporates the plasma-confining grating 4810 of FIG. 48. The liner 4910 covers the portions of the chamber that are radially outside of the region underlying the electrode 125 and overlying the wafer 110. Thus, the liner 4910 includes an upper horizontal section 4920 covering an outer periphery of the chamber ceiling, a vertical section 4930 covering the chamber sidewall and a lower horizontal section 4940 that includes the plasma-confining grating 4810 and covers the pumping annulus as well as an annular surface adjacent the wafer 110. In one case, each of the sections 4920, 4930, 4940 are formed together as a monolithic silicon carbide piece 4950. The liner 4910 further includes an aluminum base 4960 underlying the lower horizontal section 4940 of the silicon carbide piece 4950 and is bonded thereto. The aluminum base 4960 includes a pair of downwardly extending annular rails 4962, 4964 that are relatively long and thin and provide good electrical conductivity to grounded structural elements of the chamber below the wafer support pedestal 105.

The reactor can have temperature control elements 4972, 4974 in thermal contact with the downwardly extending annular rails 4962, 4964 as well as a temperature control element 4976 in thermal contact with the vertical side section 4930. Each of the thermal control elements 4972, 4974, 4976 can include cooling apparatus including coolant passages and heating apparatus including an electric heater. It can be desirable to maintain the liner 4910 at a sufficiently high temperature (e.g., as high as 120 degrees F.) to minimize or prevent deposition of polymer or fluorocarbon compounds on interior surfaces of the liner 4910.

The liner 4910 enhances process stability because it provides a good ground return path. This is due to the fact that the electric potential is uniform along the interior surface of the silicon carbide piece 4950 (including the interior-facing surfaces of the upper horizontal section 4920, the vertical section 4930 and the lower horizontal section 4940). As a result, the liner 4910 provides a uniform RF return path at all of its interior-facing surfaces for power delivered either from the overhead electrode 125 or from the wafer pedestal 105. One advantage is that as plasma fluctuations move the RF return current distribution to concentrate at different parts of the interior surface of the liner 4910, the impedance presented to that current remains fairly constant. This feature promotes process stability.

Figure 51:
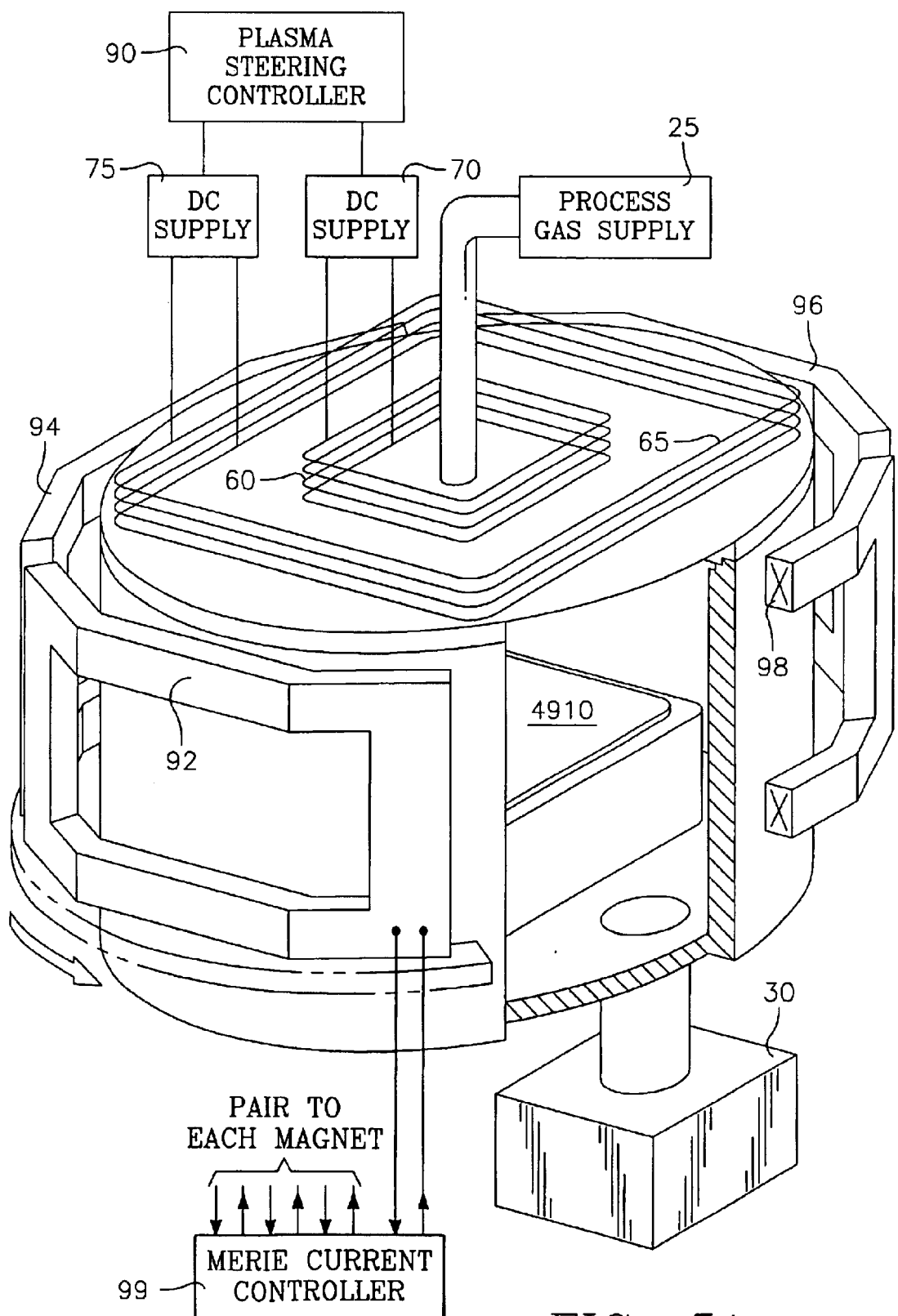
FIG. 51 illustrates a rectangular version of the reactor of FIG. 1A for processing rectangularly shaped workpieces.

FIG. 51 illustrates a modification of the case of FIG. 7 in which the overhead solenoids 60, 65 define a square pattern symmetrical with the square pattern of the MERIE magnets 92, 94, 96, 98, and is particularly suited for uniform processing of a square semiconductor or dielectric workpiece 4910, such as a photolithographic mask.

Figure 52:
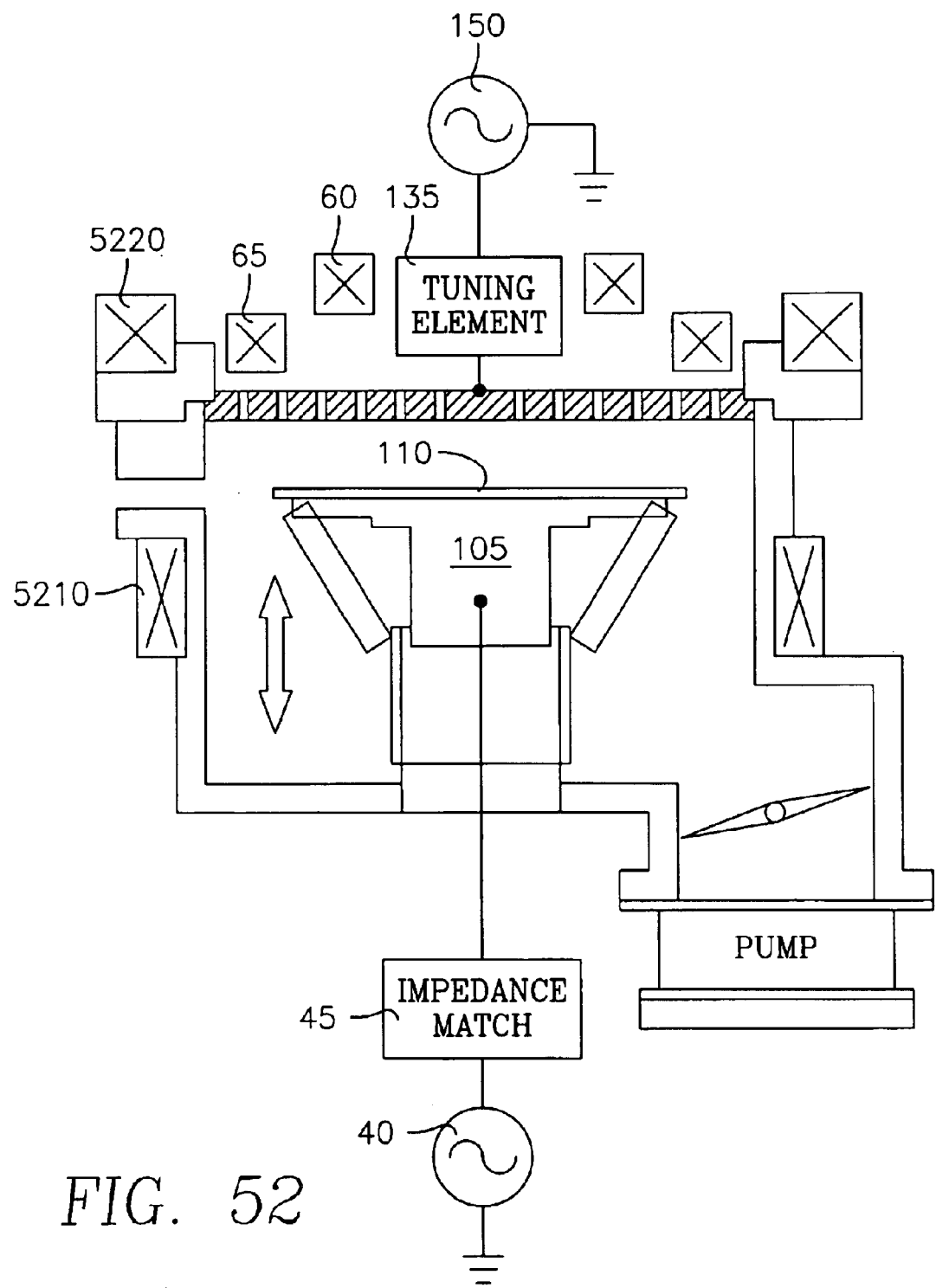
FIG. 52 illustrates a reactor corresponding to FIG. 1A having a retractable workpiece support pedestal.

FIG. 52 illustrates a version of the reactor of FIG. 24 in which the wafer support pedestal 105 may be moved up and down. In addition to the two overhead coils 60, 65 for controlling plasma ion radial distribution, there is a bottom coil 5210 below the plane of the wafer support pedestal 105. In addition, there is an outer coil 5220 at the periphery of the chamber. The outer overhead coil 65 and the bottom coil 5210 can have opposing D.C. currents to form a full cusp magnetic field within the chamber.

While the overhead coils 60, 65 have been described in combination with reactor having an overhead ceiling that serves as both an overhead source power electrode and as a gas distribution plate, the ceiling may be of the type that is not a gas distribution plate, with process gases being introduced in another conventional fashion (e.g., through the side wall). Moreover, the coils 60, 65 may be employed in a reactor in which source power is not capacitively coupled by a ceiling electrode. Also, the impedance match element for the overhead electrode has been described as being a fixed element such as a coaxial tuning stub. However, the impedance match element may be any suitable or conventional impedance match device such as a conventional dynamic impedance match circuit.

Figure 53:
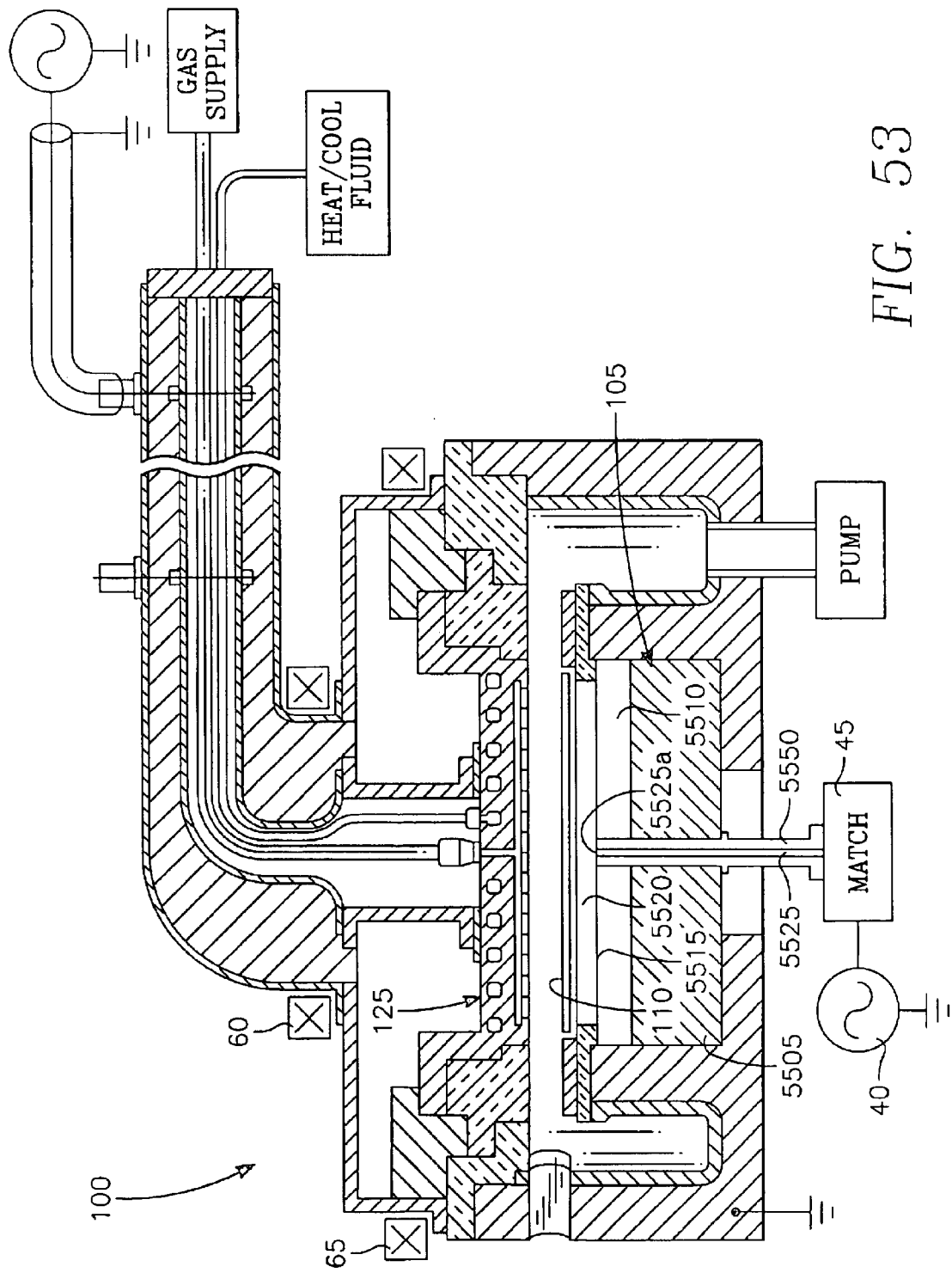
FIG. 53 illustrates a capacitively coupled plasma reactor having a dielectric sleeve surrounding the conductor connected to the wafer bias feed point.

Bias Circuit Tuning for Uniform Radial Plasma Distribution:

FIG. 53 illustrates a plasma reactor that includes a feature for promoting uniform radial distribution of VHF source power deposition and uniform radial distribution of the HF bias electrical field near the workpiece surface. The reactor of FIG. 53 includes the elements of the reactor of FIG. 24 which have been described above, including the overhead VHF electrode 125. In addition, FIG. 53 illustrates in greater detail the structure of the workpiece support pedestal 105. The workpiece support cathode 105 includes a metal pedestal layer 5505 supporting a lower insulation layer 5510, an electrically conductive mesh layer 5515 overlying the lower insulation layer 5510 and a thin top insulation layer 5520 covering the conductive mesh layer 5515. The semiconductor workpiece or wafer 110 is placed on top of the top insulation layer 5520. The electrically conductive mesh layer 5515 and the metal pedestal layer 5505 may be formed of molybdenum and aluminum respectively. The insulation layers 5510 and 5520 may be formed of aluminum nitride or alumina, for example. The conductive mesh layer 5515 supplies the RF bias voltage to control ion bombardment energy at the surface of the wafer 110. The conductive mesh 5515 also can be used for electrostatically chucking and de-chucking the wafer 110, and in such a case can be connected to a chucking voltage source in the well-known fashion. The conductive mesh 5515 therefore is not necessarily grounded and can have, alternately, a floating electric potential or a fixed D.C. potential in accordance with conventional chucking and de-chucking operations. As referred to previously in this specification, the wafer support cathode 105 and in particular the metal pedestal layer 5505 typically (but not necessarily) is connected to ground, and forms part of a return path for VHF power radiated by the overhead electrode 125.

The RF bias generator 40 produces power in the HF band (e.g., 13.56 MHz). Its RF bias impedance match element 45 is coupled to the workpiece 110 by an elongate conductor 5525 (hereinafter referred to as an RF conductor) extending through the workpiece support cathode 105. The RF conductor 5525 is insulated from grounded conductors such as the aluminum pedestal layer 5505. The RF conductor 5525 has a top termination or bias power feed point 5525a in electrical contact with the conductive mesh 5515.

Figure 54:
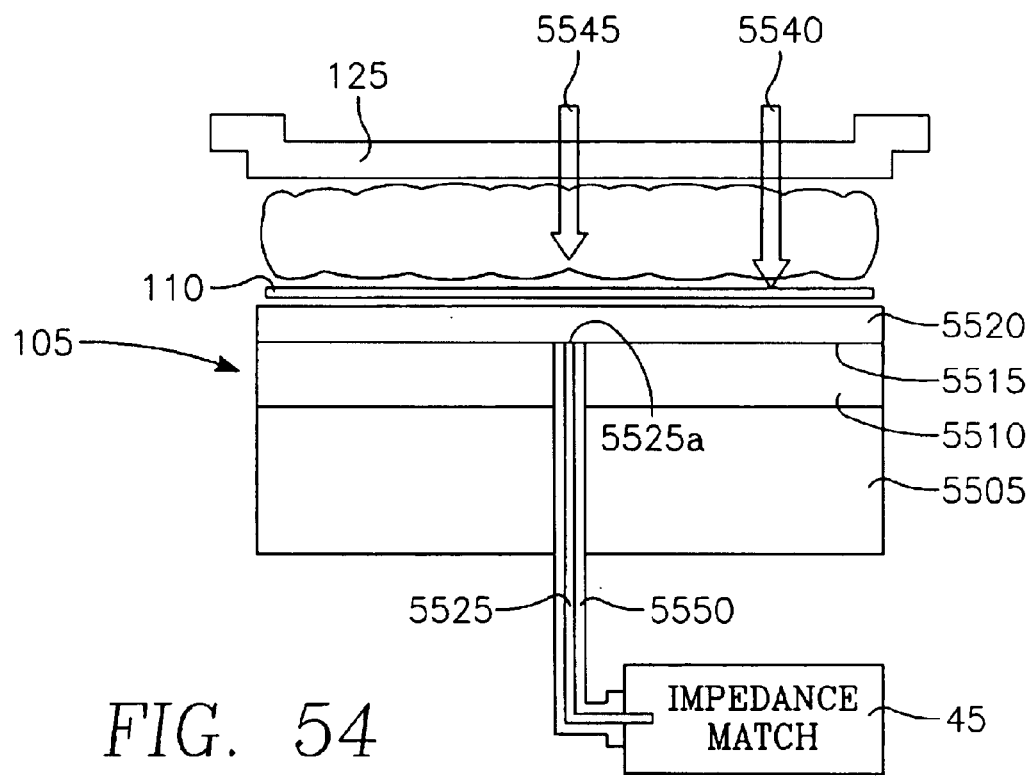
FIG. 54 is an enlarged side view showing the dielectric sleeve.
Figure 55:
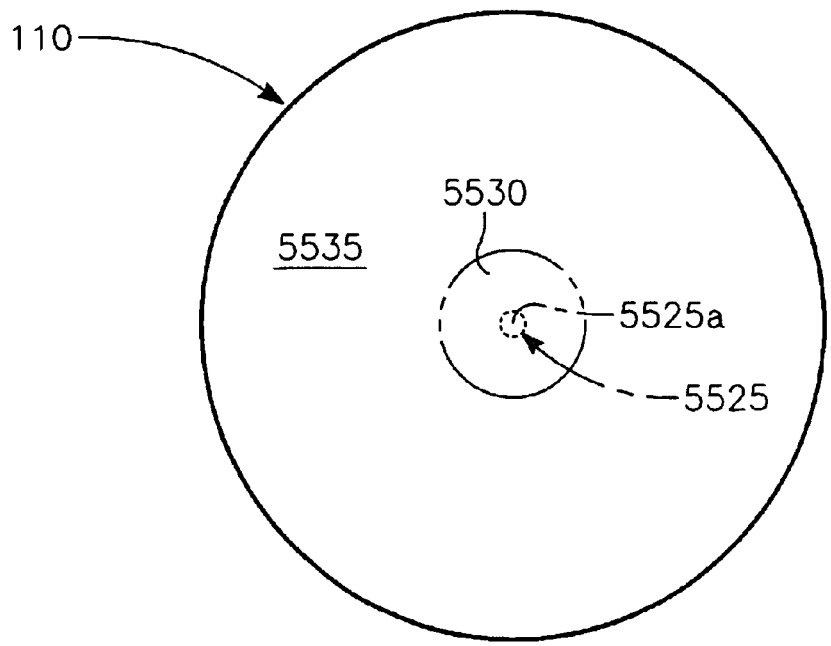
FIG. 55 is corresponding top view showing the sleeve location relative to other portions of the reactor.

FIG. 54 is a schematic illustration of the circuit consisting of the VHF overhead electrode, the RF bias applied through the workpiece support cathode 105 and the elements of the cathode 105. FIG. 55 is a top plan view of the plane of the wafer 110, with the termination or feed point 5525a of the RF conductor 5525 being shown in hidden (dashed) line. The RF return path provided by the workpiece support cathode 105 consists of two portions in the plane of the wafer 110, namely a radially inner portion 5530 centered about and extending outwardly from the feed point 5525a and a radially outer annular portion 5535. The RF return paths provided by the two portions 5530, 5535 are different, and therefore the two portions 5530, 5535 present different impedances to the VHF power radiated by the overhead electrode 125.

The major reason for the difference in impedances of the two RF return paths will now be explained in general terms. The primary return path is provided by the conductive mesh 5515 which is coupled through the metal pedestal 5505 and RF conductor 5525. The RF return path 5540 (FIG. 54) passing through the outer region 5535 of FIG. 55 is dominated by reactive coupling through the semiconductor wafer 110 and across the conductive mesh layer 5515 to the metal pedestal layer 5505. In contrast, the RF return path 5545 (FIG. 54) through the inner portion 5530 of FIG. 55 is dominated by the reactive impedance of the feed point 5525a. The two RF return paths cause non-uniform coupling of RF power if the impedance is not uniform across the wafer.

Since the two RF return paths are physically different, they tend to offer different impedances to the VHF power radiated by the overhead electrode 125. Such differences may cause non-uniformities in radial distribution across the wafer surface of impedance to the VHF power, rendering source power coupling to the plasma nonuniform and giving rise to nonuniform radial distribution of plasma ion density near the surface of the workpiece. This in turn can cause processing non-uniformities that unduly narrow the process window. In order to solve this problem, the reactor of FIG. 53 includes certain features that adjust the feed point impedance presented by the RF conductor 5525 to the VHF power, to enable a more uniform radial distribution of impedance across the wafer surface and therefore more uniform coupling of VHF power across the wafer surface.

A principal purpose of this adjustment in the feed point impedance is to bring the impedance at the feed point 5525a to at least nearly zero at the source power frequency (i.e., the VHF frequency of the overhead electrode 125 of about 162 MHz). As a result of this adjustment, the RF current return path is dominated by the conductive mesh 5515 through the RF conductor 5525 while minimizing the current through the aluminum pedestal layer 5505. As a result, the impedances of the regions 5530 and 5535 can be made to be at least nearly the same.

In order to adjust the feed point impedance as set forth above, a dielectric cylindrical sleeve 5550 surrounds the RF conductor 5525. The axial length and the dielectric constant of the material constituting the sleeve 5550 determine the feed point impedance presented by the RF conductor 5525 to the VHF power. In one example, the length and dielectric constant of the sleeve 5550 is selected to bring the feed point impedance to nearly zero at the VHF source power frequency (e.g., 162 MHz). In a working example, the feed point impedance without the sleeve 5550 was (0.9+j41.8) Ohms and with the sleeve was nearly a short circuit at (0.8+j0.3) Ohms. The impedance presented by the outer region 5535 surrounding the feed point 5525a is nearly a short at 162 MHz (due mainly to the presence of the conductive mesh 5515). Therefore, in the latter example the sleeve 5550 may bring the feed point impedance at the source power frequency to a value closer to that of the surrounding region. Here, the impedance of the region surrounding the feed point is determined mainly by the conductive mesh 5515. As a result, a more uniform radial distribution of impedance is attained, for more uniform capacitive coupling of VHF source power.

The sleeve 5550 can include additional features facilitating the foregoing improvement in VHF power deposition while simultaneously solving a separate problem, namely improving the uniformity in the electric field created by the RF bias power (at 13.56 MHz for example) applied to the wafer 110 by the RF conductor 5525. The problem is how to adjust radial distribution of VHF power coupling for maximum uniformity of plasma ion density while simultaneously adjusting the HF bias power electric field distribution across the wafer surface for maximum uniformity. Maximum uniformity would be attained if the feed point impedance at the HF bias power frequency were brought nearer to that of the surrounding region 5535 dominated by the conductive mesh 5515 (without altering the feed point impedance at the VHF source power frequency). This problem is solved by dividing the sleeve 5550 along its cylindrical axis into plural cylindrical sections, and adjusting or selecting the length and dielectric constant of each section independently. This provides several independent variables that may be exploited to permit matching the feed point impedance to that of the surrounding region at both the bias frequency (e.g., 13.56 MHz) and at the source frequency (e.g., 162 MHz) simultaneously.

Referring to the working example of FIG. 56, the sleeve 5550 can be divided into three sections, namely a top section 5552, a middle section 5554 and a bottom section 5556. The top section 5552 was polytetrafluoroethylene and was three inches in length, the middle section was alumina and was four inches in length, and the bottom section was polytetrafluoroethylene and was three inches in length. In this working example, it was found that the uniformity of plasma ion density distribution (as measured by etch rate distribution) was improved with large VHF source power applied to the overhead electrode 125, indicating an improved VHF source power deposition. Improvement in HF bias power deposition was also observed because uniformity of plasma ion density distribution was improved when only bias power was applied in this working example. Thus, the foregoing working example is representative of a simultaneous solution to the problems of (a) non-uniform impedance at the VHF source power frequency (e.g.,162 MHz) and (b) non-uniform impedance at the HF bias power frequency (e.g., 13.56 MHz) across the wafer support pedestal.

It is felt that the length and dielectric constant of the sleeve top section 5552 can be selected and fixed to optimize the HF bias power deposition exclusively, and that the lengths and dielectric constants of the remaining sleeve sections 5554, 5556 can then be selected to optimize VHF source power deposition by the overhead electrode while leaving the HF bias power deposition optimized.

FIG. 57A illustrates how the sleeve 5550 may be adjustable during use. In FIG. 57A, an external control knob 5560 is provided on the reactor. The control knob turns a screw 5565 threadably engaged with a sleeve support 5570 coupled to the bottom of the sleeve 5550 of FIG. 53. As the knob 5560 is rotated, the sleeve support 5570 travels axially along the axis of the threaded screw 5565, forcing the entire sleeve 5550 to travel in the same direction (either up or down) within a sleeve guide 5558. The knob 5560 permits the user to adjust the feed point impedance by moving the sleeve 5550 up or down along the RF conductor 5525 during (or shortly before) operation of the reactor. The sleeve support 5570 may move the entire sleeve 5550 (for example, all three sections 5552, 5554, 5556 as a unit together). Or, the sleeve support 5570 can be coupled to only one or two of the three sections 5552, 5554, 5556 so that only one or two of the three sections is moved by rotating the knob 5560. Finally, as shown in FIG. 57B, three knobs 5560*a*, 5560*b*, 5560*c* separately engage three sleeves supports 5570*a*, 5570*b*, 5570*c*. The three sleeve supports 5570*a*, 5570*b*, 5570*c* are individually connected to respective ones of the three sleeve sections 5552, 5554, 5556 so that the positions of each of the sleeve sections 5552, 5554, 5556 are separately determined within the sleeve guide 5558*a* by the three knobs 5560*a*, 5560*b*, 5560*c*.

Figure 58:
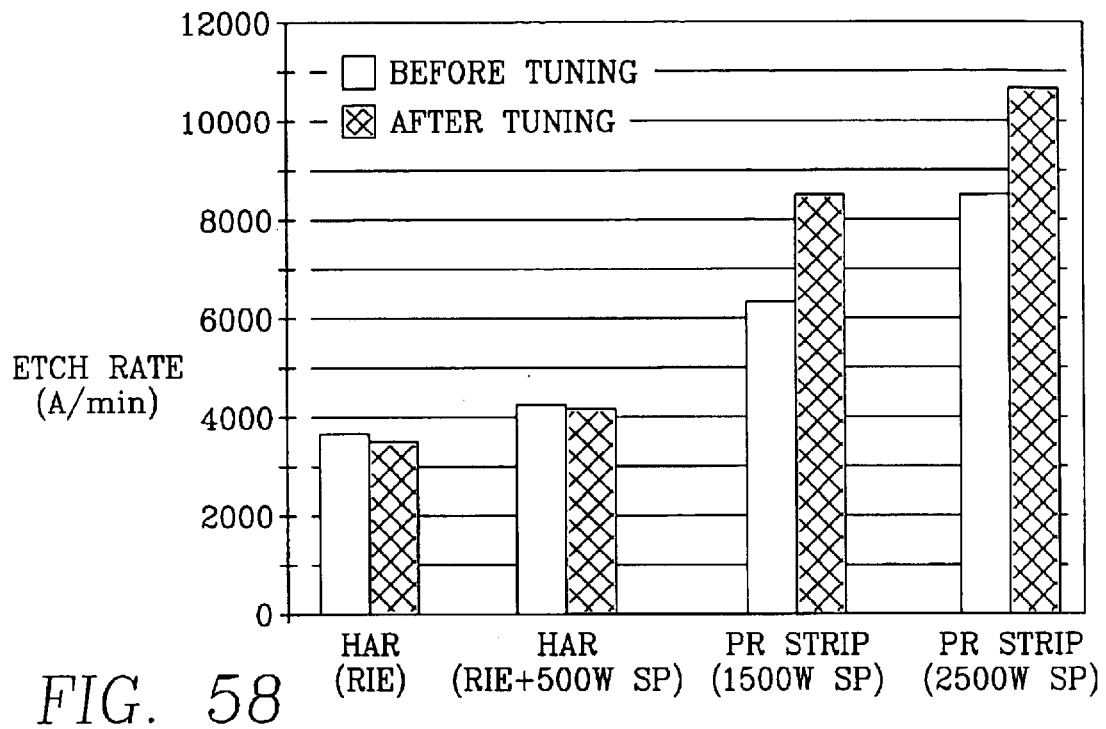
FIG. 58 is a graph comparing etch rates attained with and without tuning of the dielectric sleeve in various etch processes.
Figure 59:
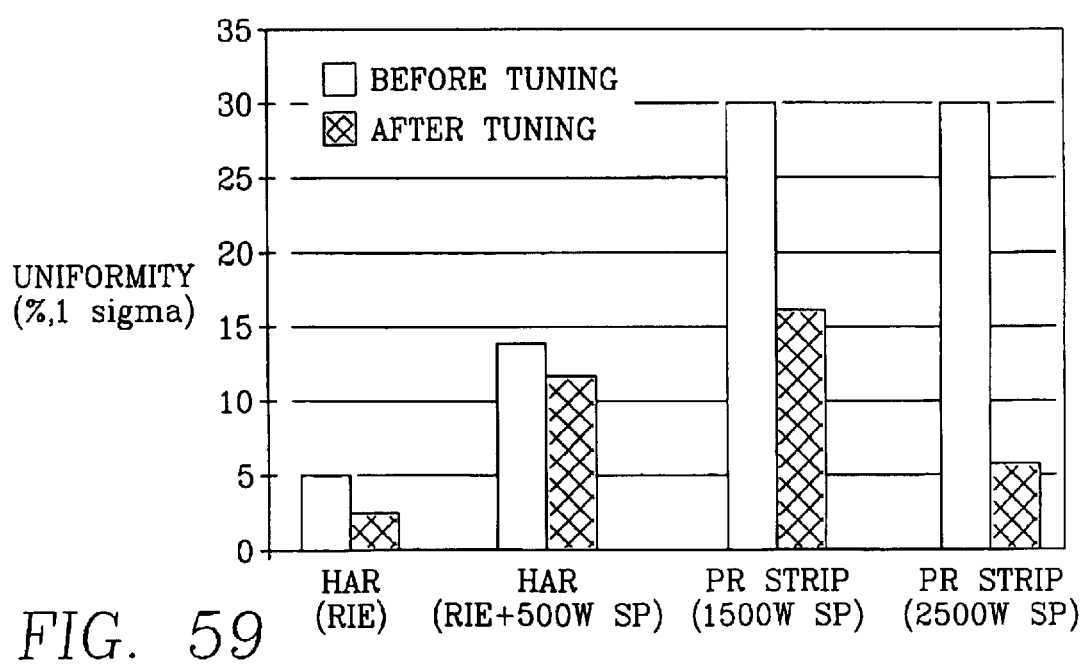
FIG. 59 is a graph comparing uniformity of the processes referred to in FIG. 58.

FIGS. 58 and 59 are graphs of reactor performance comparative data demonstrating efficacy of the sleeve 5550. The graph of FIG. 58 shows that the sleeve 5550 does not impair etch rate. The vertical axis is etch rate and different processes are displayed along the horizontal axis. The labels for the different processes along the horizontal axis include (from left to right) HAR RIE (high aspect ratio reactive ion etch), HAR RIE+SP (source power) and PR (photoresist) strip+SP. The term reactive ion etch refers to a process employing only bias power applied to the conductive mesh 5515 and no source power from the ceiling electrode 125. The light shaded bars indicate results obtained without tuning of the sleeve 5550 while the dark shaded bars indicate results obtained with tuning of the sleeve 5550. From an inspection of FIG. 58, only the high aspect ratio process experienced any reduction in etch rate due to introduction of the sleeve 5550, and this reduction was only slight. But, the etch rate of the photoresist was greatly enhanced.

The graph of FIG. 59 shows that introduction of the sleeve 5550 significantly improved uniformity in all of the three foregoing processes. Non-uniformity in radial distribution of etch rate as a percentage of one standard deviation is depicted on the vertical axis and results of the three foregoing processes are placed along the horizontal axis as in FIG. 58. FIG. 59 shows great improvement in uniformity in the photoresist strip process that uses source power.

Outstanding improvements in etch rate distribution uniformity were achieved in a wide array of processes. In an etch process using only bias power, introduction of the sleeve 5550 reduced non-uniformity from 4.9% to 2.4%. In an etch process using 500 watts of source power, introduction of the sleeve 5550 reduced non-uniformity from 13.7% to 12%. The greatest improvement occurred in photoresist ashing processes using high VHF source power. At 2500 Watts of source power, non-uniformity was reduced from 30.0% to 5.8% with introduction of the sleeve. At 1500 Watts in the same reactor, the improvement was from 30.1% to 16.0% non-uniformity by introducing the sleeve 5550.

The improvement in uniformity with processes employing high VHF source power (i.e., power applied to the overhead electrode) proves that the sleeve 5550 has optimized the distribution of capacitive coupling in the VHF return path. The improvement in uniformity in bias power-only processes proves that the sleeve 5550 has optimized the distribution of the electric field produced by the HF bias power source 40. Thus, the same sleeve simultaneously solves both the problem of VHF return path optimization and HF electric field optimization.

RF Coupling Ring for Enhancing Plasma Uniformity:

It has been previously noted herein that plasma ion density distribution in a reactor having an overhead VHF electrode such as the electrode 125 tends to be center high with a non-uniformity of about 10%. This non-uniformity is reduced by selectively enhancing capacitive coupling from the overhead electrode 125 to the plasma in the vicinity of the workpiece periphery. Referring to FIG. 60, an annular RF coupling ring is placed over and in electrical contact with the outer periphery of the wafer support cathode 105. As shown in FIG. 60, the top insulation layer 5520 is surrounded by a removable ring 5580 whose top surface 5580*a* is coplanar with the top surface of the wafer. The removable ring 5580 can be formed of a process-compatible material such as silicon, for example. Optionally, removable metal ground ring 5585 surrounds the removable ring 5580, its top surface 5585*a* being coplanar with that of the removable ring 5580. A generally planar surface is provided across the top of the wafer support cathode 105 bounded by the periphery of the ground ring 5585, facing the generally planar surface of the bottom of the overhead electrode 125. As a result, capacitive coupling across the entire processing zone bounded by the overhead electrode 125 and the wafer support cathode 105 is generally uniform. In order to overcome non-uniformity inherent in the center-high plasma ion density distribution of the reactor, capacitive coupling by the overhead electrode 125 is enhanced near the outer portion of the workpiece 110 by placing an RF coupling ring 5590 over the removable ring 5580 and over grounded ring 5585. The RF coupling ring 5590 may be a conductor, a semiconductor or a dielectric. If the coupling ring 5590 is a dielectric, then capacitive coupling to the plasma near the wafer periphery is enhanced by the presence of the dielectric material. If the RF coupling ring 5590 is a conductor, it in effect narrows the electrode-to-counterelectrode spacing and thereby enhances capacitance near the peripheral region of the wafer 110. Thus, the electrode-to-counterelectrode spacing is h1 everywhere in the process zone except at the periphery occupied by the RF coupling ring 5590 where the spacing is reduced from h1 by the height h2 of the coupling ring 5590. The increased capacitive coupling of source power enhances ion density at the periphery. The increase in ion density extends inwardly from the RF coupling ring 5590 and extends over a peripheral portion of the workpiece 110. Thus, the plasma ion density over the workpiece 110 is less center high and may tend toward being more nearly uniform, or possibly slightly edge-high. This condition is optimized by a careful selection of the height (thickness) h2 of the RF coupling ring 5590.

FIG. 61 illustrates a modification of the reactor of FIG. 60 in which a second RF coupling ceiling ring 5595 is attached to the periphery of the bottom surface of the overhead electrode 125 and overlies the first RF coupling ring 5590. If each ring 5590, 5595 has a thickness (height) of h3, then the electrode-to-counterelectrode distance near the wafer periphery is reduced by twice h3 and the capacitance in that region is enhanced proportionately, as in the reactor of FIG. 60.

Figure 62:
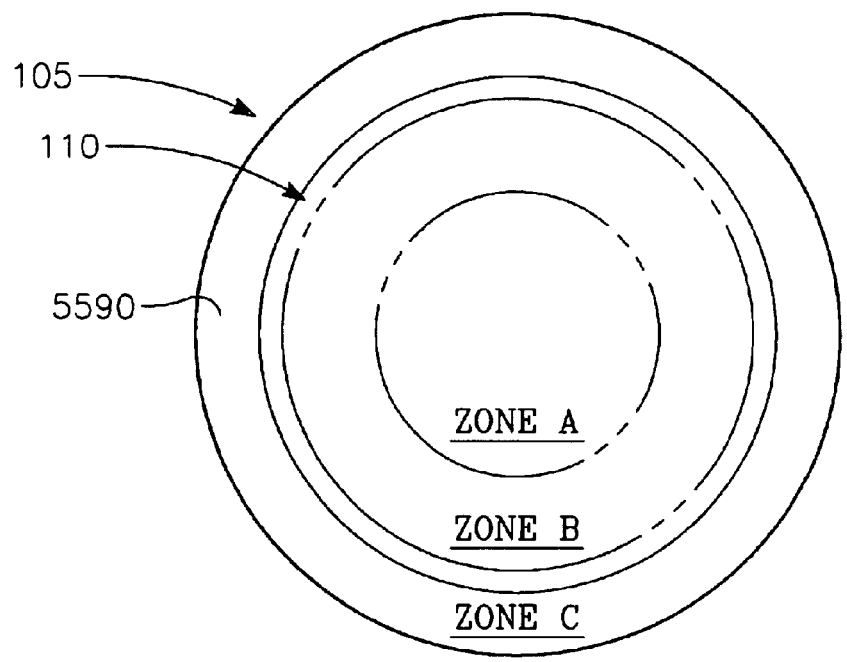
FIG. 62 is a top view illustrating the various radial processing zones in the reactor of FIG. 61 or 62 affected by the RF coupling ring.
Figure 63:
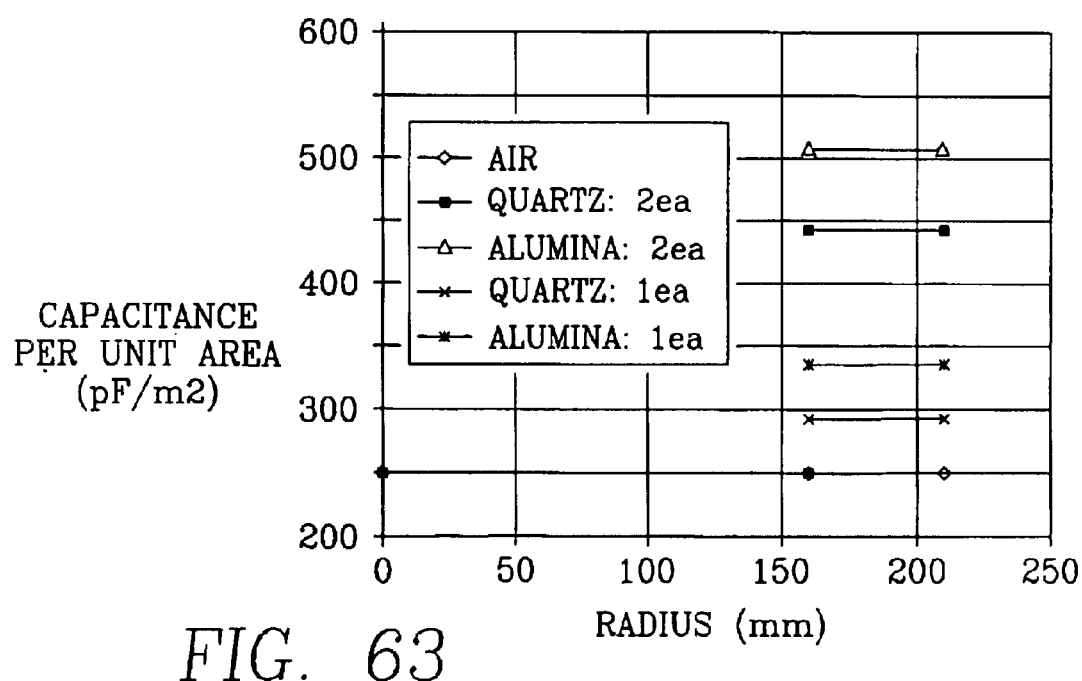
FIG. 63 is a graph comparing radial distribution of capacitance for RF coupling rings of different materials.

FIG. 62 is a top plan view of the wafer support cathode 105 with the wafer 110 mounted on it, and showing the peripheral region occupied by the RF coupling ring 5590. The illustration of FIG. 62 shows the processing zone being divided into three regions, namely an inner central region (zone A) around the center of the wafer 110, an annular region (zone B) extending to the periphery of the wafer 110 and an outer region (zone C) occupied by the RF coupling ring 5590. The graph of FIG. 63 shows the radial distribution of capacitance for different materials (quartz, alumina) and different thicknesses (0.4 inch and 0.8 inch) of the RF coupling ring 5590. The baseline for comparison is no ring (air). FIG. 63 shows maximum capacitance in zone C. Thus, plasma ion density is enhanced over much of the peripheral region (zone B) of the wafer 110 by the presence of the RF coupling ring 5590 or rings 5590, 5595.

Figure 64:
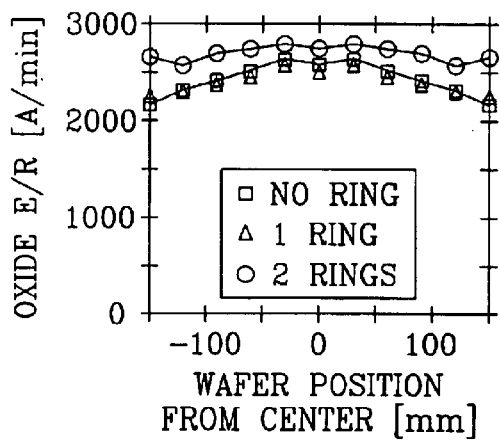
FIG. 64 is a graph comparing radial distributions of etch rate obtained with no coupling ring, a single coupling ring and two coupling rings, respectively where the ring material is alumina and only wafer bias power is applied.
Figure 66:
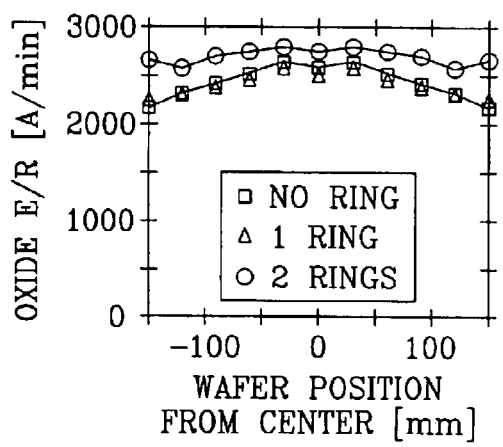
FIG. 66 is a graph comparing radial distributions of etch rate obtained with no coupling ring, a single coupling ring and two coupling rings, respectively, where the ring material is quartz and only wafer bias power is applied.
Figure 65:
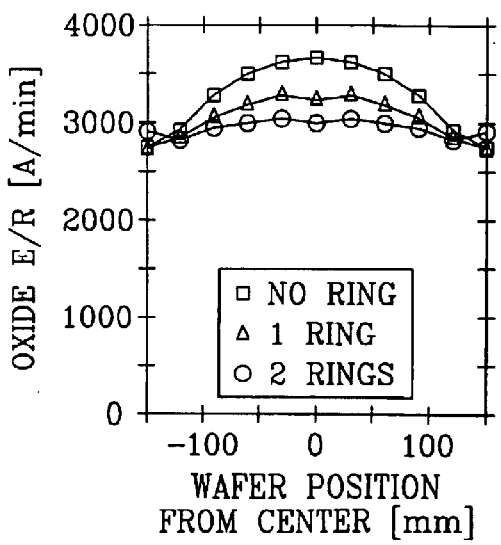
FIG. 65 is a graph comparing radial distributions of etch rate obtained with no coupling ring, a single coupling ring and two coupling rings, respectively, where the ring is alumina and 480 Watts of VHF source power is applied by the overhead electrode.
Figure 67:
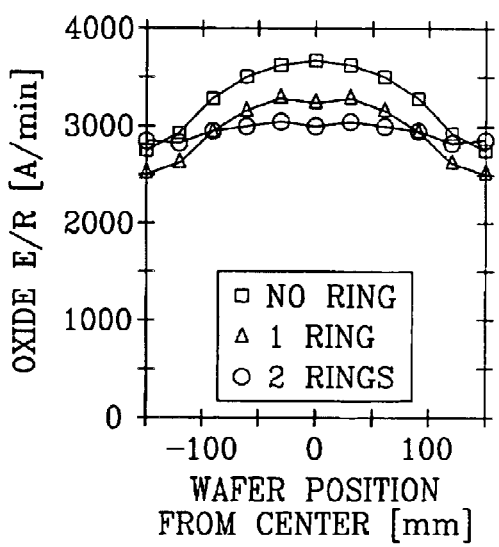
FIG. 67 is a graph comparing radial distributions of etch rate obtained with no ring, a single coupling ring and two coupling rings, respectively, with 480 Watts of VHF source power applied by the overhead electrode where the ring material is quartz.

FIG. 64 compares radial distributions of etch rate obtained with no coupling ring, a single coupling ring (FIG. 60) and two coupling rings (FIG. 61) where the ring material is alumina and the only power is bias power applied to the wafer support cathode 105. FIG. 65 compares radial distributions of etch obtained with no coupling ring, a single coupling ring and two coupling rings where the ring is alumina and 480 Watts of VHF source power is applied by the overhead electrode 125. FIG. 66 compares radial distributions of etch rate obtained with no coupling ring, a single coupling ring and two coupling rings where the ring material is quartz and only bias power is applied (no source power from the overhead electrode). FIG. 67 compares radial distributions of etch rate obtained with no ring, a single coupling ring and two coupling rings with 480 Watts of VHF source power applied by the overhead electrode 125 where the ring material is quartz. The most dramatic improvement was observed in those cases where VHF source power is applied (FIGS. 65 and 67). Two rings (FIG. 61) produced the greatest uniformity. The thickness of each ring as about 0.4 inch in these working examples.

In the process employing only RF bias power (no VHF source power from the overhead electrode 125), non-uniformity was reduced from 6.5% to 4.6% by introduction of a 0.4 inch thick quartz version of the bottom RF coupling ring 5590 and to 5.0% with an alumina version. When the thickness of the bottom RF coupling ring 5590 was doubled to 0.8 inch, non-uniformity was reduced to 2.3% with the quartz version. The same result was achieved with the alumina version.

In the process employing 500 Watts of VHF source power from the overhead electrode, non-uniformity was reduced from 11.1% to 9.42% by introduction of a 0.4 inch thick quartz version of the bottom RF coupling ring 5590 and to 8.5% with an alumina version. When the thickness of the bottom RF coupling ring 5590 was doubled to 0.8 inch, non-uniformity was reduced to 4.5% with the quartz version and to 3.9% with the alumina version.

In general, it was observed that the ion density distribution non-uniformity to be corrected increases with increasing VHF source power from the overhead electrode 125. For example, as the source power was increased in one reactor having an overhead electrode 125 in three steps of 0 Watts, 500 Watts and 1000 Watts, the non-uniformity (without an RF coupling ring) was 6.9%, 12.7% and 15.8%, respectively. When the RF coupling ring 5590 was introduced, the non-uniformity was, respectively, 3.4%, 5.3% and 5.1%. Introduction of the dielectric sleeve 5550 of FIGS. 53 and 56 (leaving the RF coupling ring 5590 in place) further reduced the nonuniformity to 3.5%, 3.9% and 4.3%, respectively. This corresponds to the aspect of FIGS. 60 and 61 in which the dielectric sleeve 5550 of FIGS. 53 and 56 is present with the RF coupling ring 5590. However, the coupling ring 5590 or the pair of coupling rings 5590, 5595 may be employed without the dielectric sleeve 5550 around the RF conductor 5525.

While the RF coupling rings 5590, 5595 and the dielectric sleeve 5550 may be employed separately or in combination in the same plasma reactor (as illustrated in FIGS. 60 and 61), each of these features may be employed separately or in combination with the plasma uniformity-controlling overhead coils 60, 65 of FIG. 24 using the methods described above for controlling the overhead coils 60, 65. FIG. 68 illustrates a plasma reactor combining the features of FIG. 24 (including the plasma uniformity-controlling overhead coils 60, 65), FIG. 53 (including the dielectric sleeve 5550) and FIG. 61 (including the RF coupling rings 5590, 5595). With either or both the RF coupling ring 5590 and the dielectric sleeve 5550, plasma ion density distribution uniformity is improved, so that any residual non-uniformity that must be corrected by the overhead coils 60, 65 is significantly reduced. Thus, the correction to plasma ion density distribution realized with structural elements of the dielectric sleeve 5550 and the RF coupling ring 5590 and/or 5595 is an initial correction, leaving a final correction to be performed by the overhead coils 60, 65. This final correction is significantly smaller than it would have been in the absence of the dielectric sleeve 5550 and/or the RF coupling ring 5590 and/or 5595. It is felt that such a smaller correction to plasma distribution performed by the overhead coils 60, 65 in the reactor of FIG. 68 can lead to greater accuracy or uniformity in the ultimate plasma ion distribution realized by the overhead coils 60, 65.

While the invention has been described in detail by specific reference to preferred embodiments, it is understood that variations and modifications thereof may be made without departing from the true spirit and scope of the invention.

What is claimed is:

1. A plasma reactor comprising:
a side wall and an overhead ceiling defining a chamber;
a workpiece support cathode within the chamber having a working surface facing said ceiling for supporting a semiconductor workpiece;
process gas inlets for introducing a process gas into said chamber;
an RF bias power generator having a bias power frequency;
a bias power feed point at said working surface;
an RF conductor connected between said RF bias power generator and said bias power feed point at said working surface; and
a dielectric sleeve surrounding a portion of said RF conductor, said sleeve having an axial length along said RF conductor, a dielectric constant and an axial location along said RF conductor, said length, dielectric constant and location of said sleeve being such that said sleeve provides a reactance that enhances plasma ion density uniformity over said working surface.

2. The reactor of claim 1 wherein said feed point has an impedance at said bias power frequency, and wherein the reactance provided by said dielectric sleeve brings the impedance of said feed point at said bias power frequency to a value closer to an impedance of a portion of said workpiece support cathode surrounding said RF conductor and sleeve.

3. The reactor of claim 1 wherein:
said cathode comprises a planar insulation layer having a top surface comprising said working surface and a planar conductive layer within said planar insulation layer;
said feed point has an impedance at said bias power frequency; and
the reactance provided by said dielectric sleeve brings the impedance of said feed point at said bias power frequency to a value closer to an impedance of said conductive layer at said bias power frequency.

4. The reactor of claim 2 wherein said ceiling comprises an overhead electrode, said reactor further comprising:
a source power generator having a source frequency;
an impedance match element connected between said source power generator and said overhead electrode;
said feed point has an impedance at said source power frequency;
wherein the reactance of said sleeve brings the impedance of said feed point at said source frequency to a value closer to an impedance of zero.

5. The reactor of claim 3 wherein said ceiling comprises an overhead electrode, said reactor further comprising:
a source power generator having a source frequency;
an impedance match element connected between said source power generator and said overhead electrode;
wherein said feed point has an impedance at said source power frequency; and
wherein the reactance provided by said dielectric sleeve brings the impedance of said feed point at said source power frequency to a value closer to an impedance of zero at said source power frequency.

6. The plasma reactor of claim 1 wherein said sleeve is divided along its axial length into plural sections, the axial length and dielectric constant of each of said sections being independent of the other sections.

7. The plasma reactor of claim 6 wherein the dielectric constants and axial lengths of said sections are such as to bring said feed point impedance at said bias frequency closer to said impedance of said conductive layer at said bias frequency while simultaneously bringing said feed point impedance at said source power frequency closer to an impedance of zero.

8. The reactor of claim 7 wherein said bias power frequency is an HF frequency and said source power frequency is a VHF frequency.

9. The reactor of claim 8 wherein at least one of said plural sleeve sections is formed of alumina while another one of said plural sleeve sections is formed of polytetrafluoroethylene.

10. The reactor of claim 8 wherein a top section of said sleeve comprises a first dielectric material, a middle section of said sleeve comprises a second dielectric material and a bottom section of said sleeve comprises said first dielectric material.

11. The reactor of claim 10 wherein said first dielectric material comprises polytetrafluoroethylene and said second dielectric material comprises alumina.

12. The reactor of claim 8 wherein said overhead electrode has a resonance with a plasma in said chamber at a plasma resonant frequency and wherein said VHF source power frequency is at or near said plasma resonant frequency.

13. The reactor of claim 12 wherein the impedance match element connected between said source power generator and said overhead electrode comprises a fixed tuning stub having a stub resonant frequency at or near said VHF source power frequency.

14. The reactor of claim 13 wherein said stub resonant frequency, said VHF source power frequency and said plasma resonant frequency are near one another and offset from one another.

15. The reactor of claim 5 further comprising:
plural overhead coils of different radii and at different heights above said ceiling and a controller for applying respective D.C. currents to said plural coils so as to enhance uniformity of plasma ion density distribution in said chamber.

16. The reactor of claim 1 further comprising:
an annular RF coupling ring having an inner diameter corresponding generally to a periphery of said workpiece, said RF coupling ring extending a sufficient portion of a distance between said working surface and said overhead electrode to enhance plasma ion density near a periphery of said workpiece.

17. The reactor of claim 16 wherein said RF coupling ring is attached to said working surface and has a top surface extending above said working surface by a thickness of said coupling ring.

18. The reactor of claim 16 wherein said RF coupling ring is attached to said ceiling and has a bottom surface extending below said ceiling by a thickness of said coupling ring.

19. The reactor of claim 17 further comprising a second RF coupling ring overlying said first RF coupling ring and attached to said ceiling.

20. The reactor of claim 16 further comprising:
plural overhead coils of different radii and at different heights above said ceiling and a controller for applying respective D.C. currents to said plural coils so as to enhance uniformity of plasma ion density distribution in said chamber.

21. A plasma reactor comprising:
a side wall and an overhead ceiling defining a chamber, said overhead ceiling comprising an overhead electrode;
a workpiece support cathode within said chamber having a working surface facing said ceiling for supporting a semiconductor workpiece;
process gas inlets for introducing a process gas into said chamber;
an RF bias power generator having a bias power frequency;
a bias power feed point at said working surface;
an RF conductor connected between said RF bias power generator and said bias power feed point and a dielectric sleeve surrounding a section of length of said conductor;
a source power generator having a source frequency;
an impedance match element connected between said source power generator and said overhead electrode;
said feed point having an impedance at said source power frequency;
wherein the reactance of said sleeve reduces the impedance of said feed point at said source frequency to at least nearly zero Ohms.

22. The reactor of claim 21 wherein:
said cathode comprises a planar insulation layer having a top surface comprising said working surface and a planar conductive layer within said planar insulation layer;
the reactance of said dielectric sleeve brings the impedance of said feed point at said bias power frequency to a value closer to an impedance of said conductive layer at said bias power frequency.

23. The reactor of claim 21 wherein said overhead electrode resonates with a plasma at a plasma resonant frequency and wherein said source power frequency is at or near said plasma resonant frequency.

24. The reactor of claim 23 wherein the impedance match element connected between said source power generator and said overhead electrode comprises a fixed tuning stub having a stub resonant frequency at or near said source power frequency.

25. The reactor of claim 24 wherein said stub resonant frequency, said source power frequency and said plasma resonant frequency are near one another and offset from one another.

26. The reactor of claim 24 wherein said plasma resonant frequency, said source power frequency and said stub resonant frequency are all VHF frequencies.

27. The reactor of claim 21 further comprising:
plural overhead coils of different radii and at different heights above said ceiling and a controller for applying respective D.C. currents to said plural coils so as to enhance uniformity of plasma ion density distribution in said chamber.

28. The reactor of claim 21 further comprising:
an annular RF coupling ring having an inner diameter corresponding generally to a periphery of said workpiece, said RF coupling ring extending a sufficient portion of a distance between said working surface and said overhead electrode to enhance plasma ion density near a periphery of said workpiece.

29. The reactor of claim 28 wherein said RF coupling ring is attached to said working surface and has a top surface extending above said working surface by a thickness of said coupling ring.

30. The reactor of claim 28 wherein said RF coupling ring is attached to said ceiling and has a bottom surface extending below said ceiling by a thickness of said coupling ring.

31. The reactor of claim 29 further comprising a second RF coupling ring overlying said first RF coupling ring and attached to said ceiling.

32. The reactor of claim 28 further comprising:
plural overhead coils of different radii and at different heights above said ceiling and a controller for applying respective D.C. currents to said plural coils so as to enhance uniformity of plasma ion density distribution in said chamber.

33. A plasma reactor comprising:
a vacuum enclosure including a side wall and a ceiling defining a vacuum chamber, and a workpiece support within said chamber having a working surface facing said ceiling for supporting a planar workpiece, said workpiece support and said ceiling together defining a processing region between said workpiece support and said ceiling;
process gas inlets for furnishing process gas into said chamber;
an RF bias power generator having a bias frequency;
at least a first overhead solenoidal electromagnet adjacent said ceiling, said overhead solenoidal electromagnet, said ceiling, said sidewall and said workpiece support being located along a common axis of symmetry; and
a current source connected to said first solenoidal electromagnet and furnishing a first electric current in said first solenoidal electromagnet whereby to generate within said chamber a magnetic field which is a function of said first electric current, said first electric current having a value such that said magnetic field increases uniformity of plasma ion density radial distribution about said axis of symmetry near said working surface;
a bias power feed point at said working surface;
an RF conductor connected between said RF bias power generator and said bias power feed point at said working surface; and
a dielectric sleeve surrounding a portion of said RF conductor, said sleeve having an axial length along said RF conductor, a dielectric constant and an axial location along said RF conductor, said length, dielectric constant and location of said sleeve being such that said sleeve provides a reactance that enhances plasma ion density uniformity over said working surface.

34. The reactor of claim 33 wherein said feed point has an impedance at said bias power frequency, and wherein the reactance provided by said dielectric sleeve brings the impedance of said feed point at said bias power frequency to a value closer to an impedance of a portion of said workpiece support cathode surrounding said RF conductor and sleeve.

35. The reactor of claim 33 wherein:
said cathode comprises a planar insulation layer having a top surface comprising said working surface and a planar conductive layer within said planar insulation layer;
said feed point has an impedance at said bias power frequency; and
the reactance provided by said dielectric sleeve brings the impedance of said feed point at said bias power frequency to a value closer to an impedance of said conductive layer at said bias power frequency.

36. The reactor of claim 35 wherein said ceiling comprises an overhead electrode, said reactor further comprising:

a source power generator having a source frequency;

an impedance match element connected between said source power generator and said overhead electrode;

said feed point has an impedance at said source power frequency;

wherein the reactance of said sleeve brings the impedance of said feed point at said source frequency to a value closer to an impedance of zero.

37. The reactor of claim 33 wherein said first solenoidal electromagnet is outside of said chamber and faces an external surface of said ceiling.

38. The reactor of claim 36 wherein said source power generator provides an RF power level that maintains a plasma within said chamber at a desired plasma ion density level;

said overhead electrode having a reactance that forms a resonance with the plasma at an electrode-plasma resonant frequency which is at or near said frequency of said generator.

39. The reactor of claim 33 further comprising a plurality of overhead solenoidal magnets adjacent said ceiling having a combined static magnetic field in said chamber comprising a sum of individual static magnetic fields produced by respective ones of said plurality of solenoidal magnets, wherein said overhead solendoid, said ceiling, said sidewall and said workpiece support are located along a common axis of symmetry, said first overhead solenoidal magnet being comprised within said plurality of overhead solenoidal magnets; and wherein said combined magnetic field increases uniformity of plasma ion density radial distribution about said axis of symmetry near a surface of said workpiece support.

40. The reactor of claim 39 wherein said plurality of solenoidal magnets are concentric and are arranged in order of ascending diameter and descending axial height above said ceiling.

41. The reactor of claim 40 wherein:

the outermost ones of said magnets exert a correspondingly greater radial magnetic pressure on plasma across a greater radial area than the innermost ones of said magnets;

the innermost ones of said magnets exert radial magnetic pressure on plasma within a region confined near the center of said chamber.

42. The reactor of claim 36 wherein said plasma has a reactance and the reactance of said electrode corresponds to the reactance of said plasma.

43. The reactor of claim 42 wherein the reactance of said electrode is a conjugate of the reactance of said plasma.

44. The reactor of claim 42 wherein the reactance of said plasma comprises a negative capacitance, and wherein the capacitance of said electrode is the same magnitude as the magnitude of said negative capacitance of said plasma.

45. The reactor of claim 42 wherein the frequency of said RF generator and the electrode-plasma resonant frequency are VHF frequencies.

46. The reactor of claim 42 further comprising a fixed impedance matching element connected between said generator and said overhead electrode, said fixed impedance match element having a match element resonant frequency.

47. The reactor of claim 46 wherein the match element resonant frequency and said electrode-plasma resonant frequency are offset from one another and the frequency of said generator lies between said electrode-plasma resonant frequency and said match element resonant frequency.

48. The reactor of claim 47 wherein said frequency of said generator, said plasma frequency and said match element resonant frequency are all VHF frequencies.

49. The reactor of claim 47 wherein said frequency of said RF power generator, said match element resonant frequency and said electrode-plasma resonant frequency are all VHF frequencies offset from one another.

50. The reactor of claim 33 further comprising:

an annular RF coupling ring having an inner diameter corresponding generally to a periphery of said workpiece, said RF coupling ring extending a sufficient portion of a distance between said working surface and said overhead electrode to enhance plasma ion density near a periphery of said workpiece.

51. The reactor of claim 50 wherein said RF coupling ring is attached to said working surface and has a top surface extending above said working surface by a thickness of said coupling ring.

52. The reactor of claim 50 wherein said RF coupling ring is attached to said ceiling and has a bottom surface extending below said ceiling by a thickness of said coupling ring.

53. The reactor of claim 51 further comprising a second RF coupling ring overlying said first RF coupling ring and attached to said ceiling.

* * * * *